United States Patent
Li et al.

(10) Patent No.: US 12,199,229 B2
(45) Date of Patent: Jan. 14, 2025

(54) PIXEL, DISPLAY DEVICE HAVING SAME AND PRODUCTION METHOD THEREFOR

(71) Applicant: SAMSUNG DISPLAY CO., LTD., Yongin-si (KR)

(72) Inventors: Xinxing Li, Yongin-si (KR); Dae Hyun Kim, Yongin-si (KR); Hee Keun Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 425 days.

(21) Appl. No.: 17/626,268

(22) PCT Filed: Jul. 2, 2020

(86) PCT No.: PCT/KR2020/008688
§ 371 (c)(1),
(2) Date: Jan. 11, 2022

(87) PCT Pub. No.: WO2021/010627
PCT Pub. Date: Jan. 21, 2021

(65) Prior Publication Data
US 2022/0293835 A1    Sep. 15, 2022

(30) Foreign Application Priority Data
Jul. 12, 2019  (KR) .......................... 10-2019-0084301

(51) Int. Cl.
*H01L 33/62*  (2010.01)
*H01L 25/075*  (2006.01)
(Continued)

(52) U.S. Cl.
CPC .......... *H01L 33/62* (2013.01); *H01L 25/0753* (2013.01); *H01L 33/382* (2013.01);
(Continued)

(58) Field of Classification Search
CPC ..... H01L 33/62; H01L 27/124; H01L 33/382; H01L 2933/0016; H01L 33/36;
(Continued)

(56) References Cited

U.S. PATENT DOCUMENTS 8,129,768 B2   3/2012  Shibata et al.
8,872,214 B2   10/2014 Negishi et al.
(Continued)

FOREIGN PATENT DOCUMENTS

JP    2007-317961    12/2007
JP    4814394        11/2011
(Continued)

OTHER PUBLICATIONS

Korean Notice of Allowance for Korean Patent Application No. 10-2019-0084301, dated Feb. 26, 2024.
(Continued)

*Primary Examiner* — Sonya McCall-Shepard
(74) *Attorney, Agent, or Firm* — KILE PARK REED & HOUTTEMAN PLLC

(57) ABSTRACT

A pixel may include first and second areas sectioned from each other in a first direction; 1-1-th to 4-1-th electrodes successively arranged in the first area in a second direction intersecting the first direction; 1-2-th to 4-2-th electrodes successively arranged in the second area in the second direction; light emitting elements disposed between two adjacent electrodes of the 1-1-th to 4-1-th electrodes of the first area; light emitting elements disposed between two adjacent electrodes of the 1-2-th to 4-2-th electrodes of the second area; a first conductive pattern disposed in the first area, and electrically connecting the 2-1-th and 3-1-th electrodes; a second conductive pattern disposed over the first and second areas, and electrically connecting the 4-1-th electrode of the first area with the 1-2-th electrode of the
(Continued)

second area; and a third conductive pattern disposed in the second area and electrically connecting the 2-2-th and 3-2-th electrodes.

20 Claims, 39 Drawing Sheets

(51) Int. Cl.
  *H01L 27/12* (2006.01)
  *H01L 27/15* (2006.01)
  *H01L 33/00* (2010.01)
  *H01L 33/36* (2010.01)
  *H01L 33/38* (2010.01)
  *H01L 33/48* (2010.01)

(52) U.S. Cl.
  CPC ............... *H01L 2933/0016* (2013.01); *H01L 2933/0066* (2013.01)

(58) Field of Classification Search
  CPC ........... H01L 2933/0066; H01L 27/156; H01L 33/48; H01L 2933/0033; H01L 25/0753; H01L 25/167; H10K 59/131; H10K 59/122; H10K 59/1213; H10K 59/123; H10K 59/1201; H10K 59/12
  See application file for complete search history.

(56) References Cited

U.S. PATENT DOCUMENTS

| | | | |
|---|---|---|---|
| 9,112,112 B2 | 8/2015 | Do et al. | |
| 9,287,242 B2 | 3/2016 | Shibata et al. | |
| 9,570,425 B2 | 2/2017 | Do | |
| 9,773,761 B2 | 9/2017 | Do | |
| 10,340,419 B2 | 7/2019 | Kim et al. | |
| 10,367,123 B2 | 7/2019 | Im et al. | |
| 2010/0053044 A1* | 3/2010 | Lee | H10K 50/852 345/80 |
| 2011/0058126 A1 | 3/2011 | Okada et al. | |
| 2011/0089850 A1 | 4/2011 | Shibata et al. | |
| 2011/0316009 A1 | 12/2011 | Fukasawa | |
| 2013/0027623 A1 | 1/2013 | Negishi et al. | |
| 2014/0346470 A1* | 11/2014 | Choi | H10K 59/131 438/46 |
| 2017/0365588 A1 | 12/2017 | Chen | |
| 2018/0138157 A1 | 5/2018 | Im et al. | |
| 2018/0175106 A1 | 6/2018 | Kim et al. | |
| 2019/0113185 A1 | 4/2019 | Do et al. | |

FOREIGN PATENT DOCUMENTS

| | | |
|---|---|---|
| JP | 4914929 | 4/2012 |
| JP | 2014-123583 | 7/2014 |
| KR | 10-1244926 | 3/2013 |
| KR | 10-1436123 | 11/2014 |
| KR | 10-1490758 | 2/2015 |
| KR | 10-2018-0007025 | 1/2018 |
| KR | 10-2018-0009014 | 1/2018 |
| KR | 10-2018-0055021 | 5/2018 |
| KR | 10-2018-0072909 | 7/2018 |
| WO | 2009/101944 | 8/2009 |
| WO | 2019/117656 | 6/2019 |

OTHER PUBLICATIONS

International Search Report, with English translation, corresponding to International Application No. PCT/KR2020/008688 dated Oct. 8, 2020.
Written Opinion, with English translation, corresponding to International Application No. PCT/KR2020/008688, dated Oct. 8, 2020.

* cited by examiner

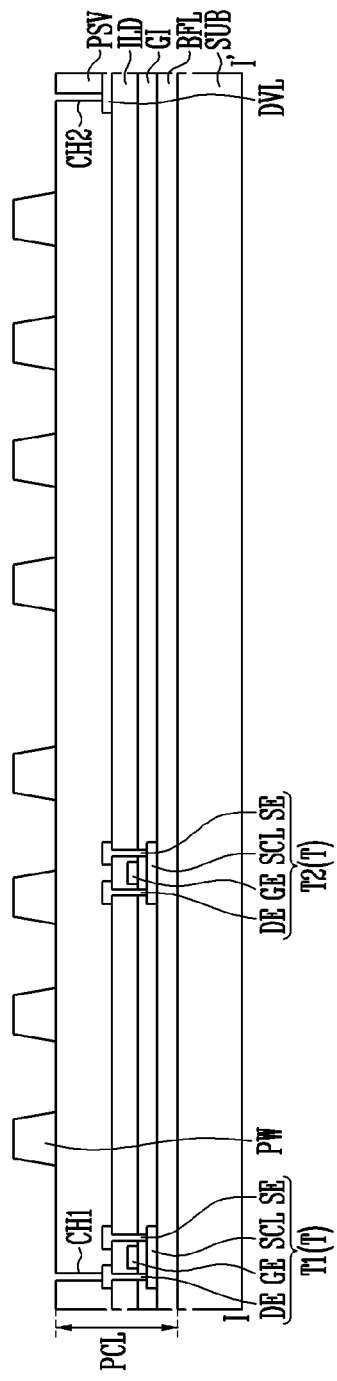

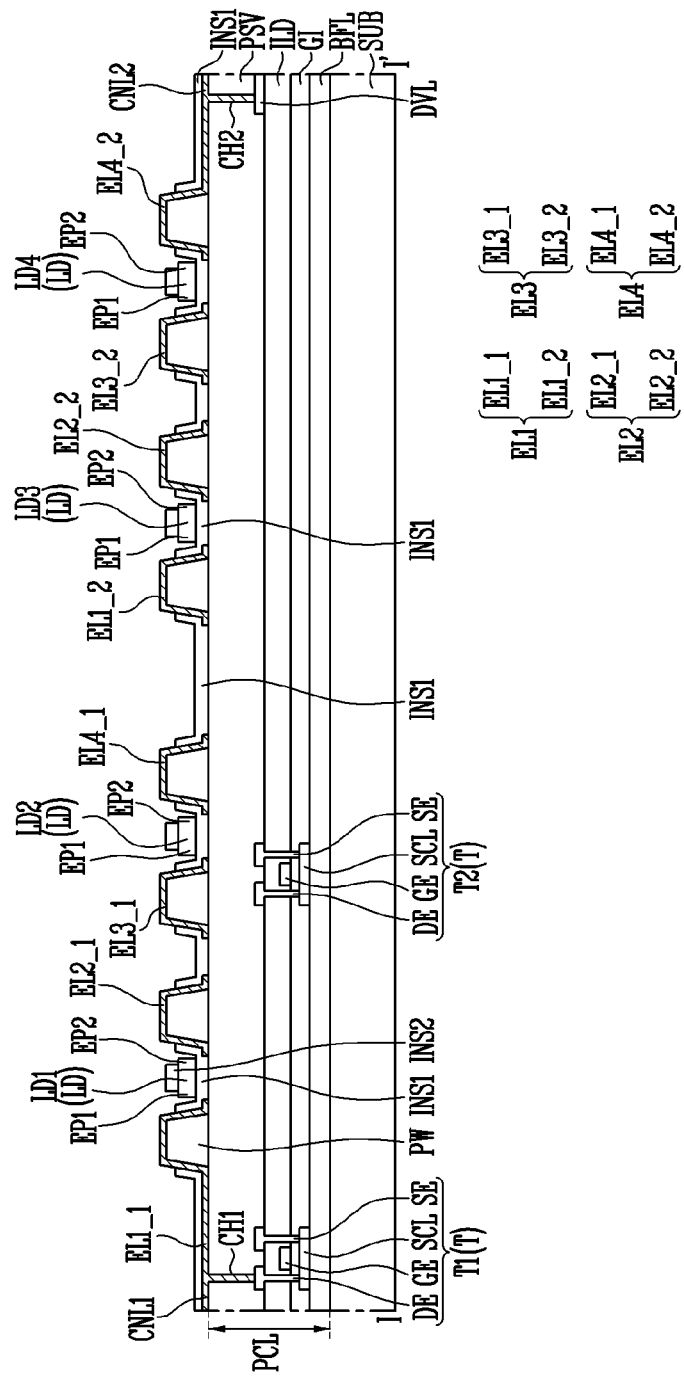

PIXEL, DISPLAY DEVICE HAVING SAME AND PRODUCTION METHOD THEREFOR

CROSS-REFERENCE TO RELATED APPLICATION(S)

This application is a national entry of International Application No. PCT/KR2020/008688, filed on Jul. 2, 2020, which claims under 35 U.S.C. §§ 119(a) and 365(b) priority to and benefits of Korean Patent Application No. 10-2019-0084301, filed on Jul. 12, 2019, in the Korean Intellectual Property Office (KIPO), the entire contents of which are incorporated herein by reference.

BACKGROUND

1. Technical Field

The disclosure relates to a pixel, a display device including the pixel, and a method of fabricating the display device.

2. Description of the Related Art

With an increase in interest in an information display and an increase in demand to use portable information media, demand for display devices is markedly increased, and commercialization thereof is in progress.

SUMMARY

An object of the disclosure is to provide a pixel capable of minimizing an off failure, a display device including the pixel, and a method of fabricating the display device.

A pixel in accordance with an embodiment of the disclosure may include first and second areas sectioned from each other in a first direction; a 1-1-th electrode, a 2-1-th electrode, a 3-1-th electrode, and a 4-1-th electrode successively arranged in the first area in a second direction intersecting the first direction; a 1-2-th electrode, a 2-2-th electrode, a 3-2-th electrode, and a 4-2-th electrode successively arranged in the second area in the second direction; a plurality of light emitting elements disposed between two adjacent electrodes of the 1-1-th to the 4-1-th electrodes of the first area; a plurality of light emitting elements disposed between two adjacent electrodes of the 1-2-th to the 4-2-th electrodes of the second area; a first conductive pattern disposed in the first area, and electrically connecting the 2-1-th and the 3-1-th electrodes; a second conductive pattern disposed over the first area and the second area, and electrically connecting the 4-1-th electrode of the first area with the 1-2-th electrode of the second area; and a third conductive pattern disposed in the second area and electrically connecting the 2-2-th and the 3-2-th electrodes.

In an embodiment of the disclosure, each of the 1-1-th to the 4-1-th electrodes of the first area may be disposed to correspond to a column identical to one of the 1-2-th to the 4-2-th electrodes of the second area.

In an embodiment of the disclosure, the 1-1-th electrode of the first area and the 1-2-th electrode of the second area may be disposed on an identical column to correspond to each other. The 2-1-th electrode of the first area and the 2-2-th electrode of the second area may be disposed on an identical column to correspond to each other. The 3-1-th electrode of the first area and the 3-2-th electrode of the second area may be disposed on an identical column to correspond to each other. The 4-1-th electrode of the first area and the 4-2-th electrode of the second area may be disposed on an identical column to correspond to each other.

In an embodiment of the disclosure, in a plan view, each of the 1-1-th to the 4-1-th electrodes of the first area may be spaced from one electrode of the 1-2-th to the 4-2-th electrodes of the second area.

In an embodiment of the disclosure, the first conductive pattern may be disposed directly on the 2-1-th and the 3-1-th electrodes of the first area and be electrically connected with the 2-1-th and the 3-1-th electrodes.

In an embodiment of the disclosure, the third conductive pattern may be disposed directly on the 2-2-th and the 3-2-th electrodes of the second area and be electrically connected with the 2-2-th and the 3-2-th electrodes.

In an embodiment of the disclosure, the second conductive pattern may be directly disposed on the 4-1-th electrode of the first area and the 1-2-th electrode of the second area and electrically connect the 4-1-th electrode of the first area with the 1-2-th electrode of the second area.

In an embodiment of the disclosure, the first to the third conductive patterns may be disposed on an identical layer.

In an embodiment of the disclosure, the second conductive pattern and the first and the third conductive patterns may be disposed on different layers.

In an embodiment of the disclosure, the second conductive pattern may be disposed on the first and the third conductive patterns with an insulating layer disposed the second conductive pattern and the first and the third conductive patterns.

In an embodiment of the disclosure, the plurality of light emitting elements of the first area may include first light emitting elements disposed between the 1-1-th and the 2-1-th electrodes of the first area and second light emitting elements disposed between the 3-1-th and the 4-1-th electrodes of the first area. The plurality of light emitting elements of the second area may include third light emitting elements disposed between the 1-2-th and the 2-2-th electrodes of the second area; and fourth light emitting elements disposed between the 3-2-th and the 4-2-th electrodes of the second area.

In an embodiment of the disclosure, the pixel may further include a contact electrode disposed on each of the 1-1-th electrode of the first area and the 4-2-th electrode of the second area.

In an embodiment of the disclosure, the contact electrode and at least one conductive pattern of the first to third conductive patterns may be disposed on an identical layer.

In an embodiment of the disclosure, the first light emitting elements may be electrically connected in parallel between the 1-1-th and the 2-1-th electrodes of the first area and form a first stage, the second light emitting elements may be electrically connected in parallel between the 3-1-th and the 4-1-th electrodes of the first area and form a second stage, the third light emitting elements may be electrically connected in parallel between the 1-2-th and the 2-2-th electrodes of the second area and form a third stage, and the fourth light emitting elements may be electrically connected in parallel between the 3-2-th and the 4-2-th electrodes of the second area and form a fourth stage. The first stage and the second stage may be electrically connected through the first conductive pattern, the second stage and the third stage may be electrically connected through the second conductive pattern, and the third stage and the fourth stage may be electrically connected through the third conductive pattern.

In an embodiment of the disclosure, the pixel may further include a third area disposed under the second area in the first direction. The third area may include a 1-3-th electrode, a 2-3-th electrode, a 3-3-th electrode, and a 4-3-th electrode disposed to correspond to respective columns identical to the 1-1-th to the 4-1-th electrodes of each of the first are and the 1-2-th to 4-2-th electrodes of the second areas; a plurality of light emitting elements disposed between two adjacent electrodes of the 1-3-th to the 4-3-th electrodes; and a fourth conductive pattern disposed on the 2-3-th and the 3-3-th electrodes and electrically connected with the 2-3-th and the 3-3-th electrodes.

In an embodiment of the disclosure, the pixel may further include a fifth conductive pattern disposed over the second area and the third area, and disposed on the 4-2-th electrode of the second area and the 3-1-th electrode of the third area and electrically connecting the 4-2-th electrode of the second area with the 3-1-th electrode of the third area.

In an embodiment of the disclosure, the pixel may further include a fourth area disposed under the third area in the first direction. The fourth area may include a 1-4-th electrode, a 2-4-th electrode, a 3-4-th electrode, and a 4-4-th electrode disposed to correspond to respective columns identical to the 1-1-th to the 4-1-th electrodes of each of the first area, the 1-2-th to the 4-2-th electrodes of the second area, the 1-3-th to the 4-3-th electrodes of the third area, and the 1-4-th to the 4-4-th electrodes of the fourth area a plurality of light emitting elements disposed between two adjacent electrodes of the 1-4-th to the 4-4-th electrodes; and a sixth conductive pattern disposed on the 2-4-th and the 3-4-th electrodes and electrically connected with the 2-4-th and the 3-4-th electrodes.

In an embodiment of the disclosure, the pixel may further include a seventh conductive pattern disposed over the third area and the fourth area, and disposed on the 4-3-th electrode of the third area and the 1-4-th electrode of the fourth area and electrically connecting the 4-3-th electrode of the third area with the 1-4-th electrode of the fourth area.

A display device in accordance with an embodiment of the disclosure may include a substrate including a display area and a non-display area; and at least one pixel disposed in the display area. The at least one pixel may include a first area and a second area sectioned from each other in a first direction; a 1-1-th electrode, a 2-1-the electrode, a 3-1-th electrode, and a 4-1-th electrode successively arranged in the first area in a second direction intersecting the first direction; a 1-2-th electrode, a 2-2-th electrode, a 3-2-th electrode, and a 4-2-th electrode successively arranged in the second area in the second direction; a plurality of light emitting elements disposed between two adjacent electrodes of the 1-1-th to the 4-1-th electrodes of the first area; a plurality of light emitting elements disposed between two adjacent electrodes of the 1-2-th to the 4-2-th electrodes of the second area; a first conductive pattern disposed in the first area and electrically connecting the 2-1-th and the 3-1-th electrodes; a second conductive pattern disposed over the first area and the second area, and electrically connecting the 4-1-th electrode of the first area with the 1-2-th electrode of the second area; and a third conductive pattern disposed in the second area and electrically connecting the 2-2th and the 3-2-th electrodes.

A method of fabricating a display device in accordance with an embodiment of the disclosure may include providing at least one pixel including an emission area having a first area and a second area sectioned from each other in a first direction.

Providing the at least one pixel may include forming a display element layer in the emission area. The forming the display element layer may include forming a first conductive line, a second conductive line, a third conductive line, and a fourth conductive line spaced from each other; aligning a plurality of light emitting elements in the emission area by respectively applying corresponding alignment signals to the first to the fourth conductive lines; removing a portion of each of the first to the fourth conductive lines so that a 1-1-th electrode, a 2-1-th electrode, a 3-1-th electrode, and a 4-1-th electrode successively arranged in a second direction are formed in the first area, and a 1-2-th electrode, a 2-2-th electrode, a 3-2-th electrode, and a 4-2-th electrode successively arranged in the second direction are formed in the second area; forming a first conductive pattern on the 2-1-th and the 3-1-th electrodes of the first area, and forming a second conductive pattern on the 2-2-th and the 3-2-th electrodes of the second area; and electrically connecting the 4-1-th electrode of the first area with the 1-2-th electrode of the second area, and forming the third conductive pattern disposed over the first area and the second area.

In an embodiment of the disclosure, each of the 1-1-th to the 4-1-th electrodes of the first area may correspond to a column identical to one electrode of the 1-2-th to the 4-2-th electrodes of the second area.

Embodiments of the disclosure may provide a pixel in which light emitting elements are connected in a serial-parallel combination structure so that an off failure of a pixel may be prevented from occurring and light output efficiency of the light emitting elements may be enhanced, and may provide a display device including the pixel and a method of fabricating the display device.

The effects of the disclosure are not limited by the foregoing, and other various effects are anticipated herein.

BRIEF DESCRIPTION OF THE DRAWINGS

An additional appreciation according to the embodiments of the disclosure will become more apparent by describing in detail the embodiments thereof with reference to the accompanying drawings, wherein:

FIGS. 16A to 16H are schematic cross-sectional views sequentially illustrating a method of fabricating the pixel illustrated in FIG. 10.

DETAILED DESCRIPTION OF THE EMBODIMENTS

Figure 1A:
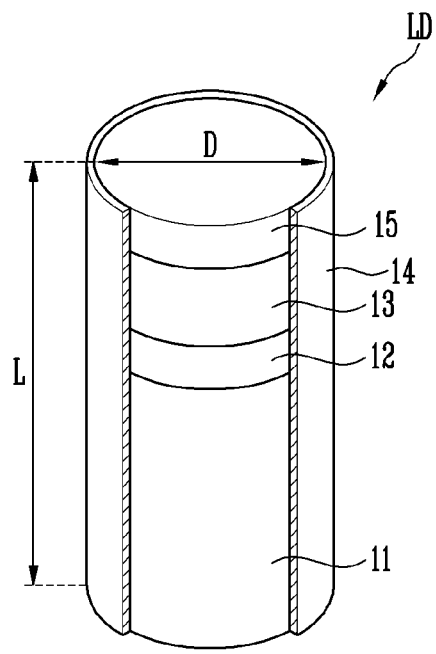
FIG. 1A is a perspective view schematically illustrating a light emitting element in accordance with an embodiment of the disclosure.

As the disclosure allows for various changes and numerous embodiments, particular embodiments will be illustrated in the drawings and described in detail in the written description. However, this is not intended to limit the disclosure to particular modes of practice, and it is to be appreciated that all changes, equivalents, and substitutes that do not depart from the technical scope of the disclosure are encompassed in the disclosure.

Throughout the disclosure, like reference numerals refer to like parts throughout the various figures and embodiments of the disclosure. The sizes of elements in the accompanying drawings may be exaggerated for clarity of illustration. It will be understood that, although the terms "first," "second," and the like may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element. In the disclosure, the singular forms are intended to include the plural forms as well, unless the context clearly indicates otherwise.

It will be further understood that the terms "comprise," "include," "have," and the like when used in this specification, specify the presence of stated features, integers, steps, operations, elements, components, and/or combinations of them but do not preclude the presence or addition of one or more other features, integers, steps, operations, elements, components, and/or combinations thereof. Furthermore, when a first part such as a layer, a film, a region, or a plate is disposed on a second part, the first part may be not only directly on the second part but a third part may intervene between them. In addition, when it is expressed that a first part such as a layer, a film, a region, or a plate is formed on a second part, the surface of the second part on which the first part is formed is not limited to an upper surface of the second part but may include other surfaces such as a side surface or a lower surface of the second part. To the contrary, when a first part such as a layer, a film, a region, or a plate is under a second part, the first part may be not only directly under the second part but a third part may intervene between them.

Embodiments and required details of the disclosure are described with reference to the accompanying drawings in order to describe the disclosure in detail so that those having ordinary knowledge in the technical field to which the disclosure pertains may easily practice the disclosure. Furthermore, a singular meaning may include a plural form as long as it is not specifically mentioned in a sentence.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

It will be understood that the terms "contact," "connected to," and "coupled to" may include a physical and/or electrical contact, connection, or coupling.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Figure 1B:
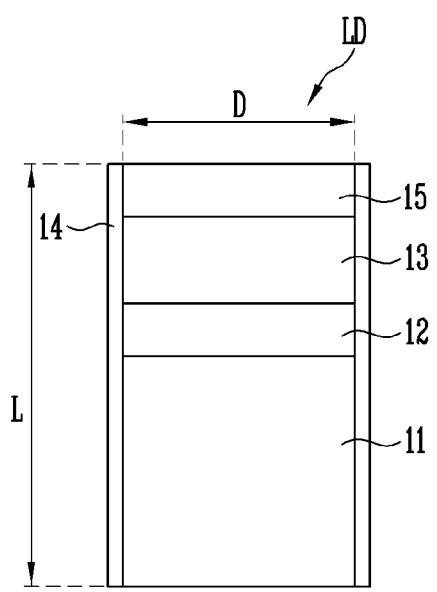
FIG. 1B is a cross-sectional view schematically illustrating the light emitting element of FIG. 1A.
Figure 2A:
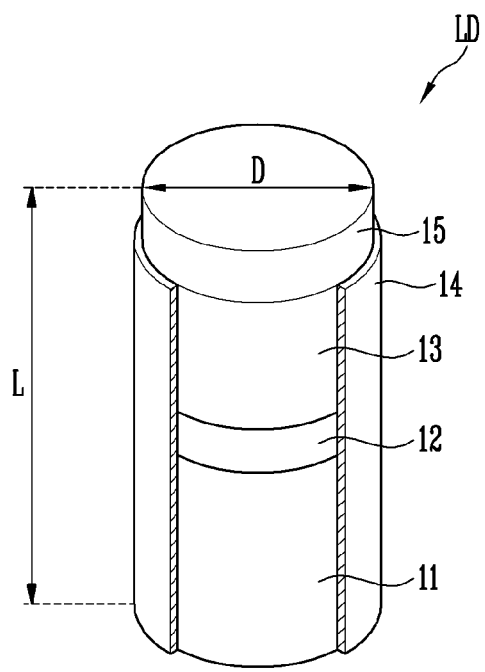
FIG. 2A is a perspective view schematically illustrating a light emitting element in accordance with an embodiment of the disclosure.
Figure 2B:
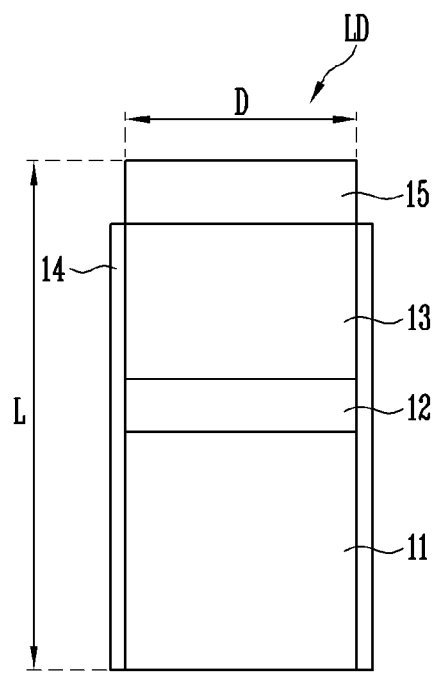
FIG. 2B is a cross-sectional view schematically illustrating the light emitting element of FIG. 2A.
Figure 3A:
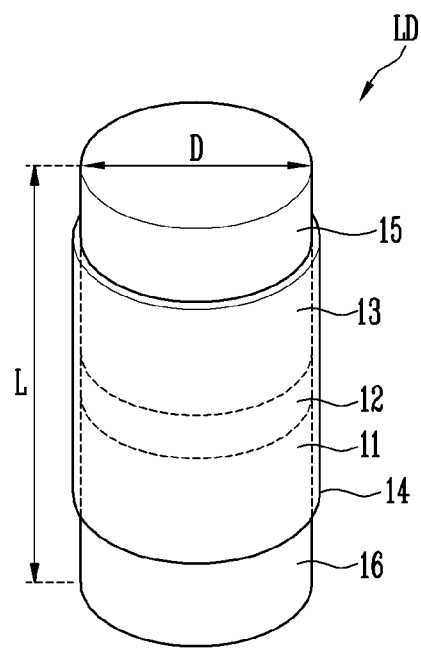
FIG. 3A is a perspective view schematically illustrating a light emitting element in accordance with an embodiment of the disclosure.
Figure 3B:
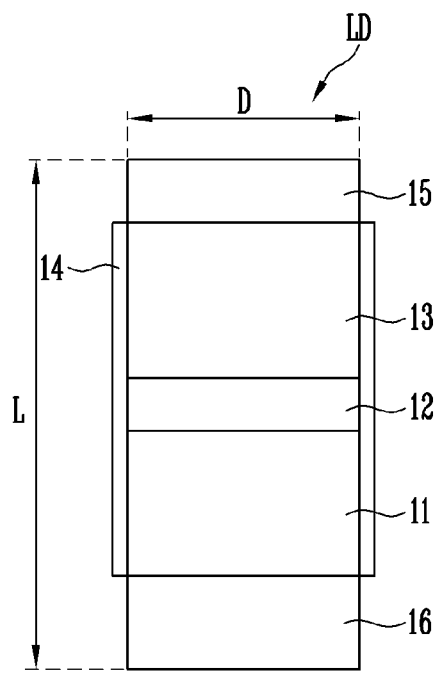
FIG. 3B is a cross-sectional view schematically illustrating the light emitting element of FIG. 3A.
Figure 4A:
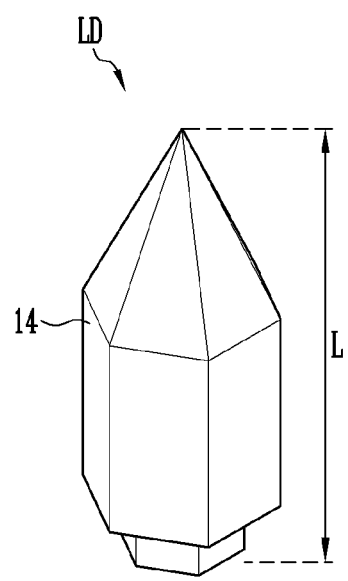
FIG. 4A is a perspective view schematically illustrating a light emitting element in accordance with an embodiment of the disclosure.
Figure 4B:
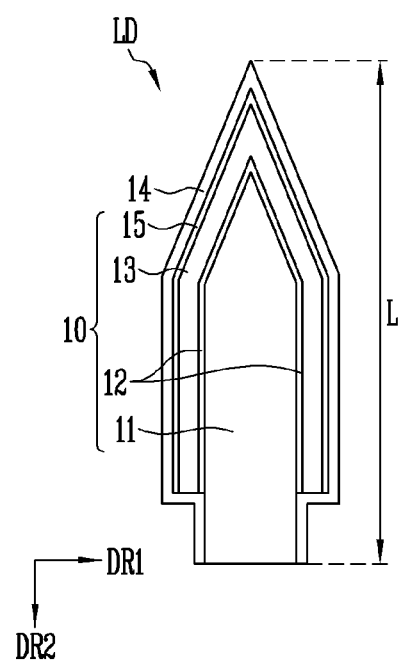
FIG. 4B is a cross-sectional view schematically illustrating the light emitting element of FIG. 4A.

FIG. 1A is a perspective view schematically illustrating a light emitting element in accordance with an embodiment. FIG. 1B is a schematic cross-sectional view illustrating the light emitting element of FIG. 1A FIG. 2A is a perspective view schematically illustrating a light emitting element in accordance with an embodiment. FIG. 2B is a schematic cross-sectional view illustrating the light emitting element of FIG. 2A. FIG. 3A is a perspective view schematically illustrating a light emitting element in accordance with an embodiment. FIG. 3B is a schematic cross-sectional view illustrating the light emitting element of FIG. 3A FIG. 4A is a perspective view schematically illustrating a light emitting element in accordance with an embodiment. FIG. 4B is a schematic cross-sectional view illustrating the light emitting element of FIG. 4A.

For the sake of explanation, a light emitting element fabricated by an etching method will be described with reference to FIGS. 1A, 1B, 2A, 2B, 3A, and 3B, and then a light emitting element fabricated by a growth method will be described with reference to FIGS. 4A and 4B. In an embodiment, the kind and/or shape of a light emitting element LD is not limited to that in the embodiments illustrated in FIGS. 1A, 1B, 2A, 2B, 3A, 3B, 4A, and 4B.

Referring to FIGS. 1A, 1B, 2A, 2B, 3A, and 3B, the light emitting element LD may include a first semiconductor layer 11, a second semiconductor layer 13, and an active layer 12 interposed between the first and second semiconductor layers 11 and 13. For example, the light emitting element LD may be implemented as an emission stack formed by successively stacking the first semiconductor layer 11, the active layer 12, and the second semiconductor layer 13.

In an embodiment, the light emitting element LD may extend in a direction. If the direction in which the light emitting element LD extends is defined as a longitudinal direction, the light emitting element LD may have a first end and a second end in the extension direction. One of the first and second semiconductor layers 11 and 13 may be disposed on one end (first end) of the light emitting element LD, and the other (second end) of the first and second semiconductor layers 11 and 13 may be disposed on the other end of the light emitting element LD.

Although the light emitting element LD may be provided in the form of a cylinder, the shape of the light emitting element LD is not limited thereto. The light emitting element LD may have a rod-like shape or a bar-like shape extending in the longitudinal direction (e.g., to have an aspect ratio greater than 1). For example, the length L of the light emitting element LD in the longitudinal direction may be greater than a diameter D thereof (or a width of the cross-section thereof). The light emitting element LD may include a light emitting diode fabricated to have a subminiature size, e.g., with a length L and/or a diameter D corresponding to the micrometer scale or the nanometer scale.

In an embodiment, the diameter D of the light emitting element LD may range from about 0.5 nm to about 5 μm, and the length L thereof may range from about 1 μm to about 10 μm. However, the size of the light emitting element LD is not limited thereto, and the size of the light emitting element LD may be changed to meet requirements (or design conditions) of a lighting device or a self-emissive display device to which the light emitting element LD is applied.

The first semiconductor layer 11 may include, for example, at least one n-type semiconductor layer. For instance, the first semiconductor layer 11 may include an n-type semiconductor layer which includes a semiconductor material of InAlGaN, GaN, AlGaN, InGaN, AlN, and InN and is doped with a first conductive dopant such as Si, Ge, or Sn. However, the material of the first semiconductor layer 11 is not limited thereto, and the first semiconductor layer 11 may be formed of various other materials.

The active layer 12 may be disposed on the first semiconductor layer 11 and have a single or multiple quantum well structure. The location of the active layer 12 may be changed in various ways depending on the type of the light emitting element LD. The active layer 12 may emit light having a wavelength ranging from about 400 nm to about 900 nm, and have a double heterostructure. In an embodiment, a cladding layer (not shown) doped with a conductive dopant may be formed on and/or under the active layer 12. For example, the cladding layer may be formed of (or include) an AlGaN layer or an InAlGaN layer. In an embodiment, a material such as AlGaN or InAlGaN may be used to form the active layer 12, and various other materials may be used to form the active layer 12.

If an electric field of a predetermined voltage or more is applied to the opposite ends of the light emitting element LD, the light emitting element LD emits light by coupling of combining of electron-hole pairs in the active layer 12. Since light emission of the light emitting element LD may be controlled based on the foregoing principle, the light emitting element LD may be used as a light source of various light emitting devices as well as a pixel of the display device.

The second semiconductor layer 13 may be disposed on the active layer 12 and include a semiconductor layer having a type different from that of the first semiconductor layer 11. For example, the second semiconductor layer 13 may include at least one p-type semiconductor layer. For instance, the second semiconductor layer 13 may include a p-type semiconductor layer which includes any semiconductor material of InAlGaN, GaN, AlGaN, InGaN, AlN, and InN, and is doped with a second conductive dopant such as Mg. However, the material for forming the second semiconductor layer 13 is not limited thereto, and the second semiconductor layer 13 may be formed of various other materials.

In an embodiment, the first semiconductor layer 11 and the second semiconductor layer 13 may have different widths (or thicknesses) in the longitudinal direction (L) of the light emitting element LD. For example, the first semiconductor layer 11 may have a width (or a thickness) greater than that of the second semiconductor layer 13 in the longitudinal direction (L) of the light emitting element LD.

In an embodiment, the light emitting element LD may further include an additional electrode 15 disposed on the second semiconductor layer 13, as well as the first semiconductor layer 11, the active layer 12, and the second semiconductor layer 13. In an embodiment, as shown in FIGS. 3A and 3B, the light emitting element LD may include an additional electrode 16 disposed on an end of the first semiconductor layer 11.

Although each of the additional electrodes 15 and 16 may be formed of an ohmic contact electrode, the disclosure is not limited thereto. Furthermore, each of the additional electrodes 15 and 16 may include metal or a metal oxide. For example, chromium (Cr), titanium (Ti), aluminum (Al), gold (Au), nickel (Ni), indium tin oxide (ITO), and an oxide or alloy thereof may be used alone or in combination with each other. However, the disclosure is not limited thereto.

Materials included in the respective additional electrodes 15 and 16 may be equal to or different from each other. The additional electrodes 15 and 16 may be substantially transparent or semitransparent. Therefore, light generated from the light emitting element LD may pass through the additional electrodes 15 and 16 and then be emitted outside the light emitting element LD.

In an embodiment, the light emitting element LD may further include an insulating layer 14. However, in some embodiments, the insulating layer 14 may be omitted, or may be provided to cover only some of the first semiconductor layer 11, the active layer 12, and the second semiconductor layer 13.

The insulating layer 14 may prevent the active layer 12 from short-circuiting due to making contact with a conductive material except the first semiconductor layer 11 and the second semiconductor layer 13. Furthermore, by the virtue of the insulating layer 14, occurrence of a defect in the surface of the light emitting element LD may be minimized, whereby the lifespan and efficiency of the light emitting element LD may be improved. In the case where light emitting elements LD are disposed in close contact with each other, the insulating layer 14 may prevent an undesired short circuit from occurring between the light emitting elements LD. It is not limited whether the insulating layer 14 is provided, so long as the active layer 12 may be prevented from short-circuiting with an external conductive material.

As illustrated in FIGS. 1A and 1B, the insulating layer 14 may enclose an outer circumferential surface of the emissive stack including the first semiconductor layer 11, the active layer 12, the second semiconductor layer 13, and the additional electrode 15. However, the disclosure is not limited thereto. In an embodiment, as illustrated in FIGS. 2A and 2B, the insulating layer 14 may enclose respective outer circumferential surfaces of the first semiconductor layer 11, the active layer 12, and the second semiconductor layer 13, and may not enclose an outer circumferential surface of the additional electrode 15 disposed on the second semiconductor layer 13. The insulating layer 14 may allow at least the opposite ends of the light emitting element LD to be exposed to the outside, e.g., allow not only the additional electrode 15 disposed on one end (or first end) of the second semiconductor layer 13 but also one end (or first end) of the first semiconductor layer 11 to be exposed to the outside. In an embodiment, as illustrated in FIGS. 3A and 3B, in the case where the additional electrodes 15 and 16 are disposed on the respective opposite ends of the light emitting element LD, the insulating layer 14 may allow at least a portion of each of the additional electrodes 15 and 16 to be exposed to the outside. As another example, in an embodiment, the insulating layer 14 may not be provided.

In an embodiment, the insulating layer 14 may include transparent insulating material. For example, the insulating layer 14 may include at least one insulating material selected from the group of $SiO_2$, $Si_3N_4$, $Al_2O_3$, and $TiO_2$, but the disclosure is not limited thereto. In other words, various materials having insulating properties may be employed.

If the insulating layer 14 is provided in the light emitting element LD, the active layer 12 may be prevented from short-circuiting with a first and/or second electrode (not illustrated). Furthermore, by virtue of the insulating layer 14, occurrence of a defect on the surface of the light emitting element LD may be minimized, and thus the lifespan and efficiency of the light emitting element LD may be improved. In case that light emitting elements LD are disposed in close contact with each other, the insulating layer 14 may prevent an undesired short circuit from occurring between the light emitting elements LD.

The light emitting element LD may be employed as a light source for various display devices. The light emitting element LD may be fabricated by a surface treatment process. For example, each light emitting element LD may be surface-treated so that, in case that a plurality of light emitting elements LD are mixed with a fluidic solution (or solvent) and supplied to each emission area (e.g., an emission area of each sub-pixel), the light emitting elements LD may be evenly dispersed rather than unevenly aggregating in the solution.

A light emitting device including the light emitting element LD described above may be used not only in a display device but also in various devices which require a light source. For instance, in case that light emitting elements LD are disposed in the emission area of each pixel of a display panel, the light emitting elements LD may be used as a light source of the pixel. However, the application field of the light emitting element LD is not limited to the above-mentioned examples. For example, the light emitting element LD may be used in other types of devices such as a lighting device, which requires a light source.

Next, a light emitting element LD which has a core-shell structure and is fabricated by a growth method will be described with reference to FIGS. 4A and 4B. The following description of the light emitting element LD having a core-shell structure will be focused on differences from the above-mentioned embodiments, and components of the light emitting element LD that are not separately explained in the following description may comply with that of the preceding embodiments. The same reference numerals will be used to designate the same components, and similar reference numerals will be used to designate similar components.

Referring to FIGS. 4A and 4B, the light emitting element LD in accordance with an embodiment may include a first semiconductor layer 11, a second semiconductor layer 13, and an active layer 12 interposed between the first and second semiconductor layers 11 and 13. In some embodiments, the light emitting element LD may include an emission pattern 10 having a core-shell structure. The emission pattern 10 may include a first semiconductor layer 11 disposed in a central portion of the light emitting element LD, an active layer 12 which encloses at least one side of the first semiconductor layer 11, a second semiconductor layer 13 which encloses at least one side of the active layer 12, and an additional electrode 15 which encloses at least one side of the second semiconductor layer 13.

The light emitting element LD may be formed in a polypyramidal shape extending in a direction. In an embodiment, the light emitting element LD may be provided in the form of a hexagonal pyramid. If the direction in which the light emitting element LD extends is defined as a longitudinal direction (L), the light emitting element LD may have a first end (or a lower end) and a second end (or an upper end) in the longitudinal direction (L). In an embodiment, one of the first and second semiconductor layers 11 and 13 may be disposed on the first end (or the lower end) of the light emitting element LD. The other of the first and second semiconductor layers 11 and 13 may be disposed on the second end (or the upper end) of the light emitting element LD.

In an embodiment, the light emitting element LD may have a small size corresponding to the nanometer scale or the micrometer scale, e.g., a diameter and/or a length L having a nanometer scale range or a micrometer scale range. However, the size of the light emitting element LD is not limited thereto, and the size of the light emitting element LD may be changed to meet requirements (or application conditions) of a lighting device or a self-emissive display device to which the light emitting element LD is applied.

In an embodiment, the first semiconductor layer 11 may be disposed in a core, e.g., a central (or middle) portion, of the light emitting element LD. The light emitting element LD may have a shape corresponding to the shape of the first semiconductor layer 11. For instance, if the first semiconductor layer 11 has a hexagonal pyramid shape, the light emitting element LD and the emission pattern 10 each may also have a hexagonal pyramid shape.

The active layer 12 may be provided and/or formed in a shape enclosing the outer circumferential surface of the first semiconductor layer 11 in the longitudinal direction (L) of the light emitting element LD. In detail, the active layer 12 may be provided and/or formed in a shape enclosing an area of the first semiconductor layer 11, other than a lower end of the opposite ends of the first semiconductor layer 11, in the longitudinal direction (L) of the light emitting element LD.

The second semiconductor layer 13 may be provided and/or formed in a shape enclosing the active layer 12 in the longitudinal direction (L) of the light emitting element LD, and may include a semiconductor layer having a type different from that of the first semiconductor layer 11. For example, the second semiconductor layer 13 may include at least one p-type semiconductor layer.

In an embodiment, the light emitting element LD may include an additional electrode 15 that encloses at least one side of the second semiconductor layer 13. The additional electrode 15 may be an ohmic contact electrode electrically connected to the second semiconductor layer 13, but the disclosure is not limited thereto.

As described above, the light emitting element LD may have a hexagonal pyramid shape with the opposite ends protruding outward, and may be implemented as the emission pattern 10 with a core-shell structure including the first semiconductor layer 11 provided in the central portion thereof, the active layer 12 which encloses the first semiconductor layer 11, the second semiconductor layer 13 which encloses the active layer 12, and the additional electrode 15 which encloses the second semiconductor layer 13. The first semiconductor layer 11 may be disposed on the first end (or the lower end) of the light emitting element LD having a hexagonal pyramid shape, and the additional electrode 15 may be disposed on the second end (or the upper end) of the light emitting element LD.

In an embodiment, the light emitting element LD may further include an insulating layer 14 provided on the outer circumferential surface of the emission pattern 10 having a core-shell structure. The insulating layer 14 may include a transparent insulating material.

Figure 5:
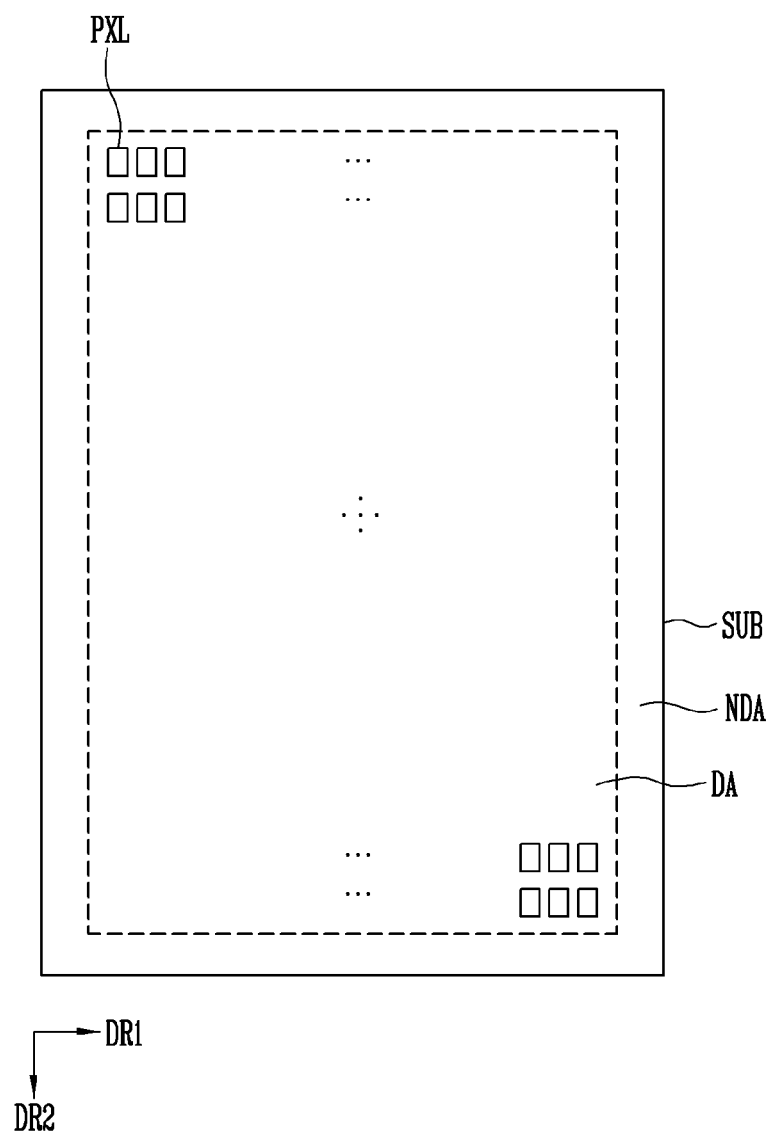
FIG. 5 illustrates a display device in accordance with an embodiment of the present disclosure, and particularly, is a schematic plan view of a display device using, as a light source, any one of the light emitting elements illustrated in FIGS. 1A, 1B, 2A, 2B, 3A, 3B, 4A, and 4B.

FIG. 5 illustrates a display device in accordance with an embodiment, and particularly, is a schematic plan view of a display device using, as a light source, any of the light emitting elements illustrated in FIGS. 1A, 1B, 2A, 2B, 3A, 3B, 4A, and 4B.

For the sake of explanation, FIG. 5 schematically illustrates the structure of the display device, focused on a display area on which an image is displayed. In some embodiments, although not illustrated in the drawings, at least one driving circuit (e.g., a scan driver and a data driver) and/or a plurality of lines may be further provided in the display device.

Referring to FIGS. 1A, 1B, 2A, 2B, 3A, 3B, 4A, 4B, and 5, the display device in accordance with an embodiment may include a substrate SUB, pixels PXL which are provided on the substrate SUB and each including at least one light emitting element LD, a driver (not illustrated) provided on the substrate SUB and configured to drive the pixels PXL, and a line component (or line, not illustrated) provided to contact the pixels PXL to the driver.

The display device may be classified into a passive-matrix type display device and an active-matrix type display device according to a method of driving the light emitting element LD. For example, in case that the display device is implemented as an active matrix type, each of the pixels PXL may include a driving transistor configured to control the amount of current to be supplied to the light emitting element LD, and a switching transistor configured to transmit data signals to the driving transistor.

Recently, active-matrix type display devices capable of selectively turning on each pixel PXL taking into account the resolution, contrast, and working speed have been mainstreamed. However, the disclosure is not limited thereto. For example, passive-matrix type display devices in which pixels PXL may be turned on by groups may employ components (e.g., first and second electrodes) for driving the light emitting element LD.

The substrate SUB may include a display area DA and a non-display area NDA.

In an embodiment, the display area DA may be disposed in a central area of the display device, and the non-display area NDA may be disposed in a perimeter area of the display device to enclose the display area DA. The locations of the display area DA and the non-display area NDA are not limited thereto, and the locations thereof may be changed.

The display area DA may be an area in which the pixels PXL for displaying an image are provided. The non-display area NDA may be an area in which the driver for driving the pixels PXL and some of the line for electrically connecting the pixels PXL to the driver are provided.

The display area DA may have various shapes. For example, the display area DA may be provided in various forms such as a closed polygon including sides formed of linear lines, a circle, an ellipse or the like including a side formed of a curved line, and a semicircle, a semi-ellipse or the like including sides formed of a linear line and a curved line.

The non-display area NDA may be provided on at least one side of the display area DA. In an, the non-display area NDA may enclose the perimeter of the display area DA.

The substrate SUB may include a transparent insulating material to allow light transmission.

The substrate SUB may be a rigid substrate. For example, the rigid substrate SUB may be one of a glass substrate, a quartz substrate, a glass ceramic substrate, and a crystalline glass substrate.

The substrate SUB may be a flexible substrate. Here, the flexible substrate SUB may be either a film substrate or a plastic substrate which includes a polymer organic material. For example, the flexible substrate SUB may include at least one of the following: polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate.

However, materials constituting (or forming) the substrate SUB may be changed in various way and include, for example, fiber-reinforced plastic (FRP).

An area in the substrate SUB is provided as the display area DA in which the pixels PXL are disposed, and the other area thereof is provided as the non-display area NDA. For example, the substrate SUB may include the display area DA including pixel areas in which the respective pixels PXL are formed, and the non-display area NDA disposed around the display area DA.

The pixels PXL may be disposed in the display area DA in the substrate SUB. In an embodiment, the pixels PXL may be arranged in the display area DA in a stripe or a PenTile® arrangement structure, but the disclosure is not limited thereto.

Each pixel PXL may include a light emitting element LD configured to be driven in response to a corresponding scan signal and a corresponding data signal. The light emitting element LD may have a small size corresponding to the micrometer scale or the nanometer scale and be electrically connected in parallel to light emitting elements LD disposed adjacent thereto, but the disclosure is not limited thereto. The light emitting element LD may form a light source of each pixel PXL.

Each of the pixels PXL may include at least one light source which is driven by a control signal (e.g., a scan signal and a data signal) and/or a power supply (e.g., a first driving power supply and a second driving power supply). For example, each of the pixels PXL may include a light emitting element LD illustrated in each of the embodiments of FIGS. 1A to 4B, e.g., at least one subminiature light emitting element LD having a small size corresponding to the nanometer scale or the micrometer scale. However, in embodiments, the type of the light emitting element LD which may be used as a light source of the pixel PXL is not limited thereto.

In an embodiment, the color, type, and/or number of pixels PXL are not particularly limited. For example, the color of light emitted from each pixel PXL may be changed in various ways.

The driver may provide a signal to each pixel PXL through the line to thus control the operation of the pixel PXL. For the sake of explanation, the line component is omitted from FIG. 5.

The driver may include a scan driver configured to provide scan signals to the pixels PXL through scan lines, an emission driver configured providing emission control signals to the pixels PXL through emission control lines, a data driver configured to provide data signals to the pixels PXL through data lines, and a timing controller. The timing controller may control the scan driver, the emission driver, and the data driver.

FIGS. 6A to 6E are circuit diagrams schematically illustrating various embodiments of electrical connection relationship of components included in any of the pixels illustrated in FIG. 5.

For example, FIGS. 6A to 6E illustrate different embodiments of the electrical connection relationship of components included in a pixel PXL which may be employed in an active display device. However, the types of the components included in the pixel PXL to which embodiments may be applied are not limited thereto.

In FIGS. 6A to 6E, not only the components included in each of the pixels PXL illustrated in FIG. 5 but also an area in which the components are provided is embraced in the definition of the term "pixel PXL". In an embodiment, each pixel PXL illustrated in FIGS. 6A to 6E may be any of the pixels PXL provided on the display device of FIG. 5. The pixels PXL may have structures substantially identical or similar to each other.

Referring to FIGS. 1A to 4B, 5, and 6A to 6E, each pixel PXL (hereinafter referred to as "pixel") may include an emission unit (or emission part) EMU configured to generate light having a luminance corresponding to a data signal. The pixel PXL may selectively further include a pixel circuit 144 configured to drive the emission part EMU.

In an embodiment, the emission part EMU may include a plurality of light emitting elements LD electrically connected in parallel between a first power supply line PL1 to which a first driving power supply VDD is applied and a second power supply line PL2 to which a second driving power supply VSS is applied. For example, the emission part EMU may include a first electrode EL1 (or "first alignment electrode") electrically connected to the first driving power supply VDD via the pixel circuit 144 and the first power supply line PL1, a second electrode EL2 (or "second alignment electrode") electrically connected to the second driving power supply VSS through the second power supply line PL2, and light emitting elements LD electrically connected in parallel to each other in an identical direction between the first and second electrodes EL1 and EL2. In an embodiment, the first electrode EL1 may be an anode electrode, and the second electrode EL2 may be a cathode electrode.

In an embodiment, each of the light emitting elements LD included in the emission part EMU may include a first end electrically connected to the first driving power supply VDD through the first electrode EL1, and a second end electrically connected to the second driving power supply VSS through the second electrode EL2. The first driving power supply VDD and the second driving power supply VSS may have different potentials. For example, the first driving power supply VDD may be set as a high-potential power supply, and the second driving power supply VSS may be set as a low-potential power supply. Here, a difference in potential between the first and second driving power supplies VDD and VSS may be set to a value equal to or greater than a threshold voltage of the light emitting elements LD during an emission period of the pixel PXL.

As described above, the light emitting elements LD that are electrically connected in parallel to each other in the same direction (e.g., in a forward direction) between the first electrode EL1 and the second electrode EL2 to which voltages having different potentials are respectively supplied may form respective valid light sources. The valid light sources may be collectively form the emission part EMU of the pixel PXL.

The light emitting elements LD of the emission part EMU may emit light having a luminance corresponding to driving current supplied thereto through the pixel circuit 144. For example, during each frame period, the pixel circuit 144 may supply driving current corresponding to a grayscale level of corresponding frame data to the emission part EMU. The driving current supplied to the emission part EMU may be divided and flow through the light emitting elements LD electrically connected to each other in the identical direction. Hence, each of the light emitting elements LD may emit light having a luminance corresponding to current applied thereto, so that the emission part EMU may emit light having a luminance corresponding to the driving current.

Figure 6A:
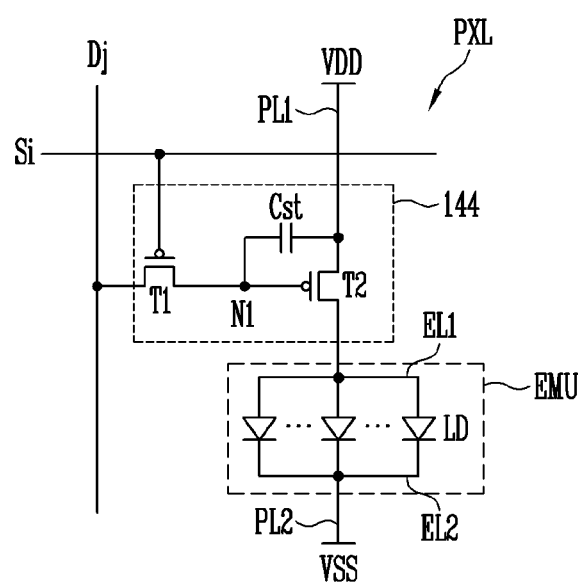
FIGS. 6A to 6E are circuit diagrams schematically illustrating various embodiments of electrical connection relationships of components included in any one pixel of the pixels illustrated in FIG. 5.
Figure 6B:
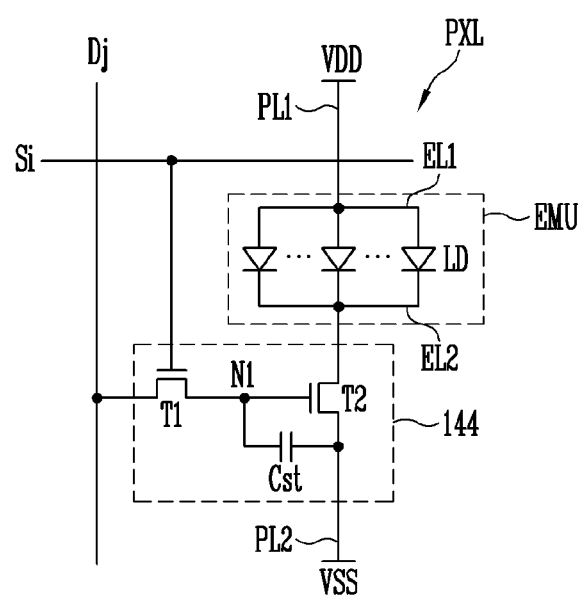
Figure 6C:
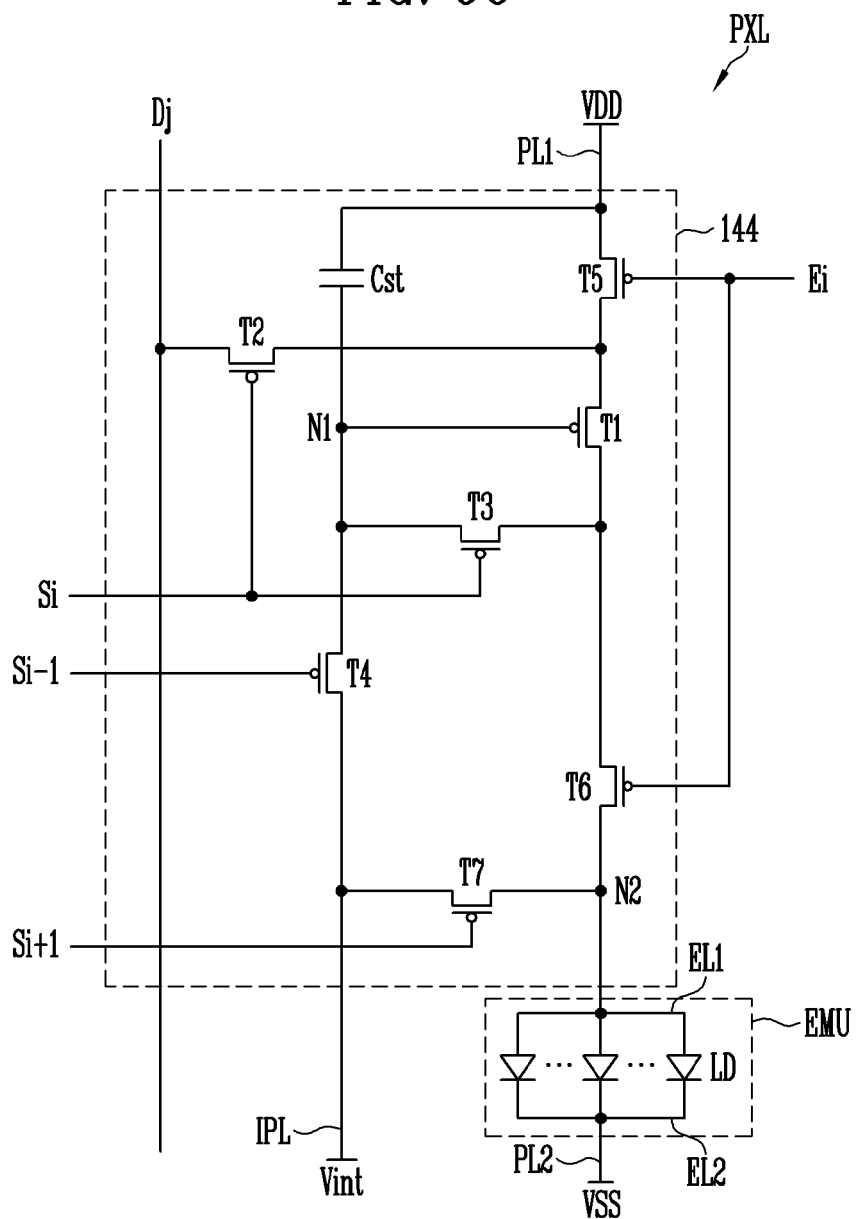
Figure 6D:
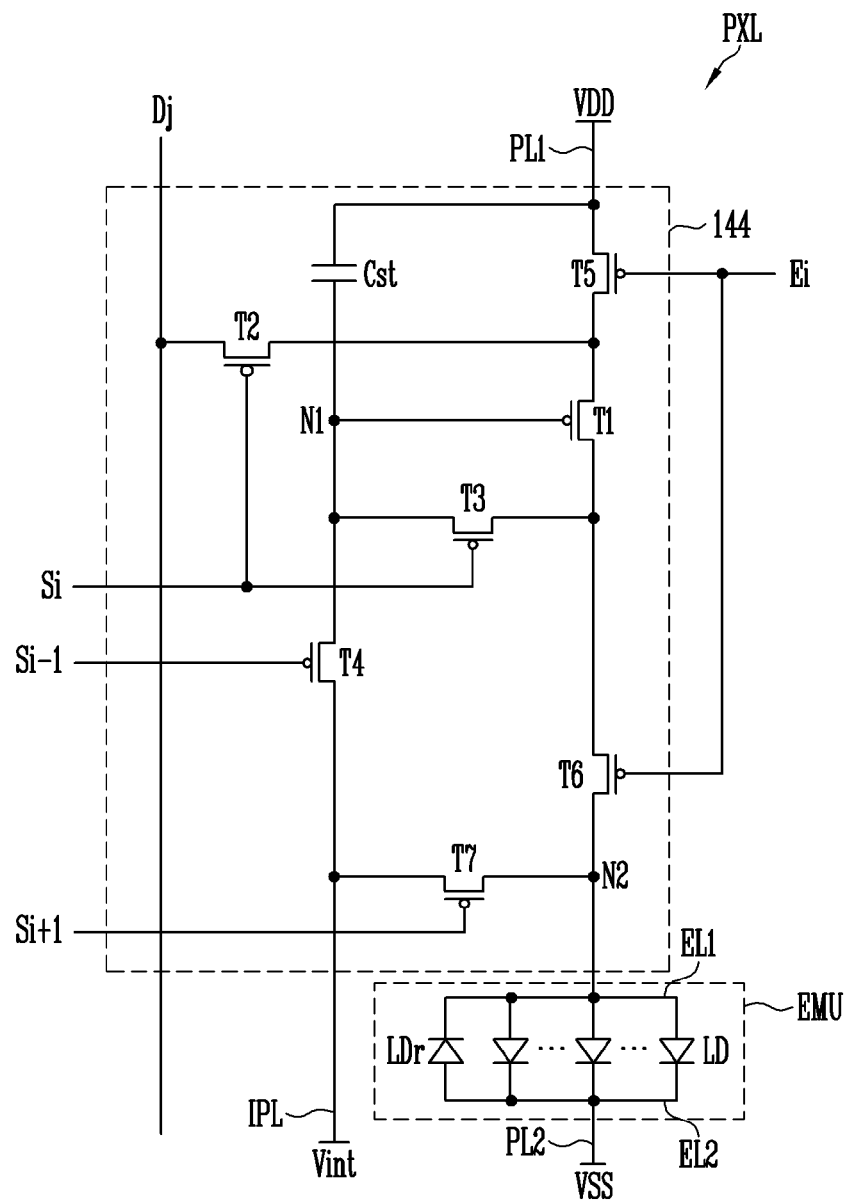
Figure 6E:
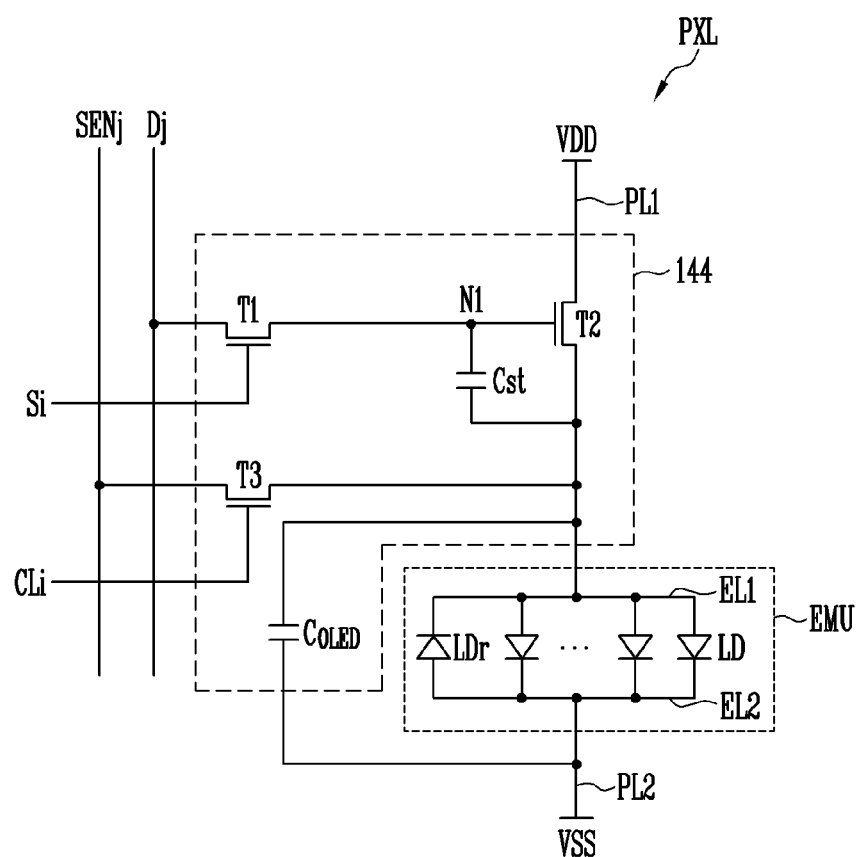

Although FIGS. 6A to 6E illustrate embodiments in which the light emitting elements LD are electrically connected to each other in the identical direction between the first and second driving power supplies VDD and VSS, the disclosure is not limited thereto. In an embodiment, the emission part EMU may further include at least one invalid light source, as well as the light emitting elements LD that form the respective invalid light sources. For example, as illustrated in FIGS. 6D and 6E, at least one reverse light emitting element LDr may be further electrically connected between the first and second electrodes EL1 and EL2 of the emission part EMU. The reverse light emitting element LDr, along with the light emitting elements LD that form the valid light sources, may be connected in parallel to each other between the first and second electrodes EL1 and EL2. Here, the reverse light emitting element LDr may be electrically connected between the first and second electrodes EL1 and EL2 in a direction opposite to that of the light emitting elements LD. Even in case that a predetermined driving voltage (e.g., a normal directional driving voltage) is applied between the first and second electrodes EL1 and EL2, the reverse light emitting element LDr remains disabled. Hence, current substantially does not flow through the reverse light emitting element LDr.

The pixel circuit 144 may be electrically connected to a scan line Si and a data line Dj of the corresponding pixel PXL. For example, if the pixel PXL is disposed on an i-th row (i is a natural number) and a j-th column (j is a natural number) of the display area DA, the pixel circuit 144 of the pixel PXL may be electrically connected to an i-th scan line Si and a j-th data line Dj of the display area DA. In an embodiment, the pixel circuit 144 may include first and second transistors T1 and T2, and a storage capacitor Cst, as illustrated in FIGS. 6A and 6B. The structure of the pixel circuit 144 is not limited to the embodiments illustrated in FIGS. 6A and 6B.

First, referring to FIG. 6A, the pixel circuit 144 may include first and second transistors T1 and T2, and a storage capacitor Cst.

A first terminal of the first transistor T1 (or switching transistor) may be electrically connected to the data line Dj, and a second terminal thereof may be electrically connected to a first node N1. Here, the first terminal and the second terminal of the first transistor T1 are different from each other, and, for example, if the first terminal is a source electrode, the second terminal is a drain electrode. A gate electrode of the first transistor T1 may be electrically connected to the scan line Si.

In case that a scan signal having a voltage (e.g., a low-level voltage) capable of turning on the first transistor T1 is supplied from the scan line Si, the first transistor T1 is turned on to electrically connect the data line Dj with the first node N1. Here, a data signal of a corresponding frame is supplied to the data line Dj, whereby the data signal is transmitted to the first node N1. The data signal transmitted to the first node N1 may charge the storage capacitor Cst.

A first terminal of the second transistor T2 (or driving transistor) may be electrically connected to the first driving power supply VDD, and a second terminal thereof may be electrically connected to the first electrode EL1 for the light emitting elements LD. A gate electrode of the second transistor T2 may be electrically connected to the first node N1. As such, the second transistor T2 may control the amount of driving current supplied to the light emitting elements LD in response to the voltage of the first node N1.

A first electrode of the storage capacitor Cst may be electrically connected to the first driving power supply VDD, and a second electrode thereof may be electrically connected to the first node N1. The storage capacitor Cst is charged with a voltage corresponding to a data signal supplied to the first node N1, and maintains the charged voltage until a data signal of a subsequent frame is supplied.

FIGS. 6A and 6B each illustrate the pixel circuit 144 including the first transistor T1 configured to transmit a data signal to the pixel PXL, the storage capacitor Cst configured to store the data signal, and the second transistor T2 configured to supply driving current corresponding to the data signal to the light emitting elements LD.

However, the disclosure is not limited thereto, and the structure of the pixel circuit 144 may be changed in various ways. For example, the pixel circuit 144 may further include at least one transistor element such as a transistor element configured to compensate for the threshold voltage of the second transistor T2, a transistor element configured to initialize the first node N1, and/or a transistor element configured to control an emission time of the light emitting elements LD, or other circuit elements such as a boosting capacitor for boosting the voltage of the first node N1.

Furthermore, although in FIG. 6A the transistors, e.g., the first and second transistors T1 and T2, included in the pixel circuit 144 are formed as P-type transistors, the disclosure is not limited thereto. In other words, at least one of the first and second transistors T1 and T2 included in the pixel circuit 144 may be changed to an N-type transistor.

Referring to FIGS. 1A to 4B, 5, and 6B, the first and second transistors T1 and T2 in accordance with an embodiment may be formed of N-type transistors. The configuration and operation of the pixel circuit 144 illustrated in FIG. 6B, other than a change in connection positions of some components due to a change in the type of transistor, are similar to those of the pixel circuit 144 of FIG. 6A. Therefore, detailed descriptions thereof will be omitted.

In an embodiment, the pixel circuit 144 illustrated in FIG. 6B may include first and second transistors T1 and T2 formed of N-type transistors, and a storage capacitor Cst. In case that the first and second transistors T1 and T2 are formed of N-type transistors, the emission part EMU may be electrically connected between the first driving power supply VDD and the pixel circuit 144 to stabilize the storage capacitor Cst configured to be charged with a voltage corresponding to a data signal supplied to the first node N1.

However, the disclosure is not limited thereto. In an embodiment, the emission part EMU illustrated in FIG. 6B may be electrically connected between the pixel circuit 144 and the second driving power supply VSS. In an embodiment, the configuration of the pixel circuit 144 is not limited to the embodiments illustrated in FIGS. 6A and 6B. For example, the pixel circuit 144 may be configured in the same manner as that of the embodiments illustrated in FIGS. 6C and 6D.

As illustrated in FIGS. 6C and 6D, the pixel circuit 144 may be electrically connected to a scan line Si and a data line Dj of the pixel PXL. For example, if the pixel PXL is disposed on an i-th row and a j-th column of the display area DA, the pixel circuit 144 of the pixel PXL may be electrically connected to an i-th scan line Si and a j-th data line Dj of the display area DA.

In an embodiment, the pixel circuit 144 may be further electrically connected to at least another scan line. For example, the pixel PXL disposed on the i-th row of the display area DA may be further electrically connected to an i−1-th scan line Si−1 and/or an i+1-th scan line Si+1. In an embodiment, the pixel circuit 144 may be electrically connected not only to the first and second driving power supplies VDD and VSS but also to a third power supply. For example, the pixel circuit 144 may also be electrically connected to an initialization power supply Vint.

The pixel circuit 144 may include first to seventh transistors T1 to T7, and a storage capacitor Cst.

A first electrode, e.g., a source electrode, of the first transistor T1 (or driving transistor) may be electrically connected to the first driving power supply VDD via the fifth transistor T5, and a second electrode thereof, e.g., a drain electrode may be electrically connected to first end of light emitting elements LD via the sixth transistor T6. A gate electrode of the first transistor T1 may be electrically connected to a first node N1. The first transistor T1 may control driving current flowing between the first driving power supply VDD and the second driving power supply VSS via the light emitting elements LD in response to the voltage of the first node N1.

The second transistor T2 (or switching transistor) may be electrically connected between the j-th data line Dj electrically connected to the pixel PXL and the source electrode of the first transistor T1. A gate electrode of the second transistor T2 may be electrically connected to the i-th scan line Si electrically connected to the pixel PXL. In case that a scan signal having a gate-on voltage (e.g., a low-level voltage) is supplied from the i-th scan line Si, the second transistor T2 may be turned on to electrically connect the j-th data line Dj to the source electrode of the first transistor T1. Hence, if the second transistor T2 is turned on, a data signal supplied from the j-th data line Dj may be transmitted to the first transistor T1.

The third transistor T3 may be electrically connected between the drain electrode of the first transistor T1 and the first node N1. A gate electrode of the third transistor T3 may be electrically connected to the i-th scan line Si. In case that a scan signal having a gate-on voltage is supplied from the i-th scan line Si, the third transistor T3 may be turned on to electrically connect the drain electrode of the first transistor T1 to the first node N1.

The fourth transistor T4 may be electrically connected between the first node N1 and an initialization power supply line IPL to which the initialization power supply Vint is to be applied. A gate electrode of the fourth transistor T4 may be electrically connected to a preceding scan line, e.g., the i−1-th scan line Si−1. In case that a scan signal having a gate-on voltage is supplied to the i−1-th scan line Si−1, the fourth transistor T4 may be turned on so that the voltage of the initialization power supply Vint may be transmitted to the first node N1. Here, the initialization power supply Vint may have a voltage equal to or less than the minimum voltage of the data signal.

The fifth transistor T5 may be electrically connected between the first driving power supply VDD and the first transistor T1. A gate electrode of the fifth transistor T5 may be electrically connected to a corresponding emission control line, e.g., an i-th emission control line Ei. The fifth transistor T5 may be turned off in case that an emission control signal having a gate-off voltage is supplied to the i-th emission control line Ei, and may be turned on in other cases.

The sixth transistor T6 may be electrically connected between the first transistor T1 and the first ends of the light emitting elements LD. A gate electrode of the sixth transistor T6 may be electrically connected to the i-th emission control line Ei. The sixth transistor T6 may be turned off in case that an emission control signal having a gate-off voltage is supplied to the i-th emission control line Ei, and may be turned on in other cases.

The seventh transistor T7 may be electrically connected between the initialization power supply Vint and a second node N2, which is electrically connected to the first ends of the light emitting elements LD. A gate electrode of the seventh transistor T7 may be electrically connected to any of scan lines of a subsequent stage, e.g., to the i+1-th scan line Si+1. In case that a scan signal having a gate-on voltage is supplied to the i+1-th scan line Si+1, the seventh transistor T7 may be turned on so that the voltage of the initialization power supply Vint may be supplied to the first ends of light emitting elements LD.

The storage capacitor Cst may be electrically connected between the first driving power supply VDD and the first node N1. The storage capacitor Cst may store a voltage corresponding both to the data signal applied to the first node N1 during each frame period and to the threshold voltage of the first transistor T1.

Although in FIGS. 6C and 6D illustrate the transistors, e.g., the first to seventh transistors T1 to T7, included in the pixel circuit 144 are illustrated as being formed of P-type transistors, the disclosure is not limited thereto. For example, at least one of the first to seventh transistors T1 to T7 may be changed to an N-type transistor.

In an embodiment, the configuration of the pixel circuit 144 is not limited to the embodiments illustrated in FIGS. 6A to 6D. For example, the pixel circuit 144 may be configured in the same manner as that of the embodiment shown in FIG. 6E.

As illustrated in FIG. 6E, the pixel circuit 144 may be further electrically connected to a control line CLi and a sensing line SENj. For example, the pixel circuit 144 of the pixel PXL disposed on the i-th row and the j-th column of the display area DA may be electrically connected to an i-th control line CLi and a j-th sensing line SENj of the display area DA. The pixel circuit 144 described above may further include a third transistor T3 as well as the first and second transistors T1 and T2 illustrated in FIGS. 6A and 6B.

The third transistor T3 is electrically connected between the second transistor T2 and the sensing line SENj. For example, a first electrode of the third transistor T3 may be electrically connected to a terminal (e.g., a source electrode) of the second transistor T2 electrically connected to the first electrode ELL and a second electrode of the third transistor T3 may be electrically connected to the sensing line SENj. In case that the sensing line SENj is omitted, a second electrode of the third transistor T3 may be electrically connected to the data line Dj.

In an embodiment, the gate electrode of the third transistor T3 is electrically connected to the control line CLi. In case that the control line CLi is omitted, the gate electrode of the third transistor T3 may be electrically connected to the scan line Si. The third transistor T3 may be turned on by a control signal, which has a gate-on voltage (e.g., a high-level voltage) and is supplied to the control line CLi during a predetermined sensing period, so that the sensing line SENj and the second transistor T2 may be electrically connected to each other.

In an embodiment, the sensing period may be a period in which characteristic information of each of the pixels PXL disposed in the display area DA (e.g., a threshold voltage, etc. of the second transistor T2) are extracted. During the above-mentioned sensing period, the second transistor T2 may be turned on by supplying a predetermined reference voltage capable of turning on the second transistor T2 to the first node N1 through the data line Dj and the first transistor T1, or electrically coupling each pixel PXL to a current source or the like. Furthermore, the second transistor T2 may be electrically connected to the sensing line SENj by turning on the third transistor T3 by supplying a control signal having a gate-on voltage to the third transistor T3. Hence, the characteristic information of each pixel PXL that includes the threshold voltage, etc. of the second transistor T2 may be extracted through the sensing line SENj. The extracted characteristic information may be used to convert image data to compensate for a deviation in characteristics between the pixels PXL.

Although FIG. 6E illustrates an embodiment where the first to third transistors T1 to T3 are N-type transistors, the disclosure is not limited thereto. For example, at least one of the first to third transistors T1 to T3 may be changed to a P-type transistor. Furthermore, although FIG. 6E illustrates an embodiment where the emission part EMU is electrically connected between the pixel circuit 144 and the second driving power supply VSS, the emission part EMU may be electrically connected between the first driving power supply VDD and the pixel circuit 144. A capacitor $C_{OLED}$ may be electrically connected between the second and third transistors T2 and T3 and the second driving power supply VSS.

Although FIGS. 6A to 6E illustrate embodiments in which light emitting elements LD of each emission part EMU are electrically connected in parallel to each other, the disclosure is not limited thereto. In an embodiment, the emission part EMU may include at least one serial stage including a plurality of light emitting elements LD electrically connected in parallel to each other. In other words, the emission part EMU may be formed of a serial-parallel combination structure. The foregoing configuration will be described below with reference to FIGS. 7A and 7B.

The structure of the pixel PXL which may be applied to the disclosure is not limited to the embodiments illustrated in FIGS. 6A to 6E, and the corresponding pixel PXL may have various structures. In an embodiment, each pixel PXL may be configured in a passive light emitting display device, or the like. In this case, the pixel circuit 144 may be omitted, and the opposite ends of the light emitting elements LD included in the emission part EMU may be directly electrically connected to the scan lines Si−1, Si, and Si+1, the data line Dj, the first power supply line PL1 to which the first driving power supply VDD is to be applied, the second power supply line PL2 to which the second driving power supply VSS is to be applied, and/or a control line.

Figure 7A:
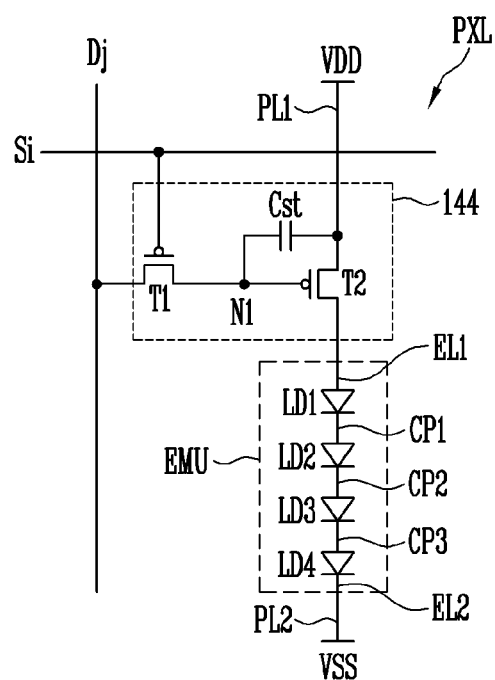
FIGS. 7A and 7B are circuit diagrams schematically illustrating various embodiments of electrical connection relationships of components included in any one pixel of the pixels illustrated in FIG. 5.
Figure 7B:
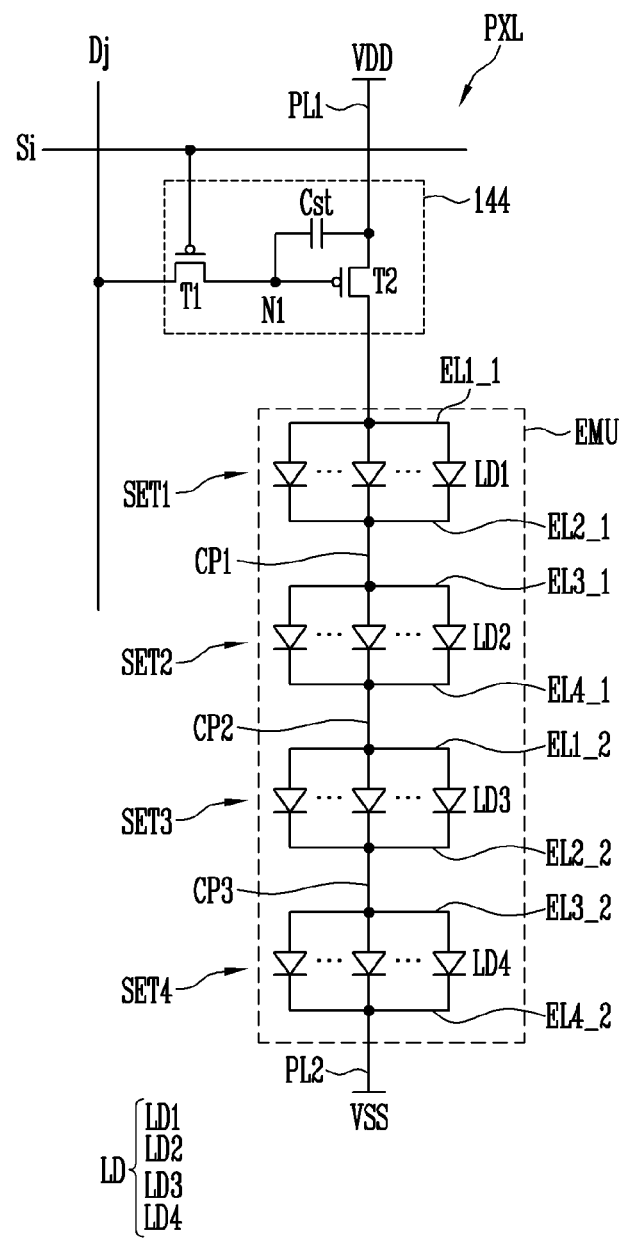

FIGS. 7A and 7B are circuit diagrams schematically illustrating various embodiments of electrical connection relationship of components included in a pixel illustrated in FIG. 5. As illustrated in FIGS. 7A and 7B, the emission part EMU of each pixel PXL may be configured to include serial stages which are successively electrically connected to each other. In the following descriptions of embodiments of FIGS. 7A and 7B, detailed explanations of components similar or equal to those of the embodiments of FIGS. 6A to 6E, e.g., detailed explanations of the pixel circuit 144, will be omitted to avoid repetitive descriptions.

First, referring to FIG. 7A, the emission part EMU may include light emitting elements electrically connected in series to each other. For example, the emission part EMU may include a first light emitting element LD1, a second light emitting element LD2, a third light emitting element LD3, and a fourth light emitting element LD4 which are electrically coupled in series in a forward direction between the first driving power supply VDD and the second driving power supply VSS and form a valid light source. In the following embodiment, the term "light emitting element LD" or "light emitting elements LD" will be used to arbitrarily designate at least one of the first to fourth light emitting elements LD1 to LD4 or collectively designate the first to fourth light emitting elements LD1 to LD4.

A first end (e.g., a second semiconductor layer) of the first light emitting element LD1 may be electrically connected to the first driving power supply VDD through the first electrode EL1, and a second end (e.g., a first semiconductor layer) of the first light emitting element LD1 may be electrically connected to a first end (e.g., a second semiconductor layer) of the second light emitting element LD2 through a first conductive pattern CP1 electrically connected between first and second serial stages. The first end of the second light emitting element LD2 may be electrically connected to the first conductive pattern CP1, and a second end thereof may be electrically connected to a first end of the third light emitting element LD3 through a second conductive pattern CP2 electrically connected between second and third serial stages. The first end of the third light emitting element LD3 may be electrically connected to the second conductive pattern CP2, and a second end thereof may be electrically connected to a first end of the fourth light emitting element LD4 through a third conductive pattern CP3 electrically connected between third and fourth serial stages. The first end of the fourth light emitting element LD4 may be electrically connected to the third conductive pattern CP3, and a second end thereof may be electrically connected to the second driving power supply VSS through the second electrode EL2.

As described above, the first to fourth light emitting elements LD1 to LD4 may be electrically connected in series between the first and second electrodes EL1 and EL2 of the emission part EMU.

In the case of the emission part EMU having a structure in which the light emitting elements LD are electrically connected in series to each other, a voltage to be applied between the first and second electrodes EL1 and EL2 may be increased, and the amount of driving current flowing through the emission part EMU may be reduced, compared to those of the emission part EMU having a structure in which the light emitting elements LD are electrically connected in parallel to each other. Therefore, in case that the emission part EMU of each pixel PXL has a serial structure, the power consumption of the display device may be reduced.

In an embodiment, at least one serial stage include a plurality of light emitting elements LD electrically connected in parallel to each other. In this case, the emission part EMU of each pixel PXL may have a serial-parallel combination structure. For example, the emission part EMU may be configured as shown in FIG. 7B.

Referring to FIG. 7B, the emission part EMU of each pixel PXL may include a plurality of serial stages which are successively electrically connected to each other between the first and second driving power supplies VDD and VSS. Each of the serial stages may include one or more light emitting elements LD which are electrically connected in the forward direction between two sub-electrodes of the corresponding serial stage.

The emission part EMU may include first to fourth serial stages SET1 to SET4 which are successively electrically connected between the first and second driving power supplies VDD and VSS.

The first serial stage SET1 may include at least one first light emitting element LD1 electrically connected between a 1-1-th sub-electrode EL1_1 and a 2-1-th sub-electrode EL2_1. For example, the first serial stage SET1 may include the 1-1-th sub-electrode EL1_1 electrically connected to the first driving power supply VDD via the pixel circuit 144, the 2-1-th sub-electrode EL2_1 electrically connected to the second driving power supply VSS, and first light emitting elements LD1 electrically connected between the 1-1-th sub-electrode EL1_1 and the 2-1-th sub-electrode EL2_1. A first end (e.g., a second semiconductor layer) of the first light emitting element LD1 may be electrically connected to the 1-1-th sub-electrode EL1_1 of the first serial stage SET1, and a second end (e.g., a first semiconductor layer) thereof may be electrically connected to the 2-1-th sub-electrode EL2_1 of the first serial stage SET1. The first light emitting elements LD1 may be electrically connected in parallel to each other between the 1-1-th and 2-1-th sub-electrodes EL1_1 and EL2_1 of the first serial stage SET1 and be electrically connected in an identical direction (e.g., in the forward direction) between the first and second driving power supplies VDD and VSS through the 1-1-th and 2-1-th sub-electrodes EL1_1 and EL2_1.

The second serial stage SET2 may include at least one second light emitting element LD2 electrically connected between a 3-1-th sub-electrode EL3_1 and a 4-1-th sub-electrode EL4_1. For example, the second serial stage SET2 may include the 3-1-th sub-electrode EL3_1 electrically connected to the first driving power supply VDD via the pixel circuit 144 and the first serial stage SET1, the 4-1-th sub-electrode EL4_1 electrically connected to the second driving power supply VSS, and a plurality of second light emitting elements LD2 electrically connected between the 3-1-th sub-electrode EL3_1 and the 4-1-th sub-electrode EL4_1. A first end of each second light emitting element LD2 is electrically connected to the 3-1-th sub-electrode EL3_1 of the second serial stage SET2, and a second end thereof is electrically connected to the 4-1-th sub-electrode EL4_1 of the second serial stage SET2. The second light emitting elements LD2 may be electrically connected in parallel between the 3-1-th and 4-1-th sub-electrodes EL3_1 and EL4_1 of the second serial stage SET2 and be electrically connected in an identical direction (e.g., in the forward direction) between the first and second driving power supplies VDD and VSS through the 3-1-th and 4-1-th sub-electrodes EL3_1 and EL4_1.

The third serial stage SET3 may include at least one third light emitting element LD3 electrically connected between a 1-2-th sub-electrode EL1_2 and a 2-2-th sub-electrode EL2_2. For example, the third serial stage SET3 may include the 1-2-th sub-electrode EL1_2 electrically connected to the first driving power supply VDD via the pixel circuit 144 and the previous serial stages, e.g., the first and second serial stages SET1 and SET2, the 2-2-th sub-electrode EL2_2 electrically connected to the second driving power supply VSS, and third light emitting elements LD3 electrically connected between the 1-2-th sub-electrode EL1_2 and the 2-2-th sub-electrode EL2_2. A first end of each third light emitting element LD3 is electrically connected to the 1-2-th sub-electrode EL1_2 of the third serial stage SET3, and the second end thereof is electrically connected to the 2-2-th sub-electrode EL2_2 of the third serial stage SET3. The third light emitting elements LD3 may be electrically connected in parallel between the 1-2-th and 2-2-th sub-electrodes EL1_2 and EL2_2 of the third serial stage SET3 and electrically connected in an identical direction (e.g., in the forward direction) between the first and second driving power supplies VDD and VSS through the 1-2-th and 2-2-th sub-electrodes EL1_2 and EL2_2.

The fourth serial stage SET4 may include at least one fourth light emitting element LD4 electrically connected between a 3-2-th sub-electrode EL3_2 and a 4-2-th sub-electrode EL4_2. For example, the fourth serial stage SET4 may include the 3-2-th sub-electrode EL3_2 electrically connected to the first driving power supply VDD via the pixel circuit 144 and the previous serial stages, e.g., the first to third serial stages SET1 to SET3, the 4-2-th sub-electrode EL4_2 electrically connected to the second driving power supply VSS, and fourth light emitting elements LD4 electrically connected between the 3-2-th sub-electrode EL3_2 and the 4-2-th sub-electrode EL4_2. A first end of each fourth light emitting element LD4 is electrically connected to the 3-2-th sub-electrode EL3_2 of the fourth serial stage SET4, and a second end thereof is electrically connected to the 4-2-th sub-electrode EL4_2 of the fourth serial stage SET4. The fourth light emitting elements LD4 may be electrically connected in parallel between the 3-2-th and 4-2-th sub-electrodes EL3_2 and EL4_2 of the fourth serial stage SET4 and electrically connected in an identical direction (e.g., in the forward direction) between the first and second driving power supplies VDD and VSS through the 3-2-th and 4-2-th sub-electrodes EL3_2 and EL4_2.

In the foregoing embodiment, the 1-1-th sub-electrode EL1_1 of the first serial stage SET1 may be an anode electrode of the emission part EMU of each pixel PXL. The 4-2-th sub electrode EL4_2 of the fourth serial stage SET4 may be a cathode electrode of the emission part EMU.

Furthermore, the emission part EMU may include conductive patterns configured to electrically connect successive serial stages of the first to fourth serial stages SET1 to SET4. For example, the emission part EMU may include a first conductive pattern CP1 disposed between the first serial stage SET1 and the second serial stage SET2, a second conductive pattern CP2 disposed between the second serial stage SET2 and the third serial stage SET3, and a third conductive pattern CP3 disposed between the third serial stage SET3 and the fourth serial stage SET4.

The first serial stage SET1 and the second serial stage SET2 may be electrically connected to each other through the first conductive pattern CP1. For example, the 2-1-th sub-electrode EL2_1 of the first serial stage SET1 may be electrically connected to the first conductive pattern CP1, and the 3-1-th sub-electrode EL3_1 of the second serial stage SET2 may be electrically connected to the first conductive pattern CP1. The second serial stage SET2 and the third serial stage SET3 may be electrically connected to each other through the second conductive pattern CP2. For example, the 4-1-th sub-electrode EL4_1 of the second serial stage SET2 may be electrically connected to the second conductive pattern CP2, and the 1-2-th sub-electrode EL1_2 of the third serial stage SET3 may be electrically connected to the second conductive pattern CP2. The third serial stage SET3 and the fourth serial stage SET4 may be electrically connected to each other through the third conductive pattern CP3. For example, the 2-2-th sub-electrode EL2_2 of the third serial stage SET3 may be electrically connected to the third conductive pattern CP3, and the 3-2-th sub-electrode EL3_2 of the fourth serial stage SET4 may be electrically connected to the third conductive pattern CP3.

As described above, in the case of the emission part EMU including the light emitting elements LD electrically connected to each other in a serial-parallel combination structure, driving current/voltage conditions may be easily adjusted according to specifications of a product to which the emission part EMU is applied.

Particularly, in the emission part EMU of each pixel PXL including the light emitting elements LD electrically connected to each other in a serial-parallel combination structure, the driving current thereof may be reduced, compared to that of the emission part EMU including the light emitting elements LD connected in parallel to each other. Furthermore, in the emission part EMU of each pixel PXL including the light emitting elements LD electrically connected to each other in the serial-parallel combination structure, driving voltages to be applied to the opposite ends of the emission part EMU may be reduced, compared to that of the emission part EMU including the light emitting elements LD electrically connected only in series to each other. In case that the light emitting elements LD are electrically connected only in series, if at least one of the light emitting elements LD electrically connected in series to each other is not completely connected in the forward direction, a path along which the driving current is able to flow in the pixel PXL is blocked, whereby a dark spot defect may occur. On the other hand, in case that the light emitting elements LD are electrically connected to each other in the serial-parallel mixed structure, even if some light emitting elements LD in each serial stage are not correctly electrically connected in the forward direction or defects occur in some light emitting elements LD, the driving current may flow through the other light emitting elements LD of the corresponding serial stage. Therefore, defects in the pixel PXL may be prevented or reduced.

In the foregoing embodiment, the pixel PXL including the emission part EMU having a four-stage serial-parallel combination structure has been described for illustrative purposes, but the disclosure is not limited thereto. For example, in an embodiment, the pixel PXL may include an emission part EMU having a six-stage serial-parallel combination structure or include an emission part EMU having an eight-stage serial-parallel combination structure.

Figure 8:
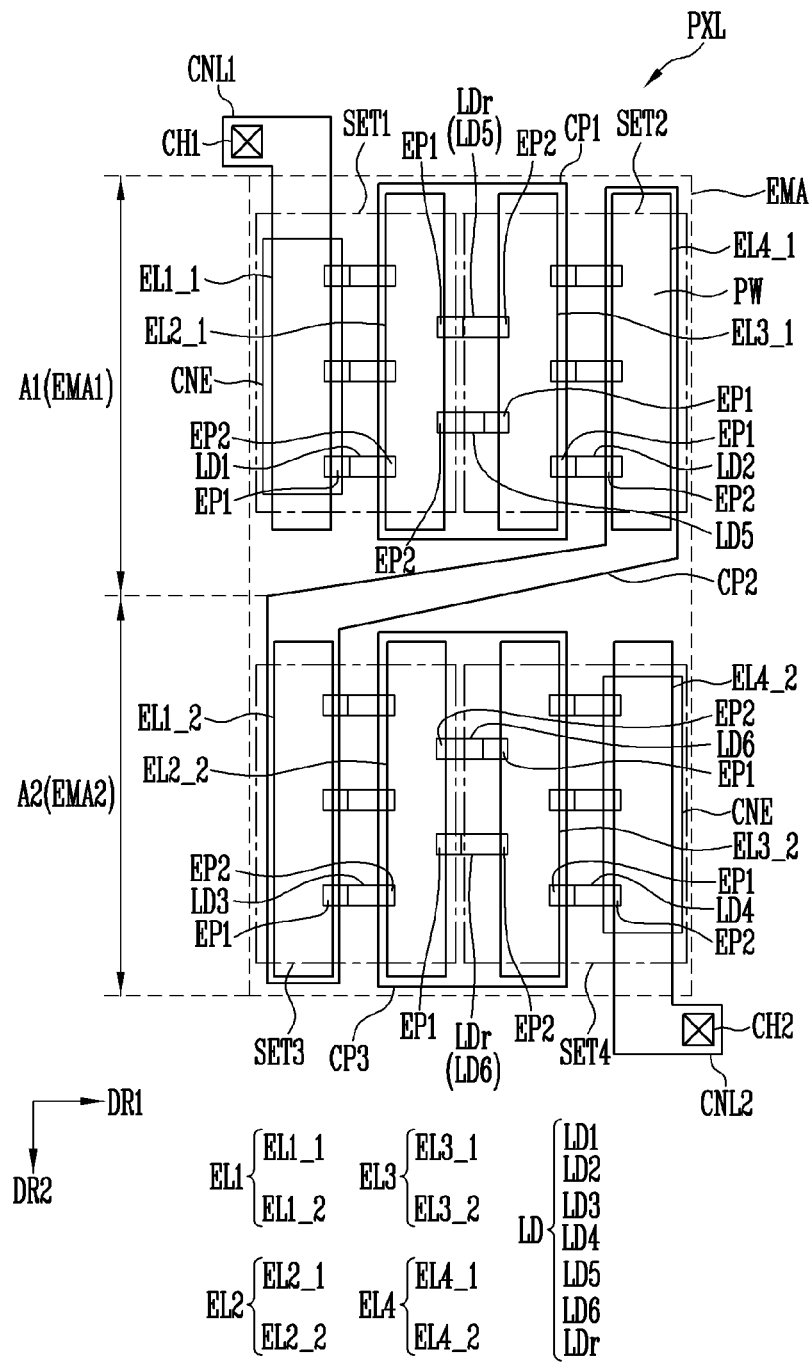
FIGS. 8 and 9 are plan views schematically illustrating one of the pixels illustrated in FIG. 5.
Figure 9:
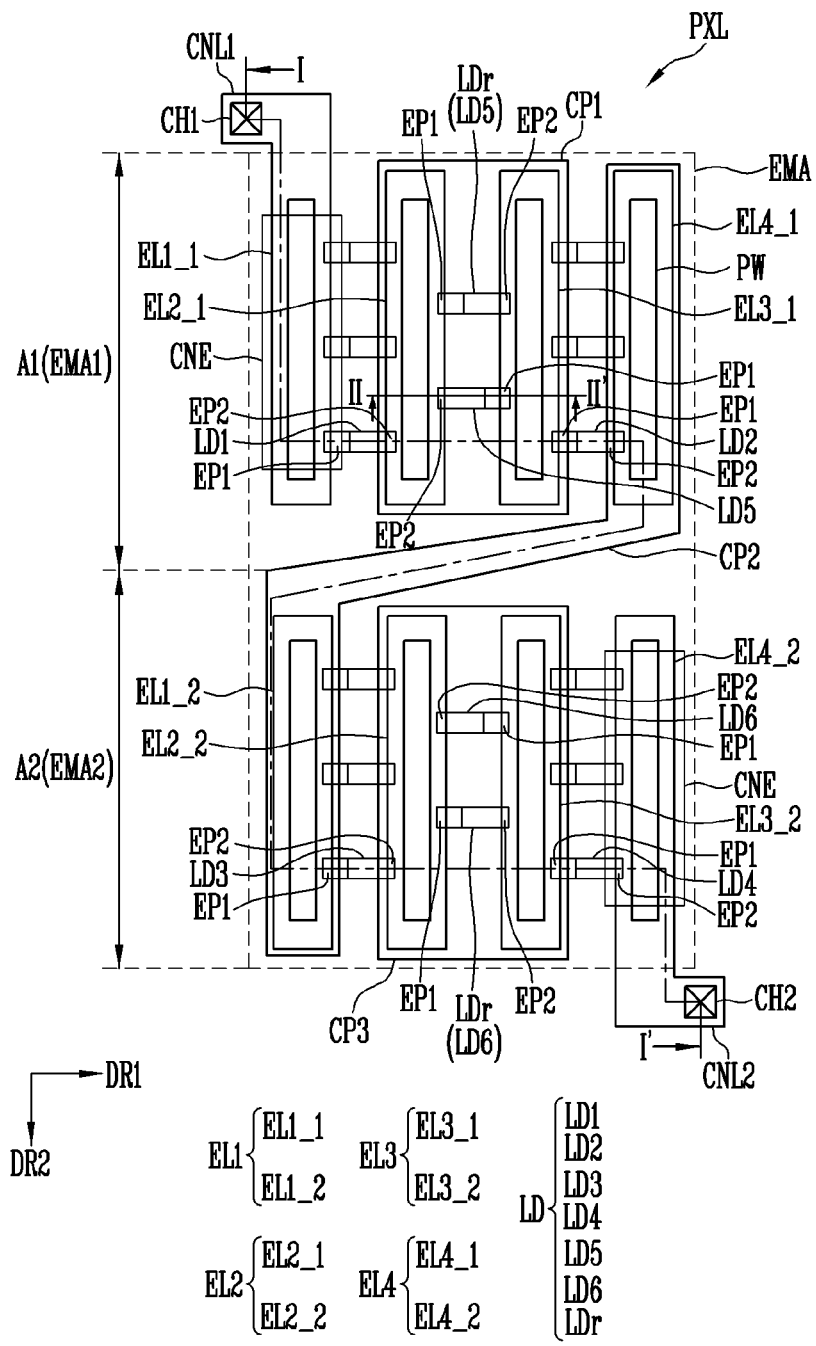
Figure 10:
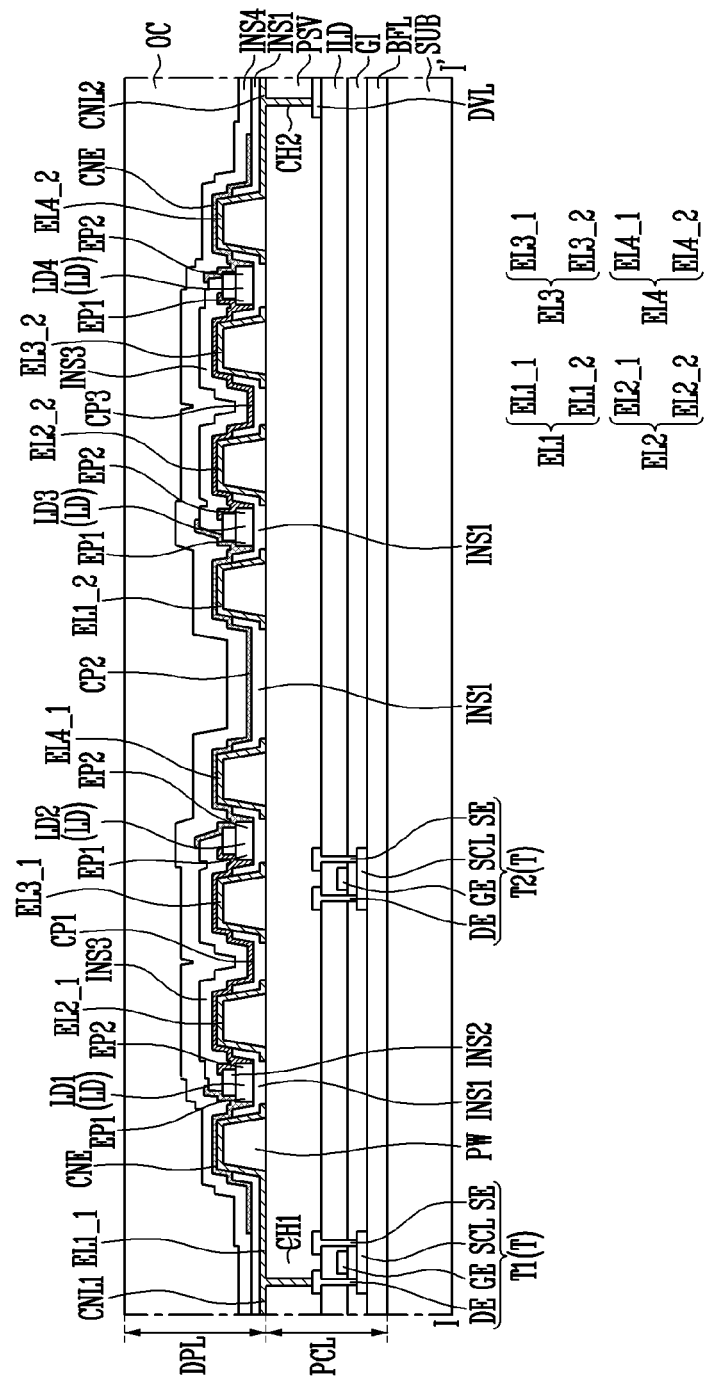
FIG. 10 is a schematic cross-sectional view taken along line IT of FIG. 9.
Figure 11:
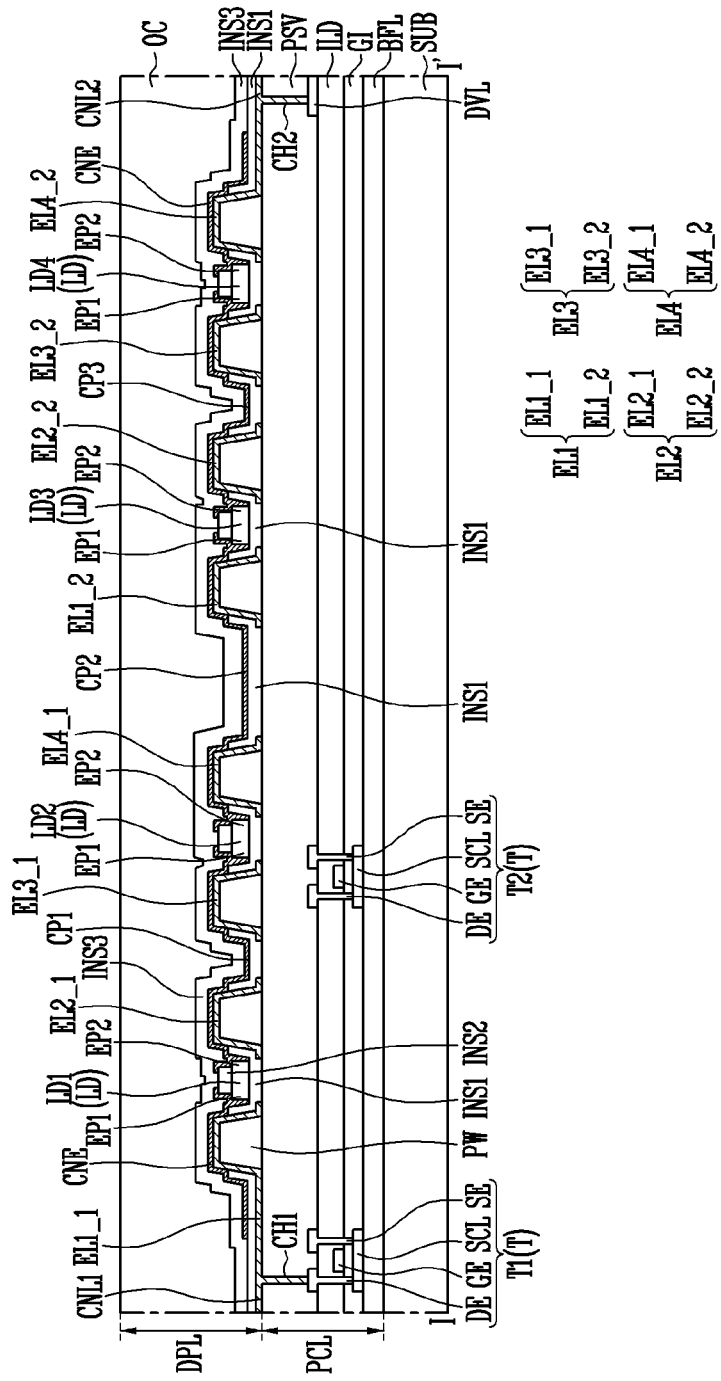
FIG. 11 schematically illustrates an embodiment in which the first to third conductive patterns shown in FIG. 10 are disposed on an identical layer, and is a cross-sectional view corresponding to line IT of FIG. 9.
Figure 12:
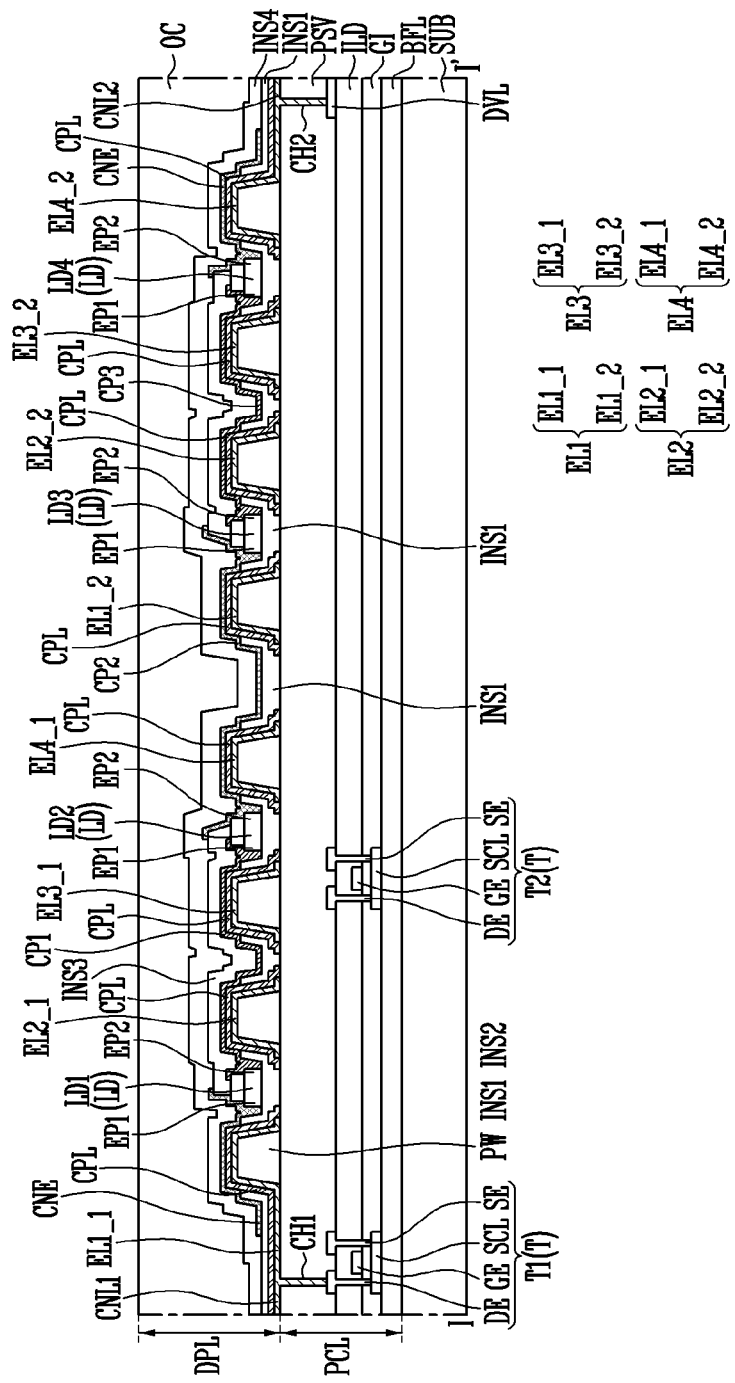
FIG. 12 schematic illustrates an embodiment in which capping layers are respectively disposed on first to fourth electrodes shown in FIG. 10, and is a cross-sectional view corresponding to line IT of FIG. 9.
Figure 13:
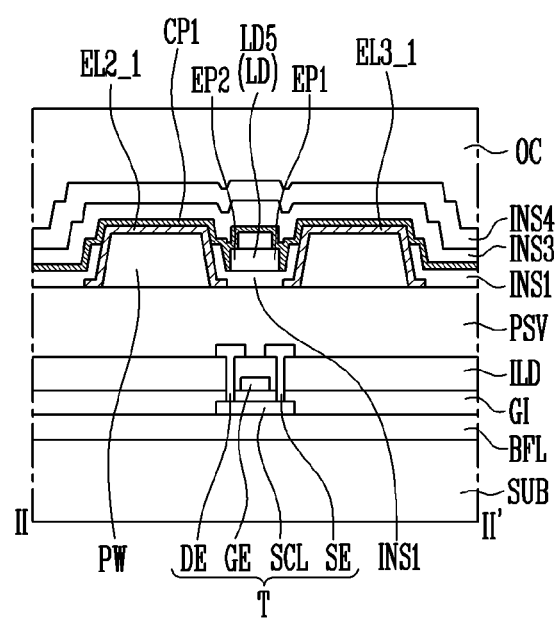
FIG. 13 is a schematic cross-sectional view taken along line II-IF of FIG. 9.
Figure 14:
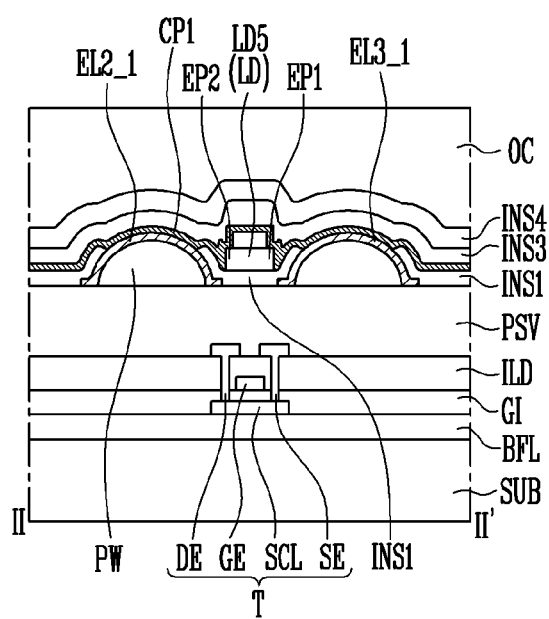
FIG. 14 schematically illustrates another shape of a first bank illustrated in FIG. 13, and is a cross-sectional view taken along line II-If of FIG. 9.
Figure 15A:
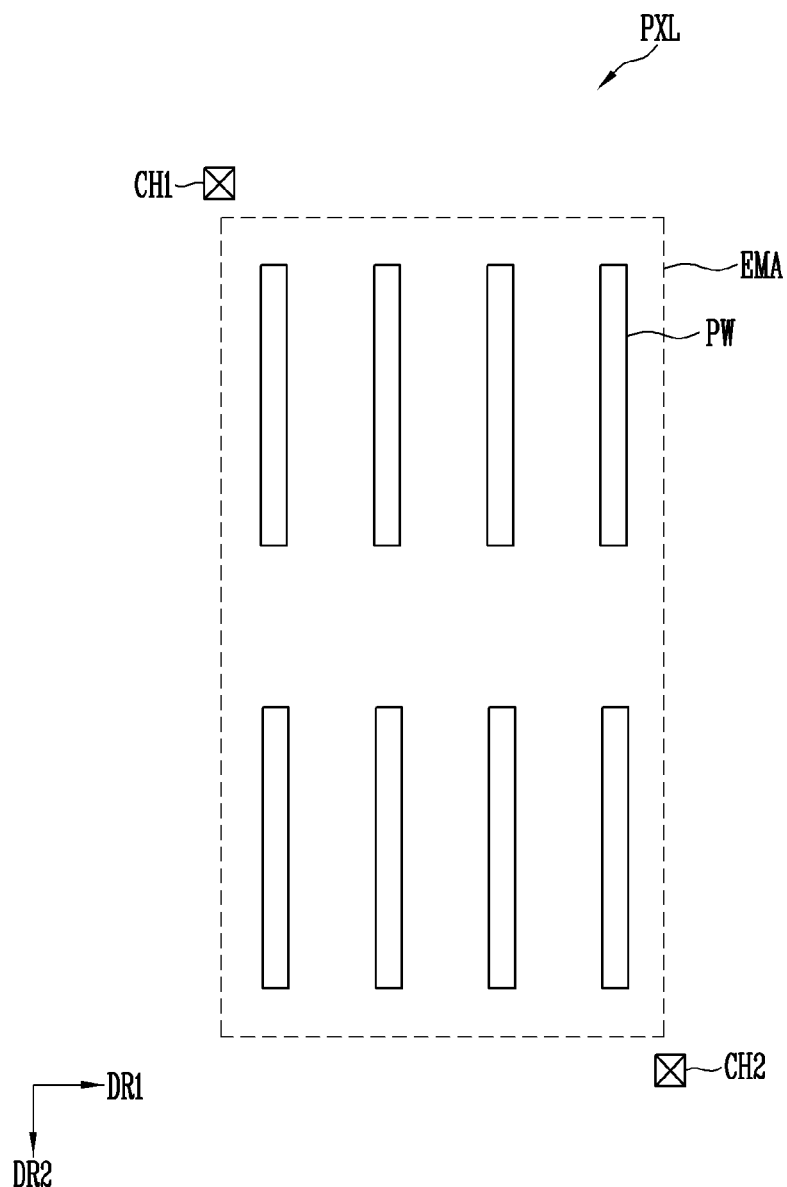
FIGS. 15A to 15F are schematic plan views sequentially illustrating a method of fabricating a pixel illustrated in FIG. 9.
Figure 15B:
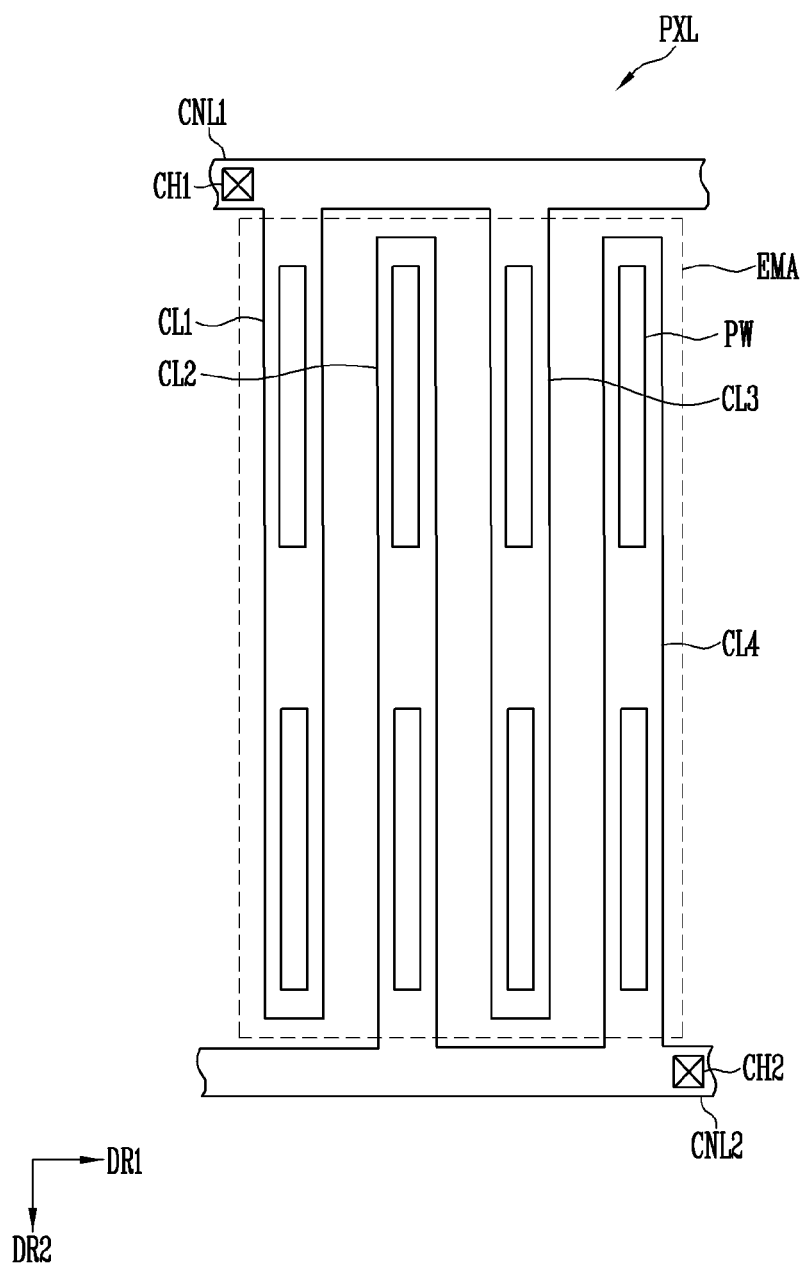
Figure 15C:
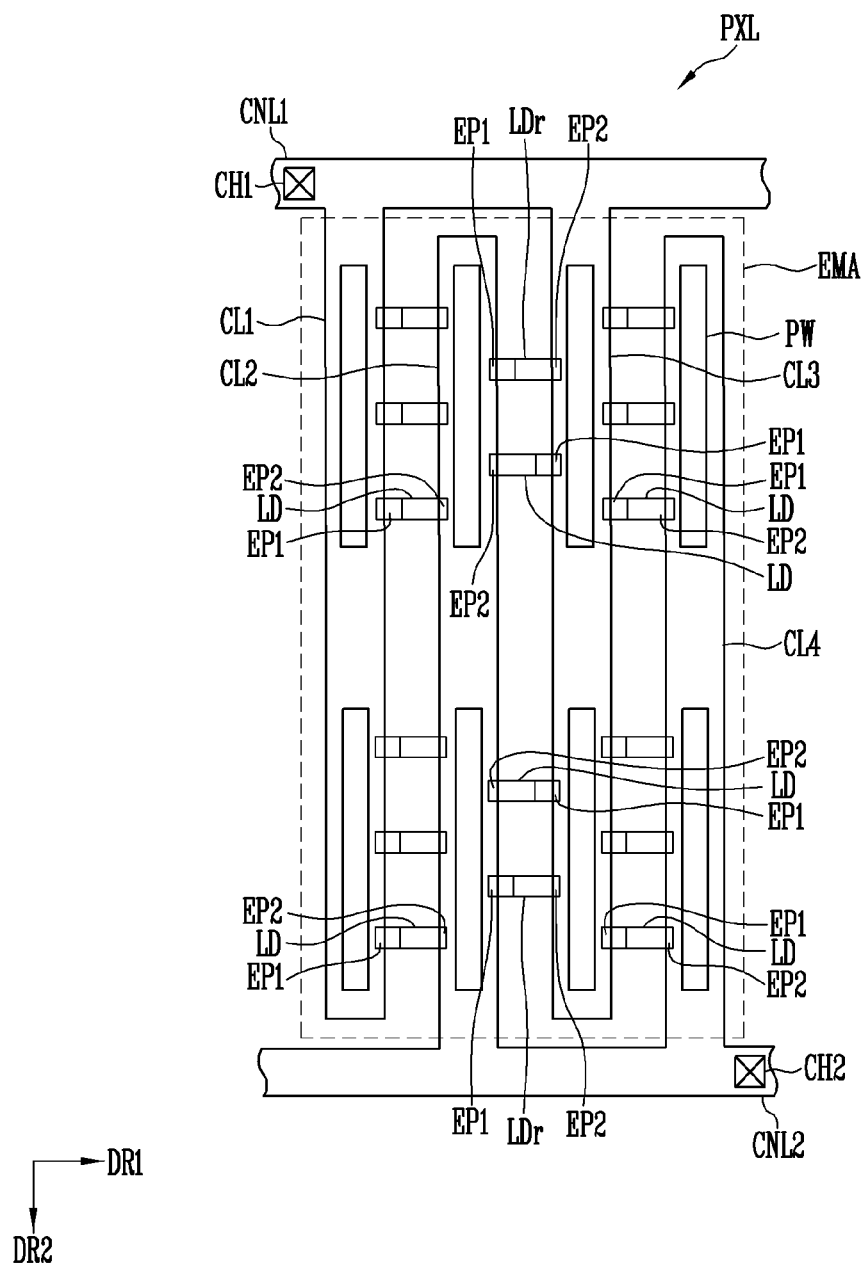
Figure 15D:
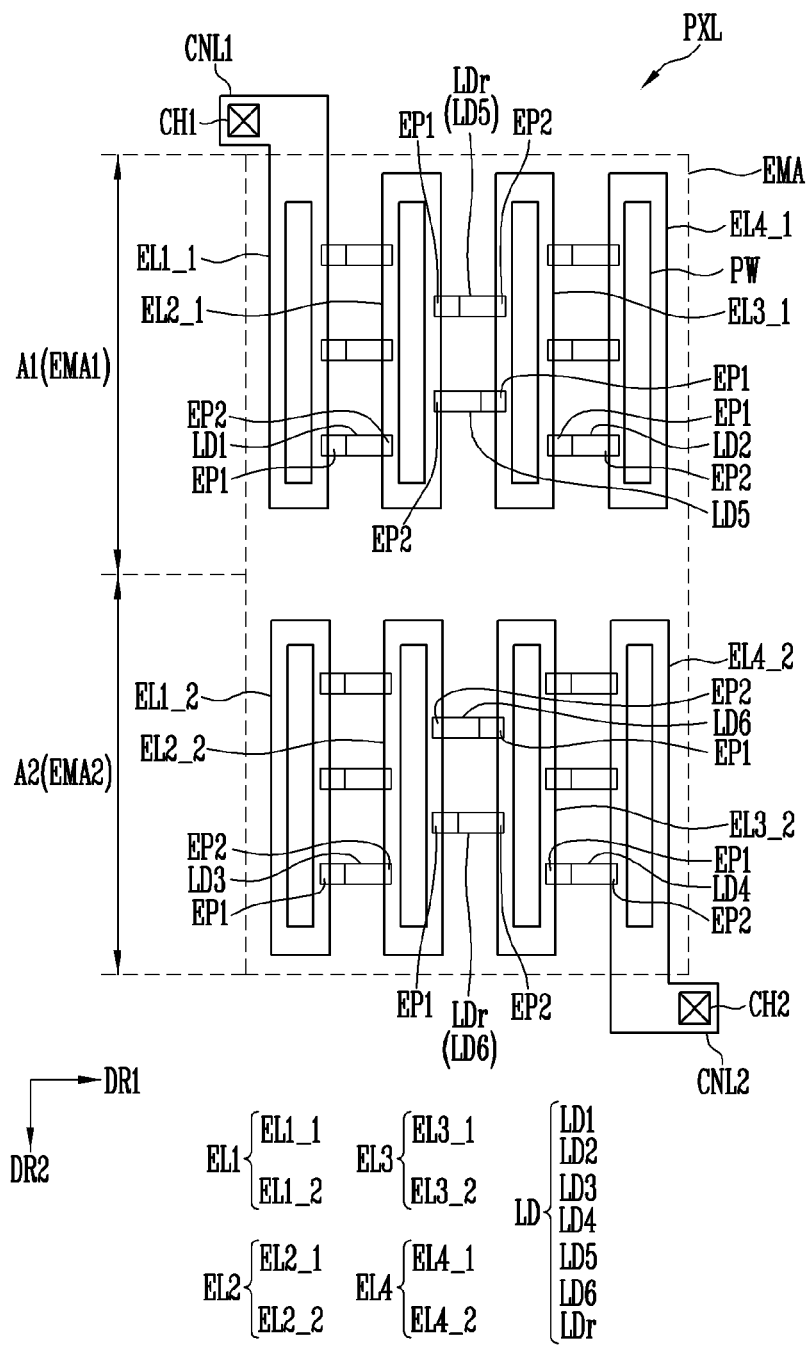
Figure 15E:
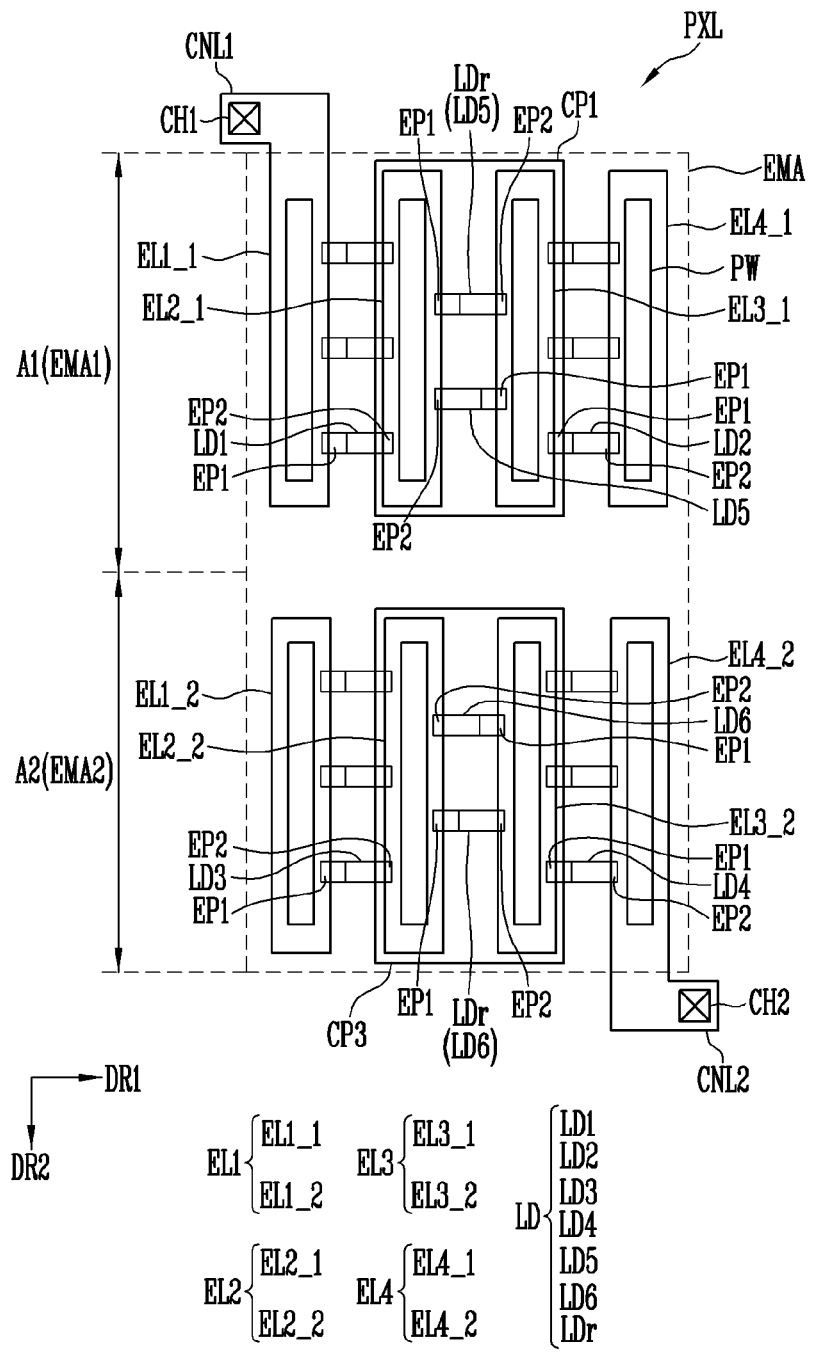
Figure 15F:
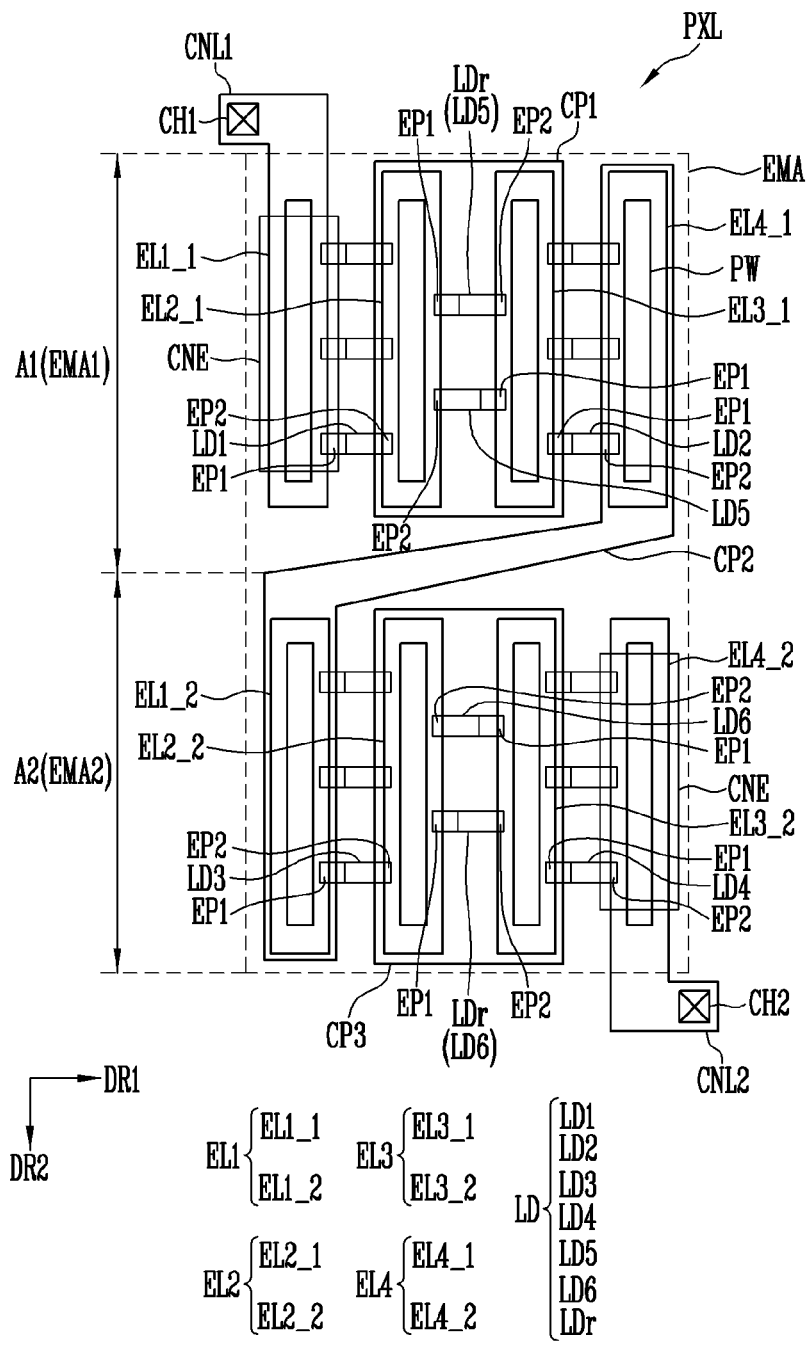
Figure 16A:
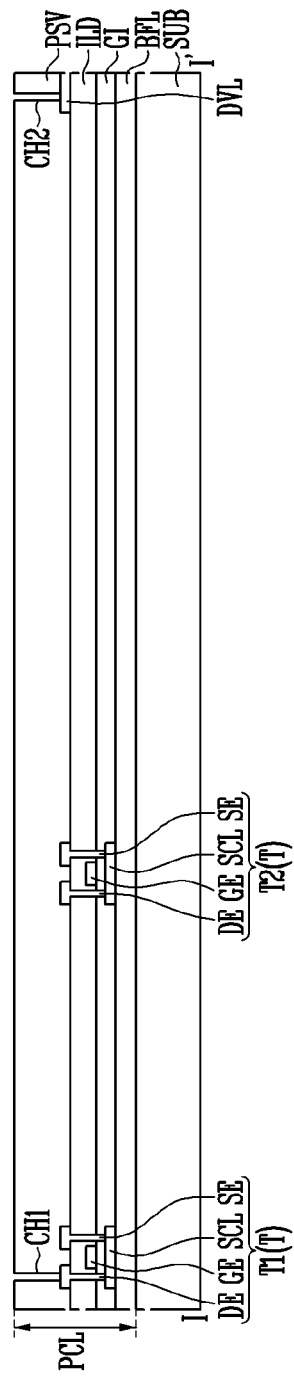
Figure 16C:
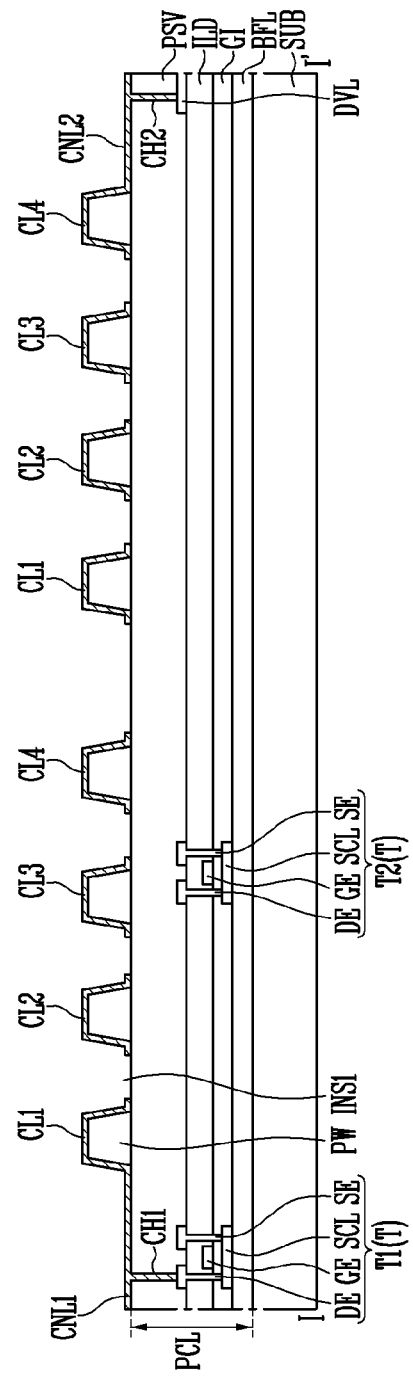
Figure 16D:
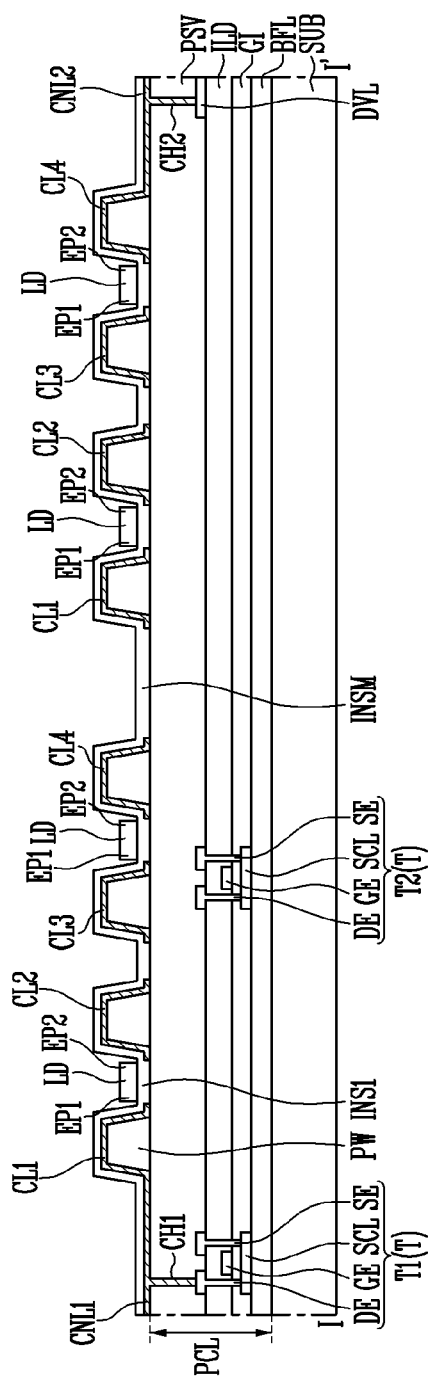
Figure 16F:
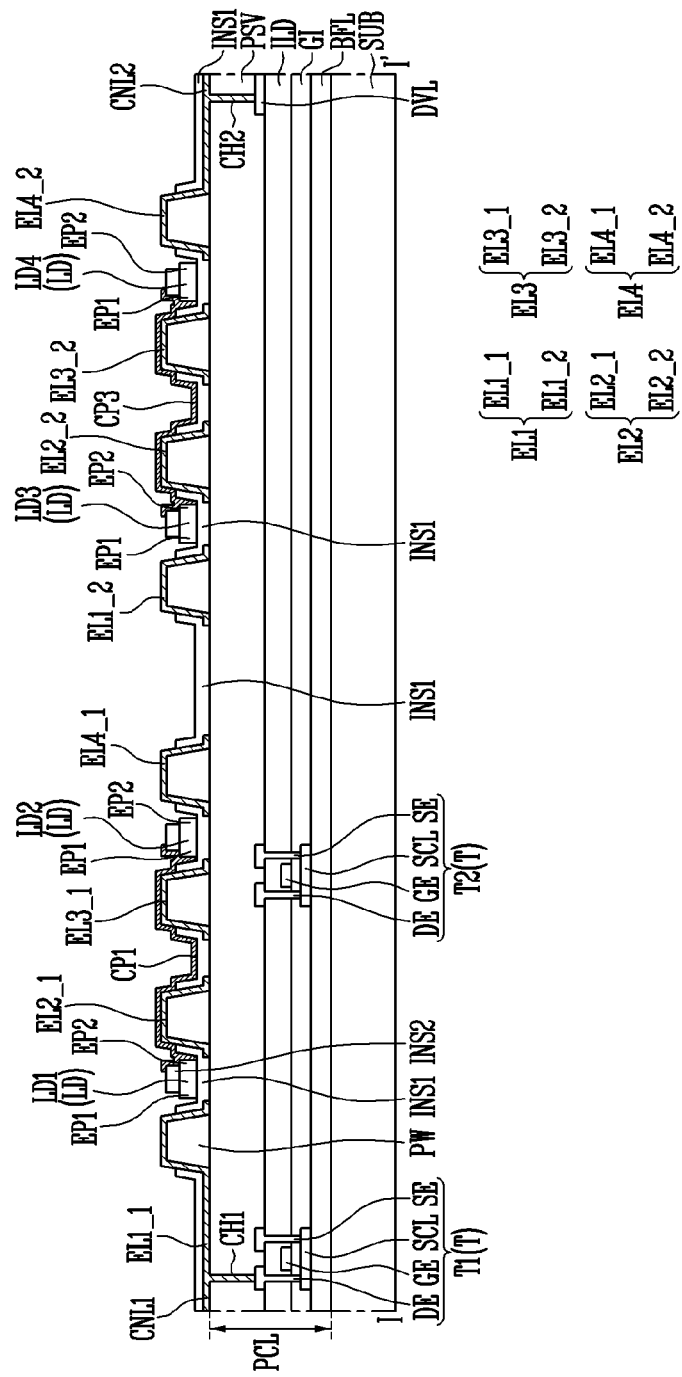
Figure 16G:
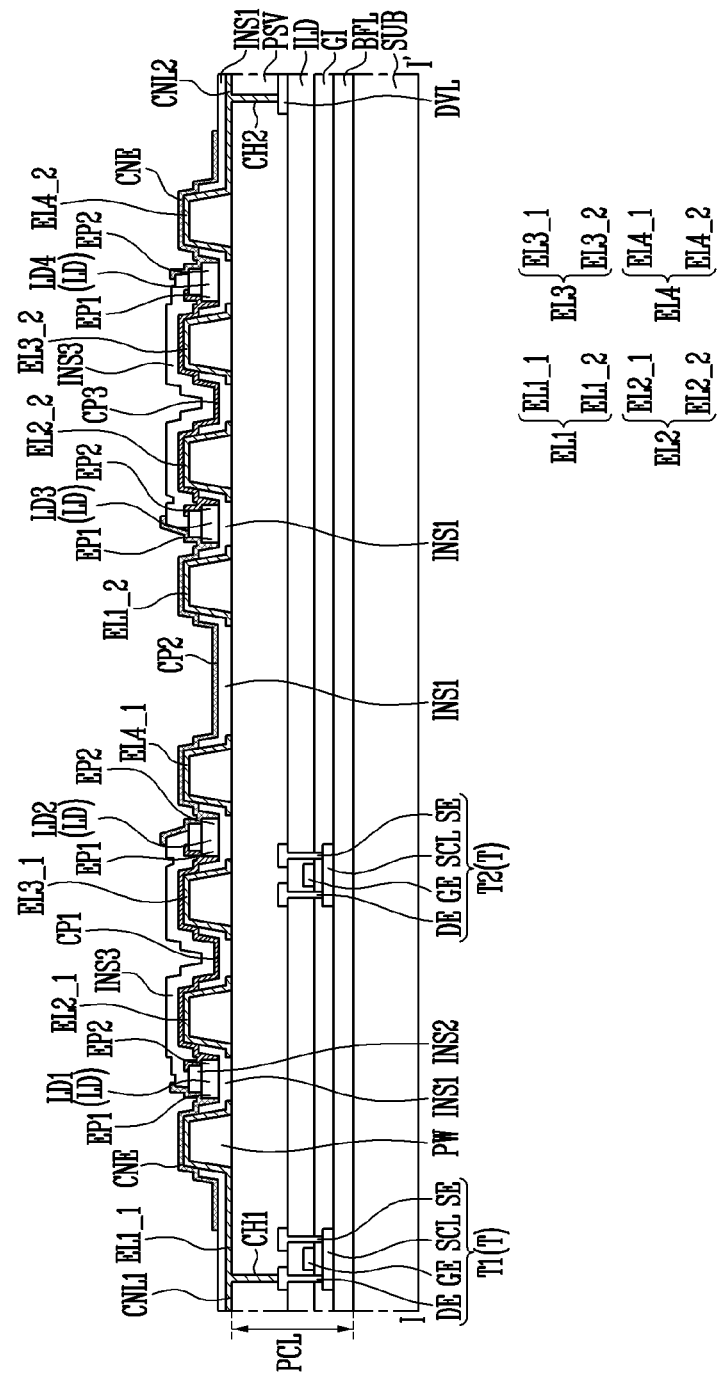
Figure 16H:
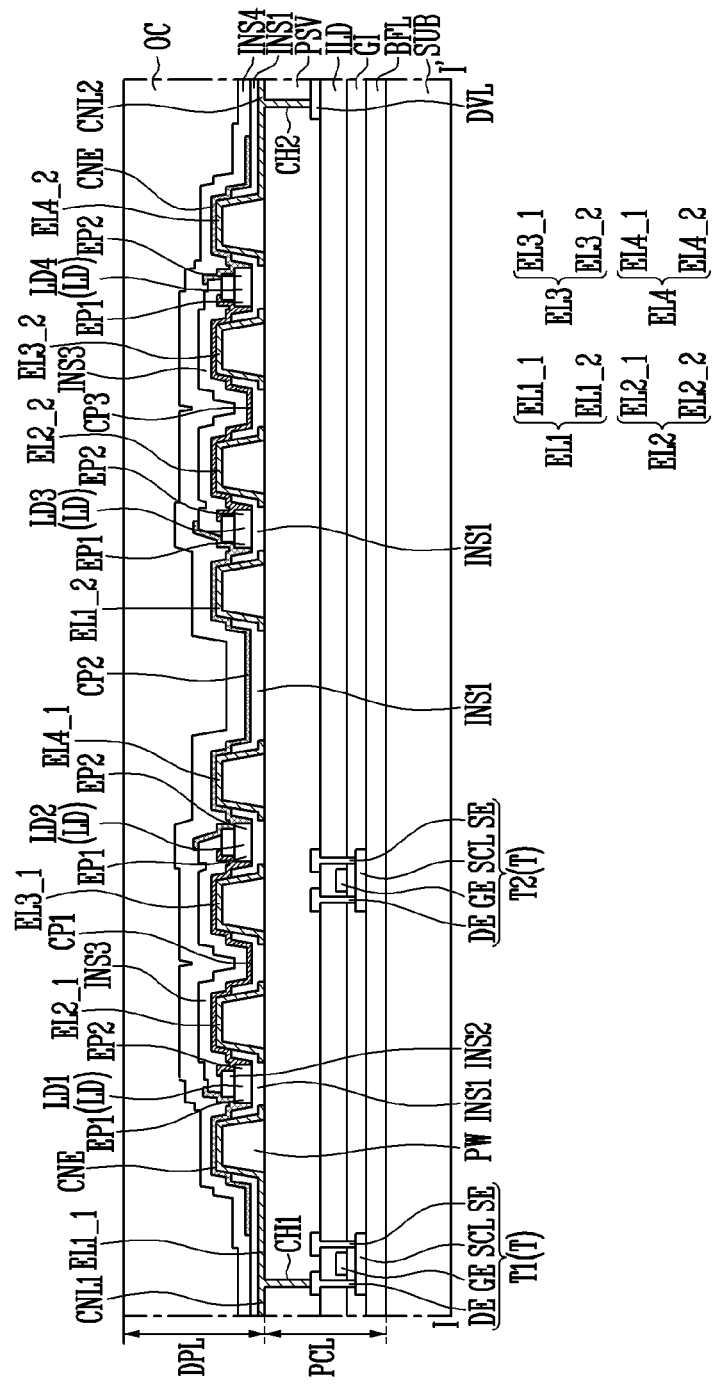

FIGS. 8 and 9 are plan views schematically illustrating a pixel illustrated in FIG. 5. FIG. 10 is a schematic cross-sectional view taken along line IT of FIG. 9. FIG. 11 illustrates an embodiment in which the first to third conductive patterns shown in FIG. 10 are disposed on an identical layer, and is a schematic cross-sectional view corresponding to line IT of FIG. 9. FIG. 12 illustrates an embodiment in which capping layers are respectively disposed on first to fourth electrodes shown in FIG. 10, and is a schematic cross-sectional view corresponding to line IT of FIG. 9. FIG. 13 is a schematic cross-sectional view taken along line II-IF of FIG. 9. FIG. 14 illustrates another shape of a first bank illustrated in FIG. 13, and is a schematic cross-sectional view taken along line of FIG. 9.

The pixel illustrated in FIGS. 8 and 9 may be any of the pixels shown in FIGS. 6A to 6E, 7A, and 7B. For example, the pixel illustrated in FIGS. 8 and 9 may be the pixel illustrated in FIG. 7B.

In FIGS. 8 and 9, for the sake of explanation, illustration of transistors schematic connected to light emitting elements, and signal lines schematic connected to the transistors is omitted.

Although FIGS. 8 to 14 simply illustrate the structure of a pixel PXL, e.g., illustrating that each electrode is formed of a single electrode layer and each insulating layer is formed of a single insulating layer, the disclosure is not limited thereto.

In an embodiment, the words "components are provided and/or formed on a same layer" may mean that the components are formed by an identical process.

Referring to FIGS. 1A to 4B, 5, 7B, and 8, the display device in accordance with an embodiment may include a substrate SUB, a line component, and at least one pixel PXL.

The pixel PXL may be provided on the substrate SUB, and include an emission area EMA which is partitioned (or defined) by a pixel defining layer (or a bank, not shown) and configured to emit light, and a peripheral area which encloses a periphery of the emission area EMA. In an embodiment of the present disclosure, the emission area EMA may refer to an area from which light is emitted, and the peripheral area may refer to an area from which light is not emitted. A pixel area of the pixel PXL may include an emission area EMA of the corresponding pixel PXL, and a peripheral area formed therearound.

Referring to FIG. 10, the substrate SUB, a pixel circuit layer PCL including a pixel circuit 144, and a display element layer DPL including light emitting elements LD may be provided and/or formed in the pixel area of the pixel PXL.

The substrate SUB may include a transparent insulating material and allow light to pass therethrough. The substrate SUB may be a rigid substrate or a flexible substrate.

A material applied to the substrate SUB may have resistance (thermal resistance) to high treatment temperatures during a process of fabricating the display device.

The pixel circuit layer PCL of each of the pixels PXL may include a buffer layer BFL disposed on the substrate SUB, a pixel circuit 144 including at least one transistor T disposed on the buffer layer BFL, and a driving voltage line DVL. Furthermore, the pixel circuit layer PCL of the pixel PXL may further include a passivation layer PSV.

The buffer layer BFL may prevent impurities from diffusing into the transistor T. The buffer layer BFL may be provided as a single-layer structure or a multi-layer structure having at least two or more layers. In case that the buffer layer BFL has a multi-layer structure, the respective layers may be formed of an identical material or different materials. The buffer layer BFL may be omitted depending on the material of the substrate SUB and/or processing conditions.

The transistor T may include a first transistor T1 and a second transistor T2. In an embodiment, the first transistor T1 may be a driving transistor electrically connected to light emitting elements LD of a corresponding pixel PXL and configured to drive the light emitting elements LD. The second transistor T2 may be a switching transistor configured to switch the first transistor T1.

Each of the driving transistor T1 and the switching transistor T2 may include a transistor semiconductor layer SCL, a gate electrode GE, a first terminal SE, and a second terminal DE. The first terminal SE may be either a source electrode or a drain electrode, and the second terminal DE may be the other electrode. For example, in case that the first terminal SE is a source electrode, the second terminal DE may be a drain electrode.

The transistor semiconductor layer SCL may be disposed on the buffer layer BFL. The transistor semiconductor layer SCL may include a first area which contacts the first terminal SE, and a second area which contacts the second terminal DE. An area between the first area and the second area may be a channel area.

The transistor semiconductor layer SCL may be a semiconductor pattern formed of polysilicon, amorphous silicon, an oxide semiconductor, etc. The channel area may be an intrinsic semiconductor, which is an undoped semiconductor pattern. The first area and the second area each may be a semiconductor pattern doped with impurities.

The gate electrode GE may be provided on the transistor semiconductor layer SCL with the gate insulating layer GI interposed therebetween.

The first terminal SE and the second terminal DE may respectively contact the first area and the second area of the transistor semiconductor layer SCL through corresponding contact holes that pass through an interlayer insulating layer ILD and the gate insulating layer GI.

Although in the foregoing embodiment there has been described that the first and second terminals SE and DE of each of the first transistor T1 and the second transistor T2 are separate electrodes electrically connected with the transistor semiconductor layer SCL, the disclosure is not limited thereto. In an embodiment, the first terminal SE of each of the first transistor T1 and the second transistor T2 may be one of the first and second areas adjacent to the channel area of each transistor semiconductor layer SCL. The second terminal DE of each of the first transistor T1 and the second transistor T2 may be the other of the first and second areas adjacent to the channel area of each transistor semiconductor layer SCL. In this case, the second terminal DE of the first transistor T1 may be electrically connected to the emission part EMU of each pixel PXL through a bridge electrode, a contact electrode, or the like.

In an embodiment, at least one transistor T included in the pixel circuit layer PCL of each of the pixels PXL may be formed of a low-temperature polycrystalline silicon (LTPS) thin-film transistor, but the disclosure is not limited thereto. In some embodiments, the at least one transistor T may be formed of an oxide semiconductor thin-film transistor. Furthermore, in an embodiment, there has been illustrated the case where the transistor T is a thin-film transistor having a top gate structure, but the disclosure is not limited thereto. In an embodiment, the transistor T may be a thin-film transistor having a bottom gate structure.

The driving voltage line DVL may be provided and/or formed on the interlayer insulating layer ILD, but the disclosure is not limited thereto. In some embodiments, the driving voltage line DVL may be provided on one of the insulating layers included in the pixel circuit layer PCL. A voltage of the second driving power supply VSS may be applied to the driving voltage line DVL. In an embodiment, the driving voltage line DVL may be the second power supply line PL2 to which the second driving power supply VSS is applied, in the pixel PXL illustrated in FIG. 7B.

The passivation layer PSV may be provided and/or formed on the transistor T and the driving voltage line DVL. The passivation layer PSV may be provided and/or formed on the transistor T and the driving voltage line DVL and cover (or overlap) the transistor T and the driving voltage line DVL. The passivation layer PSV may be provided in the form of an organic insulating layer, an inorganic insulating layer, or a structure including the organic insulating layer disposed on the inorganic insulating layer. The inorganic insulating layer may include at least one of silicon oxide ($SiO_x$) and silicon nitride ($SiN_x$). The organic insulating layer may include an organic insulating material allowing light to pass therethrough. The organic insulating layer may include, for example, at least one of polyacrylates resin, epoxy resin, phenolic resin, polyamides resin, polyimides rein, unsaturated polyesters resin, polyphenylen ethers resin, polyphenylene sulfides resin, and benzocyclobutene resin.

Next, the display element layer DPL included in the pixel PXL will be described. In an embodiment, some components of the display element layer DPL of the pixel PXL may be disposed in the peripheral area of the corresponding pixel PXL, and the other components may be disposed in the emission area EMA of the corresponding pixel PXL.

The display element layer DPL may include a first bank PW, first and second connection lines CNL1 and CNL2, first to fourth electrodes EL1, EL2, EL3, and EL4, a contact electrode CNE, first to third conductive patterns CP1, CP2, and CP3, and light emitting elements LD.

In an embodiment, at least one first bank PW may be disposed in the emission area EMA of the pixel PXL.

The first bank PW may be provided and/or formed between the passivation layer PSV and the first to fourth electrodes EL1 to EL4 in the emission area EMA of the pixel PXL. The first bank PW may be formed of an inorganic insulating layer including an inorganic material, or an organic insulating layer including an organic material. In an embodiment, the first bank PW may include an organic insulating layer having a single-layer structure and/or an inorganic insulating layer having a single-layer structure, but the disclosure is not limited thereto. In an embodiment, the first bank PW may have a multi-layer structure formed by stacking at least one organic insulating layer and at least one inorganic insulating layer.

The first bank PW may be a support which supports each of the first to fourth electrodes EL1, EL2, EL3, and EL4 so as to change a surface profile of each of the first to fourth electrodes EL1, EL2, EL3, and EL4 so that light emitted from the light emitting elements LD may more reliably travel in an image display direction of the display device.

The first bank PW may have a trapezoidal cross-section, the width of which reduces upward from a surface of the passivation layer PSV, but the disclosure is not limited thereto. In an embodiment, the first bank PW may include a curved surface having a cross-section having a semi-elliptical shape, a semi-circular shape, etc., the width of which reduces upward from a surface of the passivation layer PSV, as illustrated in FIG. 14. In a cross-sectional view, the shape of the first bank PW is not limited to the foregoing examples, and may be changed in various ways provided that the efficiency of light emitted from each of the light emitting elements LD may be enhanced. First banks PW adjacent to each other may be disposed on the same plane on the passivation layer PSV and have the same height.

The display element layer DPL of the pixel PXL may further include a second bank (not shown) disposed in the peripheral area of the corresponding pixel PXL. The second bank may be a structure configured to define (or partition) each emission area EMA of one pixel PXL and another pixel PXL adjacent thereto and, for example, may be a pixel defining layer. The second bank may include at least one light shielding material and/or at least one light reflective material, thereby preventing a light leakage defect in which light (or rays) leaks between the one pixel PXL and the another pixel PXL adjacent thereto. In an embodiment, a reflective material layer (or reflective layer) may be formed on the second bank so as to further enhance the efficiency of light emitted from each pixel PXL. Although the second bank may be formed and/or provided on a layer different from that of the first bank PW, the disclosure is not limited thereto. In an embodiment, the second bank and the first bank PW may be formed and/or provided on the same layer.

Some components of the display element layer DPL, e.g., the first and second connection lines CNL1 and CNL2, may be disposed in the peripheral area of the pixel PXL.

The first connection line CNL1 may be electrically connected to at least one transistor T included in the pixel circuit 144 of the pixel PXL through a first contact hole CH1. For example, the first connection line CNL1 may be electrically connected to the first transistor T1 (e.g., the driving transistor T2 of FIG. 7B) included in the pixel circuit 144 of the pixel PXL through the first contact hole CH1. Hence, a signal (or a voltage) applied to the first transistor T1 may be transmitted to the first connection line CNL1. The first connection line CNL1 may be provided integrally with (or integral with) at least one electrode, e.g., the first electrode EL1, disposed in the emission area EMA.

The second connection line CNL2 may be electrically connected with the driving voltage line DVL included in the pixel circuit 144 of the pixel PXL, e.g., with the second power supply line PL2 illustrated in FIG. 7B, through a second contact hole CH2. Hence, a voltage of the second driving power supply VSS that is applied to the second power supply line PL2 may be transmitted to the second connection line CNL2.

In the emission area EMA of the pixel PXL, there are provided the other components of the corresponding pixel PXL, for example, the first to fourth electrodes EL1 to EL4 disposed successively in a first direction DR1, the light emitting elements LD disposed between the first to fourth electrodes EL1 to EL4, the contact electrode CNE, and the first to third conductive patterns CP1 to CP3.

In an embodiment, the emission area EMA of the pixel PXL may be divided into a first area A1 and a second area A2 which are successively provided in a second direction DR2, in a plan view. In an embodiment, the first area A1 may be a first sub-emission area EMA1 from which light is emitted. The second area A2 may be a second sub-emission area EMA2 from which light is emitted.

Each of the first to fourth electrodes EL1 to EL4 may include two sub-electrodes disposed on an identical column in the emission area EMA. For example, the first electrode EL1 may include a 1-1-th sub-electrode EL1_1 and a 1-2-th sub-electrode EL1_2 which are disposed on an identical column and spaced from each other. The second electrode EL2 may include a 2-1-th sub-electrode EL2_1 and a 2-2-th sub-electrode EL2_2 which are disposed on an identical column and spaced from each other. The third electrode EL3 may include a 3-1-th sub-electrode EL3_1 and a 3-2-th sub-electrode EL3_2 which are disposed on an identical column and spaced from each other. The fourth electrode EL4 may include a 4-1-th sub-electrode EL4_1 and a 4-2-th sub-electrode EL4_2 which are disposed on an identical column and spaced from each other.

In an embodiment, the 1-1-th sub-electrode EL1_1, the 2-1-th sub-electrode EL2_1, the 3-1-th sub-electrode EL3_1, and the 4-1-th sub-electrode EL4_1 may be disposed in the first area A1 (EMA1) of the emission area EMA. Furthermore, the 1-2-th sub-electrode EL1_2, the 2-2-th sub-electrode EL2_2, the 3-2-th sub-electrode EL3_2, and the 4-2-th sub-electrode EL4_2 may be disposed in the second area A2 (EMA2) of the emission area EMA In the first area A1 (EMA1), the 1-1-th to 4-1-th sub-electrodes EL1_1, EL2_1, EL3_1, and EL4_1 each may be spaced from an adjacent sub-electrode by a predetermined distance in the first direction DR1. For example, the 1-1-th sub-electrode EL1_1 may be spaced from the 2-1-th sub-electrode EL2_1 by a predetermined distance. The 2-1-th sub-electrode EL2_1 may be spaced from the 3-1-th sub-electrode EL3_1 by a predetermined distance. The 3-1-th sub-electrode EL3_1 may be spaced from the 4-1-th sub-electrode EL4_1 by a predetermined distance. Space between the 1-1-th sub-electrode EL1_1 and the 2-1-th sub-electrode EL2_1, space between the 2-1-th sub-electrode EL2_1 and the 3-1-th sub-electrode EL3_1, and space between the 3-1-th sub-electrode EL3_1 and the 4-1-th sub-electrode EL4_1 may have an identical (or regular) distance. Hence, the light emitting elements LD may be more regularly aligned in the first area A1 (EMA1). Here, the disclosure is not limited thereto. In an embodiment, the space between the 1-1-th sub-electrode EL1_1 and the 2-1-th sub-electrode EL2_1, the space between the 2-1-th sub-electrode EL2_1 and the 3-1-th sub-electrode EL3_1, and the space between the 3-1-th sub-electrode EL3_1 and the 4-1-th sub-electrode EL4_1 may have different distances.

In the second area A2 (EMA2), the 1-2-th to 4-2-th sub-electrodes EL1_2, EL2_2, EL3_2, and EL4_2 each may be spaced from an adjacent sub-electrode by a predetermined distance in the first direction DR1. For example, the 1-2-th sub-electrode EL1_2 may be spaced from the 2-2-th sub-electrode EL2_2 by a predetermined distance. The 2-2-th sub-electrode EL2_2 may be spaced from the 3-2-th sub-electrode EL3_2 by a predetermined distance. The 3-2-th sub-electrode EL3_2 may be spaced from the 4-2-th sub-electrode EL4_2 by a predetermined distance. Space between the 1-2-th sub-electrode EL1_2 and the 2-2-th sub-electrode EL2_2, space between the 2-2-th sub-electrode EL2_2 and the 3-2-th sub-electrode EL3_2, and space between the 3-2-th sub-electrode EL3_2 and the 4-2-th sub-electrode EL4_2 may have an identical (or regular) distance.

Each of the 1-1-th to 4-1-th sub-electrodes EL1_1, EL2_1, EL3_1, and EL4_1 may be disposed on the first bank PW and have a surface profile corresponding to the shape of the first bank PW. For example, each of the 1-1-th to 4-1-th sub-electrodes EL1_1, EL2_1, EL3_1, and EL4_1 may have a protrusion portion corresponding to the first bank PW and a planar portion corresponding to the passivation layer PSV. Each of the 1-2-th to 4-2-th sub-electrodes EL1_2, EL2_2, EL3_2, and EL4_2 may be disposed on the first bank PW and have a surface profile corresponding to the shape of the first bank PW. For example, each of the 1-2-th to 4-2-th sub-electrodes EL1_2, EL2_2, EL3_2, and EL4_2 may have a protrusion portion corresponding to the first bank PW and a planar portion corresponding to the passivation layer PSV.

The 1-1-th to 4-1-th sub-electrodes EL1_1, EL2_1, EL3_1, and EL4_1 and the 1-2-th to 4-2-th sub-electrodes EL1_2, EL2_2, EL3_2, and EL4_2 may be made of a material (or materials) having a predetermined reflectivity to allow light emitted from opposite ends EP1 and EP2 of each of the light emitting elements LD to travel in an image display direction (e.g., in a frontal direction) of the display device.

Each of the 1-1-th to 4-1-th sub-electrodes EL1_1, EL2_1, EL3_1, and EL4_1 and the 1-2-th to 4-2-th sub-electrodes EL1_2, EL2_2, EL3_2, and EL4_2 may be formed of a conductive material (or materials) having a predetermined reflectivity. The conductive material may include opaque metal that has an advantage in reflecting, in the image display direction of the display device, light emitted from the light emitting elements LD. The opaque metal may include metal, for example, Ag Mg, Al, Pt, Pd, Au, Ni, Nd, Ir, Cr, Ti, and an alloy thereof. In an embodiment, each of the 1-1-th to 4-1-th sub-electrodes EL1_1, EL2_1, EL3_1, and EL4_1 and the 1-2-th to 4-2-th sub-electrodes EL1_2, EL2_2, EL3_2, and EL4_2 may include a transparent conductive material (or materials). The transparent conductive material may include conductive oxide such as indium tin oxide (ITO), indium zinc oxide (IZO), zinc oxide (ZnO), or indium tin zinc oxide (ITZO), or a conductive polymer such as poly(3,4-ethylenedioxythiophene) (PEDOT). In case that each of the 1-1-th to 4-1-th sub-electrodes EL1_1, EL2_1, EL3_1, and EL4_1 and the 1-2-th to 4-2-th sub-electrodes EL1_2, EL2_2, EL3_2, and EL4_2 includes a transparent conductive material, a separate additional conductive layer made of opaque metal for reflecting light emitted from the light emitting elements LD in the image display direction of the display device may be included.

The material of each of the 1-1-th to 4-1-th sub-electrodes EL1_1, EL2_1, EL3_1, and EL4_1 and the 1-2-th to 4-2-th sub-electrodes EL1_2, EL2_2, EL3_2, and EL4_2 is not limited to the foregoing materials.

Furthermore, each of the 1-1-th to 4-1-th sub-electrodes EL1_1, EL2_1, EL3_1, and EL4_1 and the 1-2-th to 4-2-th sub-electrodes EL1_2, EL2_2, EL3_2, and EL4_2 may have a single-layer structure, but the disclosure is not limited thereto. In an embodiment, each of the 1-1-th to 4-1-th sub-electrodes EL1_1, EL2_1, EL3_1, and EL4_1 and the 1-2-th to 4-2-th sub-electrodes EL1_2, EL2_2, EL3_2, and EL4_2 may have a multi-layer structure formed by stacking two or more materials among metals, alloys, conductive oxides, and conductive polymers. Each of the 1-1-th to 4-1-th sub-electrodes EL1_1, EL2_1, EL3_1, and EL4_1 and the 1-2-th to 4-2-th sub-electrodes EL1_2, EL2_2, EL3_2, and EL4_2 may have a multi-layer structure including at least two layers to minimize distortion resulting from a signal delay in case that signals (or voltages) are transmitted to opposite ends EP1 and EP2 of each light emitting element LD. For example, each of the 1-1-th to 4-1-th sub-electrodes EL1_1, EL2_1, EL3_1, and EL4_1 and the 1-2-th to 4-2-th sub-electrodes EL1_2, EL2_2, EL3_2, and EL4_2 may have a multi-layer structure in which layers are stacked in a sequence of ITO/Ag/ITO.

As described above, each of the 1-1-th to 4-1-th sub-electrodes EL1_1, EL2_1, EL3_1, and EL4_1 and the 1-2-th to 4-2-th sub-electrodes EL1_2, EL2_2, EL3_2, and EL4_2 may have a surface profile corresponding to the shape of the first bank PW disposed thereunder. Hence, light emitted from the opposite ends EP1 and EP2 of each of the light emitting elements LD may be reflected by the 1-1-th to 4-1-th sub-electrodes EL1_1, EL2_1, EL3_1, and EL4_1 and the 1-2-th to 4-2-th sub-electrodes EL1_2, EL2_2, EL3_2, and EL4_2 and more reliably travel in the image display direction of the display device. Therefore, the efficiency of light emitted from each of the light emitting elements LD may be further enhanced.

In an embodiment, the first bank PW, the 1-1-th to 4-1-th sub-electrodes EL1_1, EL2_1, EL3_1, and EL4_1, and the 1-2-th to 4-2-th sub-electrodes EL1_2, EL2_2, EL3_2, and EL4_2 each may function as a reflector that guides light emitted from the light emitting elements LD in a desired direction, thereby enhancing the light efficiency of the display device. In other words, the first bank PW, the 1-1-th to 4-1-th sub-electrodes EL1_1, EL2_1, EL3_1, and EL4_1, and the 1-2-th to 4-2-th sub-electrodes EL1_2, EL2_2, EL3_2, and EL4_2 each may function as a reflector that enables light emitted from the light emitting elements LD to travel in the image display direction of the display device, thereby enhancing the light efficiency of the light emitting elements LD.

In the first area A1 (EMA1), the 1-1-th and 2-1-th sub-electrodes EL1_1 and EL2_1, along with light emitting elements LD electrically connected in parallel therebetween, may form a first serial stage SET1. The 3-1-th and 4-1-th sub-electrodes EL3_1 and EL4_1, along with light emitting elements LD electrically connected in parallel therebetween, may form a second serial stage SET2. In the second area A2 (EMA2), the 1-2-th and 2-2-th sub-electrodes EL1_2 and EL2_2, along with light emitting elements LD electrically connected in parallel therebetween, may form a third serial stage SET3. The 3-2-th and 4-2-th sub-electrodes EL3_2 and EL4_2, along with light emitting elements LD electrically connected in parallel therebetween, may form a fourth serial stage SET4.

In an embodiment, the first to fourth serial stages SET1 to SET4 are disposed in the emission area EMA of each pixel PXL. The first to fourth serial stages SET1 to SET4 may form an emission part EMU of the corresponding pixel PXL.

The 1-1-th sub-electrode EL1_1 included in the first serial stage SET1 may be an anode electrode of the emission part EMU of each pixel PXL. The 4-2-th sub-electrode EL4_2 included in the fourth serial stage SET4 may be a cathode electrode of the emission part EMU.

In the foregoing embodiment, each of the light emitting elements LD may be formed of a light emitting element which is made of a material having an inorganic crystal structure and has a subminiature size, e.g., ranging from the nanometer scale to the micrometer scale. For example, each of the light emitting elements LD may be a subminiature light emitting element having a size ranging from the nanometer scale to the micrometer scale, as illustrated in FIGS. 1A to 4B. The size, type, shape, etc., of the light emitting elements LD may be changed in various ways. At least two to several tens of light emitting elements LD may be aligned in the emission area EMA of each pixel PXL, but the disclosure is not limited thereto. In an embodiment, the number of light emitting elements LD provided in each pixel PXL may be changed in various ways.

Although FIGS. 8 and 9 illustrate that the respective light emitting elements LD are arranged (or aligned) with each other in the second direction DR2 and in a horizontal direction, e.g., in the first direction DR1, between two adjacent sub-electrodes in the corresponding serial stage, the disclosure is not limited thereto. In an embodiment, at least one of the light emitting elements LD may be arranged and/or electrically connected in a diagonal direction or a perpendicular direction between two adjacent sub-electrodes in the corresponding serial stage. Furthermore, in an embodiment, at least one reverse light emitting element LDr electrically connected in a reverse direction between two adjacent sub-electrodes in each serial stage may be further disposed, or at least one defective light emitting element, e.g., an invalid light source, which are not electrically connected to two adjacent sub-electrodes in each serial stage may be further disposed between the two sub-electrodes. Furthermore, in an embodiment, at least one light emitting element LD5 or LD6 may be disposed between two adjacent sub-electrodes without being included in the first to fourth serial stages SET1 to SET4.

The light emitting elements LD may be diffused in a solution and supplied into the emission area EMA of the pixel PXL. In an embodiment, the light emitting elements LD may be supplied to the emission area EMA of the pixel PXL by an inkjet printing method, a slit coating method, or other various methods. For example, the light emitting elements LD may be mixed with a volatile solvent and supplied to the emission area EMA of the pixel PXL by an inkjet printing method or a slit coating method. In that case the first to fourth electrodes EL1 to EL4 disposed in the emission area EMA of the pixel PXL are supplied with corresponding alignment signals (or alignment voltages), an electric field is formed between two adjacent electrodes of the first to fourth electrodes EL1 to EL4, so that the light emitting elements LD may be aligned between the two adjacent electrodes. After the light emitting elements LD are aligned, the solvent may be removed by a volatilization method or other methods. In this way, the light emitting elements LD may be reliably disposed between the first to fourth electrodes EL1 to EL4.

After the light emitting elements LD are aligned in the emission area EMA of the pixel PXL, each of the first to fourth electrodes EL1 to EL4 may be divided and include two sub-electrodes disposed on an identical column and spaced from each other. For example, the first electrode EL1 may include the 1-1-th sub-electrode EL1_1 and the 1-2-th sub-electrode EL1_2 disposed on an identical column and spaced from each other, and the 1-1-th-sub-electrode EL1_1 and the 1-2-th sub-electrode EL1_2 may be formed by removing and disconnecting a portion of the first electrode EL1 after the light emitting elements LD are aligned in the emission area EMA of the corresponding pixel PXL. The second electrode EL2 may include the 2-1-th sub-electrode EL2_1 and the 2-2-th sub-electrode EL2_2 disposed on an identical column and spaced from each other, and the 2-1-th sub electrode EL2_1 and the 2-2-th sub electrode EL2_2 may be formed by removing or disconnecting a portion thereof after the alignment of the light emitting elements LD. The third electrode EL3 may include the 3-1-th sub-electrode EL3_1 and the 3-2-th sub-electrode EL3_2 disposed on an identical column and spaced from each other, and the 3-1-th sub-electrode EL3_1 and the 3-2-th sub-electrode EL3_2 are formed by removing or disconnecting a portion thereof after the alignment of the light emitting elements LD. The fourth electrode EL4 may include the 4-1-th sub-electrode EL4_1 and the 4-2-th sub-electrode EL4_2 disposed on an identical column and spaced from each other, and the 4-1-th sub-electrode EL4_1 and the 4-2-th sub-electrode EL4_2 are formed by removing or disconnecting a portion thereof after the alignment of the light emitting elements LD.

As described above, in case that the light emitting elements LD are aligned in the emission area EMA of the pixel PXL, the first to fourth electrodes EL1 to EL4 may function as alignment electrodes (or alignment lines) for alignment of the light emitting elements LD. For example, the first and third electrodes EL1 and EL3 of the first to fourth electrodes EL1 to EL4 may be first alignment electrodes to which an identical first alignment signal (or a first alignment voltage) is to be applied, and the second and fourth electrodes EL2 and EL4 may be second alignment electrodes to which an identical second alignment signal (or a second alignment voltage) is to be applied. The first alignment signal and the second alignment signal may have different voltage levels. If the first to fourth electrodes EL1 to EL4 are supplied with alignment signals, electric fields may be respectively formed between the first and second electrodes EL1 and EL2, between the second and third electrodes EL2 and EL3, and between the third and fourth electrodes EL3 and EL4. The light emitting elements LD may be aligned in the emission area EMA of the pixels PXL by the electric fields formed between the first to fourth electrodes EL1 to EL4.

After the light emitting elements LD are aligned in the emission area EMA of the pixel PXL, each of the first to fourth electrodes EL1 to EL4 may be include two sub-electrodes disposed on an identical column and spaced from each other, and the two-sub-electrodes are formed by removing a portion of each of the first to fourth electrodes EL1 to EL4. In an embodiment, the emission area EMA of each pixel PXL may be divided into a first area A1 (EMA1) and a second area A2 (EMA2) according to a position of each of two sub-electrodes disposed on an identical column and spaced from each other after the light emitting elements LD are aligned. For example, an area in which one of two sub-electrodes disposed on the identical column and spaced from each other is disposed may be the first area A1 (EMA1), and an area in which the other sub-electrode is disposed may be the second area A2 (EMA2).

Although in the foregoing embodiment there has been described an example where each of the first to fourth electrodes EL1 to EL4 includes two sub-electrodes disposed on an identical column and spaced from each other, and that the two-sub-electrodes are formed by removing a portion of each of the first to fourth electrodes EL1 to EL4 after the alignment of the light emitting elements LD, the disclosure is not limited thereto. In an embodiment, each of the first to fourth electrodes EL1 to EL4 includes three sub-electrodes disposed on an identical column and spaced from each other or four sub-electrodes disposed on an identical column and spaced from each other, and the three sub-electrodes and the four sub-electrodes are formed by removing a portion of each of the first to fourth electrodes EL1 to EL4 after the alignment of the light emitting elements LD.

In case that each of the first to fourth electrodes EL1 to EL4 includes three sub-electrodes disposed on an identical column and spaced from each other, the emission area EMA of the pixel PXL may be divided into three areas according to a position of each of the three sub-electrodes. Furthermore, in case that each of the first to fourth electrodes EL1 to EL4 includes four sub-electrodes disposed on an identical column and spaced from each other, the emission area EMA of the pixel PXL may be divided into four areas according to a position of each of the four sub-electrodes.

In an embodiment, at the step of aligning the light emitting elements LD in the emission area EMA of the pixel PXL, the light emitting elements LD to be supplied to the emission area EMA may be controlled to be relatively biased and aligned by controlling alignment signals (or alignment voltages) to be respectively applied to the first to fourth electrodes EL1 to EL4 or by forming a magnetic field. For example, at the alignment step of the light emitting elements LD, as the waveforms of the alignment signals are adjusted or a magnetic field is formed in the emission area EMA, the number of light emitting elements LD oriented in the forward direction (e.g., the first end EP1 of each of the light emitting elements LD is oriented toward the first alignment electrode and the second end EP2 thereof is oriented toward the second alignment electrode) may be controlled such that the number of light emitting elements LD oriented in the forward direction is greater than the number of reverse light emitting elements LDr oriented in a direction opposite thereto.

Each of the light emitting elements LD may include a cylindrical light emitting element fabricated by an etching method, or a core-shell light emitting element fabricated by a growth scheme. In case that each of the light emitting elements LD is a cylindrical light emitting element, each light emitting element LD may include an emission stack (or a stacked pattern) formed by successively stacking a first semiconductor layer 11, an active layer 12, a second semiconductor layer 13, and an additional electrode 15 in the longitudinal direction (L) of each light emitting element LD. In case that each of the light emitting elements LD is a light emitting element having a core-shell structure, each light emitting element LD may include an emission pattern 10 having a first semiconductor layer 11 disposed in a central portion of the light emitting element LD, an active layer 12 which encloses at least one side of the first semiconductor layer 11, a second semiconductor layer 13 which encloses at least one side of the active layer 12, and an additional electrode 15 which encloses at least one side of the second semiconductor layer 13.

Each of the light emitting elements LD may include a first end EP1 electrically connected to one of two sub-electrodes adjacent to each other in the first direction DR1, and a second end EP2 electrically connected to the other of the two sub-electrodes. In an embodiment, the first end EP1 of each light emitting element LD may be a second semiconductor layer 13 including a p-type semiconductor layer, and the second end EP2 thereof may be a first semiconductor layer 11 including an n-type semiconductor layer. In other words, in the emission area EMA of the pixel PXL, each light emitting element LD may be electrically connected in the forward direction between two sub-electrodes adjacent to each other in the first direction DR1. As described above, the light emitting elements LD electrically connected in the forward direction between the two adjacent sub-electrodes may form valid light sources of each of the first to fourth serial stages SET1 to SET4.

The first end EP1 of each of the light emitting elements LD may be directly connected to one of two sub-electrodes adjacent to each other in the first direction DR1, or may be electrically connected to the one of the two sub-electrode through the contact electrode CNE or one of the first to third conductive patterns CP1 to CP3. The second end EP2 of each of the light emitting elements LD may be directly electrically connected to the other of the two sub-electrodes adjacent to each other, or may be electrically connected to the other sub-electrode through the contact electrode CNE or one of the first to third conductive patterns CP1 to CP3.

In an embodiment, the first end EP1 of each of the light emitting elements LD included in the first serial stage SET1 may be directly connected to the 1-1-th sub electrode EL1_1, or may be electrically connected to the contact electrode CNE and thus indirectly connected to the 1-1-th sub electrode EL1_1. Furthermore, the second end EP2 of each of the light emitting elements LD included in the first serial stage SET1 may be directly connected to the 2-1-th sub electrode EL2_1, or may be electrically connected to the first conductive pattern CP1 and thus indirectly connected to the 2-1-th sub electrode EL2_1.

The first end EP1 of each of the light emitting elements LD included in the second serial stage SET2 may be directly electrically connected to the 3-1-th sub-electrode EL3_1, or may be connected to the first conductive pattern CP1 and thus indirectly connected to the 3-1-th sub-electrode EL3_1. Furthermore, the second end EP2 of each of the light emitting elements LD included in the second serial stage SET2 may be directly connected to the 4-1-th sub-electrode EL4_1, or may be electrically connected to the second conductive pattern CP2 and thus indirectly connected to the 4-1-th sub electrode EL4_1.

The first end EP1 of each of the light emitting elements LD included in the third serial stage SET3 may be directly connected to the 1-2-th sub-electrode EL1_2, or may be electrically connected to the second conductive pattern CP2 and thus indirectly connected to the 1-2-th sub-electrode EL1_2. Furthermore, the second end EP2 of each of the light emitting elements LD included in the third serial stage SET3 may be directly electrically connected to the 2-2-th sub-electrode EL2_2, or may be electrically connected to the third conductive pattern CP3 and thus indirectly connected to the 2-2-th sub electrode EL2_2.

The first end EP1 of each of the light emitting elements LD included in the fourth serial stage SET4 may be directly connected to the 3-2-th sub-electrode EL3_2, or may be electrically connected to the third conductive pattern CP3 and thus indirectly connected to the 3-2-th sub-electrode EL3_2. Furthermore, the second end EP2 of each of the light emitting elements LD included in the fourth serial stage SET4 may be directly electrically connected to the 4-2-th sub-electrode EL4_2, or may be electrically connected to the contact electrode CNE and thus indirectly connected to the 4-2-th sub electrode EL4_2.

The light emitting elements LD may be provided and/or formed on a first insulating layer INS1 in the emission area EMA of each pixel PXL.

The first insulating layer INS1 may be formed and/or provided under each of the light emitting elements LD arranged between one of two sub-electrodes that form each serial stage and the other sub-electrode in the emission area EMA of each pixel PXL. The first insulating layer INS1 may be filled into space between the passivation layer PSV and each of the light emitting elements LD to stably support the light emitting elements LD and prevent the light emitting elements LD from being removed from the passivation layer PSV.

Furthermore, in the emission area EMA of each pixel PXL, the first insulating layer INS1 may expose an area of each of two sub-electrodes that form each serial stage, and cover a remaining area other than the predetermined area. The first insulating layer INS1 may be provided and/or formed on the passivation layer PSV in the peripheral area of each pixel PXL and thus protect components, e.g., the first and second connection lines CNL1 and CNL2, disposed in the peripheral area.

The first insulating layer INS1 may include an inorganic insulating layer including an inorganic material, or an organic insulating layer including an organic material. Although in an embodiment, the first insulating layer INS1 may be formed of an inorganic insulating layer having an advantage in protecting the light emitting elements LD from the pixel circuit layer PCL, the disclosure is not limited thereto. In an embodiment, the first insulating layer INS1 may be formed of an organic insulating layer that has an advantage in planarization of support surfaces of the light emitting elements LD.

A second insulating layer INS2 may be provided and/or formed on the light emitting elements LD. The second insulating layer INS2 may be provided and/or formed on each of the light emitting elements LD to cover (or overlap) a portion of an upper surface of each of the light emitting elements LD, and expose the opposite ends EP1 and EP2 of each of the light emitting elements LD to the outside. The second insulating layer INS2 may be formed in an independent pattern in the emission area EMA of each pixel PXL, but the disclosure is not limited thereto.

The second insulating layer INS2 may be formed of a single layer or multiple layers, and include an inorganic insulating layer including at least one inorganic material or an organic insulating layer including at least one organic material. The second insulating layer INS2 may fix each of the light emitting elements LD aligned in the emission area EMA of each pixel PXL. In an embodiment, the second insulating layer INS2 may include an inorganic insulating layer that has an advantage in protecting the active layer 12 of each of the light emitting elements LD from external oxygen, water, etc. However, the disclosure is not limited thereto. The second insulating layer INS2 may be formed as an organic insulating layer including an organic material, depending on design conditions of the display device to which the light emitting elements LD are applied.

In an embodiment, after the alignment of the light emitting elements LD in the emission area EMA of each pixel PXL have been completed, the second insulating layer INS2 is formed on the light emitting elements LD so that the light emitting elements LD may be prevented from being removed from the aligned position. If space (or a gap) is present between the first insulating layer INS1 and the light emitting elements LD before the second insulating layer INS2 is formed, the space may be filled with the second insulating layer INS2 during a process of forming the second insulating layer INS2. Consequently, the light emitting elements LD may be more stably supported. Hence, the second insulating layer INS2 may be formed of an organic insulating layer that has an advantage in filling the space between the first insulating layer INS1 and the light emitting elements LD with the second insulating layer INS2.

In an embodiment, the second insulating layer INS2 may be formed on each of the light emitting elements LD so that the active layer 12 of each of the light emitting elements LD may be prevented from contacting an external conductive material. The second insulating layer INS2 may cover (or overlap) only a portion of the upper surface of each of the light emitting elements LD such that the opposite ends EP1 and EP2 of each of the light emitting elements LD may be exposed to the outside.

In an embodiment, the light emitting elements LD may include at least one first light emitting element LD1 electrically connected in the forward direction between the 1-1-th and 2-1-th sub-electrodes EL1_1 and EL2_1 of the first serial stage SET1, and at least one second light emitting element LD2 electrically connected in the forward direction between the 3-1-th and 4-1-th sub-electrodes EL3_1 and EL4_1 of the second serial stage SET2. Furthermore, the light emitting elements LD may include at least one third light emitting element LD3 electrically connected in the forward direction between the 1-2-th and 2-2-th sub-electrodes EL1_2 and EL2_2 of the third serial stage SET3, and at least one fourth light emitting element LD4 electrically connected in the forward direction between the 3-2-th and 4-2-th sub-electrodes EL3_2 and EL4_2 of the fourth seral stage SET4. In an embodiment, the light emitting elements LD may include at least one fifth light emitting element LD5 electrically connected between the 2-1-th and 3-1-th sub-electrodes EL2_1 and EL3_1, and at least one sixth light emitting element LD6 electrically connected between the 2-2-th and 3-2-th sub-electrodes EL2_2 and EL3_2.

The first serial stage SET1 including the first light emitting elements LD1 electrically connected in parallel in the forward direction between the 1-1-th and 2-1-th sub-electrodes EL1_1 and EL2_1 may be electrically connected, through the first conductive pattern CP1, with the second serial stage SET2 including the second light emitting elements LD2 electrically connected in parallel in the forward direction between the 3-1-th and 4-1-th sub electrodes EL3_1 and EL4_1.

In an embodiment, the first conductive pattern CP1 may be disposed between the first serial stage SET1 and the second serial stage SET2 and electrically connected to each of the 2-1-th sub-electrode EL2_1 of the first serial stage SET1 and the 3-1-th sub-electrode EL3_1 of the second serial stage SET2. The first conductive pattern CP1 may cover the 2-1-th sub-electrode EL2_1 and the 3-1-th sub-electrode EL3_1 and overlap the 2-1-th and 3-1-th sub-electrodes EL2_1 and EL3_1. The first conductive pattern CP1 may be an electrode to which no signal (or no voltage) is applied. The first conductive pattern CP1 may be directly connected with the 2-1-th sub-electrode EL2_1 and also be directly connected with the 3-1-th sub-electrode EL3_1. Hence, the 2-1-th sub-electrode EL2_1 and the 3-1-th sub-electrode EL3_1 may be electrically connected by the first conductive pattern CP1. In other words, the 2-1-th and 3-1-th sub-electrodes EL2_1 and EL3_1 that are disposed in a center (or a middle area) in the first direction DR1 in the first area A1 (EMA1) may be electrically connected to each other by the first conductive pattern CP1.

In a plan view, the first conductive pattern CP1 may be disposed directly on the 2-1-th and 3-1-th sub-electrodes EL2_1 and EL3_1 and electrically connected with the 2-1-th and 3-1-th sub-electrodes EL2_1 and EL3_1. Therefore, the 2-1-th and 3-1-th sub-electrodes EL2_1 and EL3_1, along with the first conductive pattern CP1, may function as connector electrodes for coupling (or connecting) the first serial stage SET1 and the second serial stage SET2.

Furthermore, the first conductive pattern CP1 may be disposed directly on the fifth light emitting element LD5 electrically connected in the forward direction between the 2-1-th and 3-1-th sub-electrodes EL2_1 and EL3_1. Hence, the first end EP1 and the second end EP2 of the fifth light emitting element LD5 may be electrically short-circuited with each other by the first conductive pattern CP1. The fifth light emitting element LD5 along with the first conductive pattern CP1 may electrically contact the first serial stage SET1 and the second serial stage SET2 and thus become a path for driving current to be supplied from the first serial stage SET1 to the second serial stage SET2.

In an embodiment, at least one reverse light emitting element LDr (LD5), which is electrically connected in a direction opposite to the forward direction and remains disabled, may be electrically connected between the 2-1-th sub-electrode EL2_1 and the 3-1-th sub-electrode EL3_1. The first conductive pattern CP1 may be disposed directly on the reverse light emitting element LDr (LD5). Hence, the reverse light emitting element LDr (LD5) may be electrically connected to the first conductive pattern CP1 even when in the disabled state, e.g., in a state in which light is not emitted, so that the reverse light emitting element LDr (LD5) along with the first conductive pattern CP1 may electrically contact the first serial stage SET1 and the second serial stage SET2 and thus become a path for driving current to be supplied from the first serial stage SET1 to the second serial stage SET2.

The second serial stage SET2 including the second light emitting elements LD2 electrically connected in parallel in the forward direction between the 3-1-th and 4-1-th sub-electrodes EL3_1 and EL4_1 may be electrically connected, through the second conductive pattern CP2, with the third serial stage SET3 including the third light emitting elements LD3 electrically connected in parallel in the forward direction between the 1-2-th and 2-2-th sub electrodes EL1_2 and EL2_2.

In an embodiment, the second conductive pattern CP2 may be disposed between the second serial stage SET2 and the third serial stage SET3 and electrically connected to each of the 4-1-th sub-electrode EL4_1 of the second serial stage SET2 and the 1-2-th sub-electrode EL1_2 of the third serial stage SET3. In a plan view, the second conductive pattern CP2 may be provided over the first area A1 (EMA1) and the second area A2 (EMA2) and overlap each of the 4-1-th sub-electrode EL4_1 and the 1-2-th sub-electrode EL1_2. The second conductive pattern CP2 may be an electrode to which no signal (or no voltage) is applied. The second conductive pattern CP2 may be directly connected with the 4-1-th sub-electrode EL4_1 and also be directly connected with the 1-2-th sub-electrode EL1_2. Hence, the 4-1-th sub-electrode EL4_1 and the 1-2-th sub-electrode EL1_2 may be electrically connected by the second conductive pattern CP2. In other words, the 4-1-th sub-electrode EL4_1 of the first area A1 (EMA1) and the 1-2-th sub-electrode EL1_2 of the second area A2 (EMA2) may be electrically connected to each other by the second conductive pattern CP2.

In a plan view, the second conductive pattern CP2 may be disposed directly on the 4-1-th sub-electrode EL4_1 and 1-2-th sub-electrode EL1_2 and electrically connected with the 4-1-th and 1-2-th sub-electrodes EL4_1 and EL1_2. Therefore, the 4-1-th and 1-2-th sub-electrodes EL4_1 and EL1_2, along with the second conductive pattern CP2, may function as connection electrodes for coupling (or connecting) the second serial stage SET2 and the third serial stage SET3.

In an embodiment, the third conductive pattern CP3 may be disposed between the third serial stage SET3 and the fourth serial stage SET4 and electrically connected to each of the 2-2-th sub-electrode EL2_2 of the third serial stage SET3 and the 3-2-th sub-electrode EL3_2 of the fourth serial stage SET4. The third conductive pattern CP3 may cover (or overlap) the 2-2-th sub-electrode EL2_2 and the 3-2-th sub-electrode EL3_2 and overlap the 2-2-th and 3-2-th sub-electrodes EL2_2 and EL3_2. The third conductive pattern CP3 may be an electrode to which no signal (or no voltage) is applied. The third conductive pattern CP3 may be directly connected with the 2-2-th sub-electrode EL2_2 and also be directly connected with the 3-2-th sub-electrode EL3_2. Hence, the 2-2-th sub-electrode EL2_2 and the 3-2-th sub-electrode EL3_2 may be electrically connected by the third conductive pattern CP3. In other words, the 2-2-th and 3-2-th sub-electrodes EL2_2 and EL3_2 that are disposed in a center (or a middle area) in the first direction DR1 in the second area A2 (EMA2) may be electrically connected to each other by the third conductive pattern CP3.

In a plan view, the third conductive pattern CP3 may be disposed directly on the 2-2-th and 3-2-th sub-electrodes EL2_2 and EL3_2 and electrically connected with the 2-2-th and 3-2-th sub-electrodes EL2_2 and EL3_2. Therefore, the 2-2-th and 3-2-th sub-electrodes EL2_2 and EL3_2, along with the third conductive pattern CP3, may function as connection electrodes for coupling (or connecting) the third serial stage SET3 and the fourth serial stage SET4.

Furthermore, the third conductive pattern CP3 may be disposed directly on the sixth light emitting element LD6 electrically connected in the forward direction between the 2-2-th and 3-2-th sub-electrodes EL2_2 and EL3_2. Hence, the first end EP1 and the second end EP2 of the sixth light emitting element LD6 may be electrically short-circuited by the third conductive pattern CP3. The sixth light emitting element LD6 along with the third conductive pattern CP3 may electrically contact the third serial stage SET3 and the fourth serial stage SET4 and thus become a path for driving current to be supplied from the third serial stage SET3 to the fourth serial stage SET4.

In an embodiment, at least one reverse light emitting element LDr (LD6), which is electrically connected in a direction opposite to the forward direction and remains disabled, may be electrically connected between the 2-2-th sub-electrode EL2_2 and the 3-2-th sub-electrode EL3_2. The third conductive pattern CP3 may be disposed directly on the reverse light emitting element LDr (LD6). Hence, the reverse light emitting element LDr (LD6) may be electrically connected to the third conductive pattern CP3 even when in the disabled state, e.g., in a state in which light is not emitted, so that the reverse light emitting element LDr (LD6) along with the third conductive pattern CP3 may electrically contact the third serial stage SET3 and the fourth serial stage SET4 and thus become a path for driving current to be supplied from the third serial stage SET3 to the fourth serial stage SET4.

In an embodiment, the first and third conductive patterns CP1 and CP3 may be provided on an identical layer. The second conductive pattern CP2 and the first and third conductive patterns CP1 and CP3 may be provided and/or formed on different layers. For example, the second conductive pattern CP2 may be provided on the first and third conductive patterns CP1 and CP3 with a third insulating layer INS3 interposed therebetween. The third insulating layer INS3 may be provided on the first and third conductive patterns CP1 and CP3 to cover the first and third conductive patterns CP1 and CP3. A fourth insulating layer INS4 may be provided and/or formed on the second conductive patterns CP2. The fourth insulating layer INS4 may be disposed on the second conductive pattern CP2 to cover (or overlap) the second conductive pattern CP2. The third and fourth insulating layers INS3 and INS4 may be formed of any of an inorganic insulating layer including an inorganic material or an organic insulating layer including an organic material. An overcoat layer OC may be provided and/or formed on the fourth insulating layer INS4.

The first to third conductive patterns CP1 to CP3 may be formed of various transparent conductive materials. For example, each of the first to third conductive patterns CP1 to CP3 may be formed of a transparent conductive material for minimizing loss of light that is emitted from each of the light emitting elements LD and reflected in the image display direction of the display device by the corresponding sub-electrode. The transparent conductive material may include at least one of various conductive materials, e.g., ITO, IZO, and ITZO, and may be substantially transparent or translucent to satisfy a predetermined transmittance. The materials of the first to third conductive patterns CP1 to CP3 are not limited to the foregoing materials, and may include an opaque conductive material depending on embodiments.

Each of the first to third conductive patterns CP1 to CP3 may have a bar shape extending in the second direction DR2. The second conductive pattern CP2 may have a bar shape bent at least one or more times because it is provided over the first area A1 (EMA1) and the second area A2 (EMA2). The shapes of the first to third conductive patterns CP1 to CP3 are not limited that of the foregoing embodiment(s). In an embodiment, the shape of each of the first to third conductive patterns CP1 to CP3 may be changed in various ways so long as it may reliably electrically contact (or connect) two successive serial stages.

In an embodiment, the contact electrode CNE may be provided on each of the 1-1-th sub-electrode EL1_1 of the first serial stage SET1 and the 4-2-th sub-electrode EL4_2 of the fourth serial stage SET4.

The contact electrode CNE on the 1-1-th sub-electrode EL1_1 may electrically and/or physically reliably connect the first end EP1 of each of the first light emitting elements LD1 with the 1-1-th sub-electrode EL1_1. The contact electrode CNE on the 4-2-th sub-electrode EL4_2 may electrically and/or physically reliably connect the second end EP2 of each of the fourth light emitting elements LD4 with the 4-2-th sub-electrode EL4_2. The contact electrode CNE on the 1-1-th sub-electrode EL1_1 and the contact electrode CNE on the 4-2-th sub-electrode EL4_2 may be made of various transparent conductive materials.

The contact electrode CNE on the 1-1-th sub-electrode EL1_1 and the contact electrode CNE on the 4-2-th sub-electrode EL4_2 may be provided on an identical layer. For example, the contact electrode CNE on the 1-1-th sub-electrode EL1_1 and the contact electrode CNE on the 4-2-th sub-electrode EL4_2 each may be disposed on the third insulating layer INS3 and covered with (or overlapped with) the fourth insulating layer INS4. In this case, the contact electrode CNE on the 1-1-th sub-electrode EL1_1 and the contact electrode CNE on the 4-2-th sub-electrode EL4_2, and the second conductive pattern CP2 may be provided on the same layer. However, the disclosure is not limited thereto. In an embodiment, the contact electrode CNE on the 1-1-th sub-electrode EL1_1 and the contact electrode CNE on the 4-2-th sub-electrode EL4_2, and the first and third conductive patterns CP1 and CP3 may be provided on the same layer.

The contact electrode CNE on the 1-1-th sub-electrode EL1_1 and the contact electrode CNE on the 4-2-th sub-electrode EL4_2 may be provided on different layers. In this case, one of the contact electrode CNE on the 1-1-th sub-electrode EL1_1 and the contact electrode CNE on the 4-2-th sub-electrode EL4_2, and the first and third conductive patterns CP1 and CP3 may be provided on the same layer, and the other contact electrode CNE and the second conductive pattern CP2 may be provided on the same layer.

Although in the foregoing embodiment there has been described that the first and third conductive patterns CP1 and CP3 and the second conductive pattern CP2 are provided and/or formed on different layers, the disclosure is not limited thereto. In an embodiment, the first and third conductive patterns CP1 and CP3 and the second conductive pattern CP2 may be provided and/or formed on the same layer, as illustrated in FIG. 11. In this case, the first to third conductive patterns CP1 to CP3 may be spaced from each other by a predetermined distance on the second insulating layer INS2 and thus be electrically separated from each other, and may be covered with the third insulating layer INS3. The overcoat layer OC may be provided and/or formed on the third insulating layer INS3. Here, the third insulating layer INS3 may correspond to the fourth insulating layer INS4 in case that the first and third conductive patterns CP1 and CP3 and the second conductive pattern CP2 are provided and/or formed on different layers.

The overcoat layer OC may be an encapsulation layer, configured to mitigate a step difference formed by the components disposed under the overcoat layer OC and included in the display element layer DPL of each pixel PXL, and prevent oxygen or water from permeating the light emitting elements LD. In an embodiment, the overcoat layer OC may be omitted taking into design conditions, etc. of the display device.

In an embodiment, one of a pair of sub-electrodes that form the first serial stage SET1, for example, the 1-1-th sub-electrode EL1_1 of the 1-1-th and 2-1-th sub-electrodes EL1_1 and EL2_1, may be electrically connected with some components of the pixel circuit 144 of the pixel circuit layer PCL of the pixel PXL through the first connection line CNL1.

In case that driving current flows from the first power supply line PL1 to the second power supply line PL2 via the pixel circuit 144 by the first transistor T1 T, e.g., the driving transistor, included in the pixel circuit 144 of each pixel PXL the driving current may be supplied to the emission part EMU of the corresponding pixel PXL through the first contact hole CH1. For example, driving current flows to the 1-1-th sub-electrode EL1_1 of the first serial stage SET1 through the first contact hole CH1, and the driving current flows to the 2-1-th sub-electrode EL2_1 via the first light emitting elements LD1 of the first serial stage SET1. Therefore, the first light emitting elements LD1 each may emit light at luminance corresponding to current distributed thereto.

Driving current that flows to the 2-1-th sub-electrode EL2_1 of the first serial stage SET1 may be supplied to the 3-1-th sub-electrode EL3_1 of the second serial stage SET2 through the first conductive pattern CP1. The driving current flows to the 4-1-th sub-electrode EL4_1 via the second light emitting elements LD2 of the second serial stage SET2. Therefore, the second light emitting elements LD2 each may emit light at luminance corresponding to current distributed thereto.

Driving current that flows to the 4-1-th sub-electrode EL4_1 of the second serial stage SET2 may be supplied to the 1-2-th sub-electrode EL1_2 of the third serial stage SET3 through the second conductive pattern CP2. The driving current flows to the 2-2-th sub-electrode EL2_2 via the third light emitting elements LD3 of the third serial stage SET3. Therefore, the third light emitting elements LD3 each may emit light at a luminance corresponding to current distributed thereto.

Driving current that flows to the 2-2-th sub-electrode EL2_2 of the third serial stage SET3 may be supplied to the 3-2-th sub-electrode EL3_2 of the fourth serial stage SET4 through the third conductive pattern CP3. The driving current flows to the 4-2-th sub-electrode EL4_2 via the fourth light emitting elements LD4 of the fourth serial stage SET4. Therefore, the fourth light emitting elements LD4 each may emit light at a luminance corresponding to current distributed thereto.

Driving current that flows to the 4-2-th sub-electrode EL4_2 of the fourth serial stage SET4 may be supplied to the second power supply line PL2 (e.g., the driving voltage line DVL) electrically connected to the pixel circuit 144 of the pixel PXL via the second contact hole CH2. In this way, driving current of each pixel PXL may flow successively via the first to fourth light emitting elements LD1 to LD4. Hence, the pixel PXL may emit light at a luminance corresponding to a data signal supplied during each frame period.

In an embodiment, in the emission area EMA of the pixel PXL, a capping layer CPL may be provided and/or formed, as illustrated in FIG. 12.

In the first area A1 (EMA1), the capping layer CPL may be disposed between the 1-1-th sub-electrode EL1_1 and the contact electrode CNE, between the 2-1-th sub-electrode EL2_1 and the first conductive pattern CP1, between the 3-1-th sub-electrode EL3_1 and the first conductive pattern CP1, and between the 4-1-th sub-electrode EL4_1 and the second conductive pattern CP2. Furthermore, in the second area A2 (EMA2), the capping layer CPL may be disposed between the 1-2-th sub electrode EL1_2 and the second conductive pattern CP2, between the 2-2-th sub electrode EL2_2 and the third conductive pattern CP3, between the 3-2-th sub electrode EL3_2 and the third conductive pattern CP3, and between the 4-2-th sub electrode EL4_2 and the contact electrode CNE.

The capping layer CPL may prevent the corresponding sub-electrode and the contact electrode or the corresponding sub-electrode and the conductive pattern from be damaged by a failure or the like caused during the process of fabricating the display device, and may further reinforce adhesive force between the corresponding sub-electrode and the pixel circuit layer PCL disposed thereunder. The capping layer CPL may be formed of a transparent conductive material such as indium zinc oxide (IZO) to minimize loss of light emitted from each of the light emitting elements LD and reflected by the corresponding sub-electrode in the image display direction of the display device.

In accordance with the foregoing embodiment, the emission area EMA of each pixel PXL is partitioned into the first area A1 (EMA1) and the second area A2 (EMA2) in a direction (e.g., the second direction DR2). In each area, the conductive pattern is disposed both on two sub-electrodes disposed in a central portion in the first direction DR1 and on the light emitting elements disposed between the two sub-electrodes so that two successive serial stages in the corresponding area are electrically connected to each other. Furthermore, a sub-electrode of a following second serial stage SET2 of the two serial stages SET1 and SET2 disposed in the first area A1 (EMA1) and a sub-electrode of a preceding third serial stage SET3 of the two serial stages SET3 and SET4 disposed in the second area A2 (EMA2) are electrically connected to each other by the second conductive pattern CP2. In this way, the second serial stage SET2 of the first area A1 (EMA1) and the third serial stage SET3 of the second area A2 (EMA2) are electrically connected to each other. In the foregoing embodiment, the emission part EMU has a serial-parallel combination structure, so that each pixel PXL may be reliably driven, and driving current flowing through the display device may be reduced, whereby the power consumption efficiency may be improved.

In case that the light emitting elements LD are aligned to be biased by controlling alignment signals to be respectively applied to the first to fourth electrodes EL1 to EL4 at the step of aligning the light emitting elements LD in the emission area EMA of the pixel PXL, the number of light emitting elements LD aligned between the second and third electrodes EL2 and EL3 disposed in the central portion of the emission area EMA in a plan view may be less than the number of light emitting elements LD aligned between the first and second electrodes EL1 and EL2 and between the third and fourth electrodes EL3 and EL4. Furthermore, depending on a movement direction of an apparatus, e.g., an inkjet nozzle, for supplying a mixed solution including light emitting elements LD to the emission area EMA, a liquid drop diffusion degree of the mixed solution may vary, so that the number of light emitting elements LD aligned in the central portion of the emission area EMA may be less than the number of light emitting elements LD aligned in a perimeter of the emission area EMA.

Because the number of light emitting elements LD disposed in the central portion of the emission area EMA of each pixel PXL is relatively small, the occurrence probability of an open failure of the pixel PXL which may occur in case that the light emitting elements LD are not electrically connected in the forward direction may be relatively high in the central area of the emission area EMA, compared to that of the other areas of the emission area EMA. Given this, in an embodiment, a conductive pattern may be disposed directly on the light emitting elements LD disposed in the central area of the emission area EMA of each pixel PXL to electrically short-circuit the light emitting elements LD and thus may be used as a connection electrode for coupling (or connecting) two successive serial stages to each other, so that the open failure of the corresponding pixel PXL may be prevented or minimized.

FIGS. 15A to 15F are schematic plan views sequentially illustrating a method of fabricating a pixel illustrated in FIG. 9. FIGS. 16A to 16H are cross-sectional views sequentially illustrating a method of fabricating the pixel illustrated in FIG. 10.

Hereinafter, the method of fabricating the pixel illustrated in FIGS. 9 and 10 in accordance with an embodiment will be described with reference to FIGS. 15A to 15F and FIGS. 16A to 16H.

Referring to FIGS. 1A to 4B, 5, 7B, 9, 10, and 16A, the pixel circuit layer PCL of the pixel PXL is formed on the substrate SUB. The pixel PXL may include an emission area EMA, and a peripheral area disposed around the emission area EMA.

The pixel circuit layer PCL may include a pixel circuit 144 including at least one transistor T, a driving voltage line DVL electrically connected to the pixel circuit 144, and a passivation layer PSV disposed on the transistor T and the driving voltage line DVL. The driving voltage line DVL may be the second power supply line PL2 to which the second driving power supply VSS is to be applied.

The passivation layer PSV may include a first contact hole CH1 which exposes the second terminal DE of the first transistor T1, and a second contact hole CH2 which exposes a portion of the driving voltage line DVL.

Referring to FIGS. 1A to 4B, 5, 7B, 9, 10,15A, 16A, and 16B, the first bank PW is formed on the passivation layer PSV in the emission area EMA of the pixel PXL. The first bank PW may be spaced from an adjacent first bank PW by a predetermined distance on the passivation layer PSV. In a plan view, the first bank PW may have a bar shape extending in the second direction DR2, but the disclosure is not limited thereto. The first bank PW may be formed of an inorganic insulating layer including inorganic material, or an organic insulating layer including an organic material.

Referring to FIGS. 1A to 4B, 5, 7B, 9, 10, 15B, and 16A to 16C, the first to fourth conductive lines CL1 to CL4 including conductive material having a high reflectivity and the first and second connection lines CNL1 and CNL2 may be formed on the passivation layer PSV including the first bank PW.

Each of the first to fourth conductive lines CL1 to CL4 may be formed on the corresponding first bank PW in the emission area EMA of the pixel PXL. Each of the first and second connection lines CNL1 and CNL2 may be formed in the peripheral area of the pixel PXL.

Each of the first and second connection lines CNL1 and CNL2 may extend in the first direction DR1. Each of the first and second connection lines CNL1 and CNL2 may be provided in common to a pixel PXL and a pixel PXL adjacent thereto. In other words, a pixel PXL disposed on an identical row in the first direction DR1, and a pixel PXL adjacent thereto may be electrically connected in common to each of the first and second connection lines CNL1 and CNL2.

The first and third conductive lines CL1 and CL3 may be integrally provided with (or integral with) the first connection line CNL1 and electrically connected to each other. In case that the first and third conductive lines CL1 and CL3 are integral with the first connection line CNL1, the first connection line CNL1 may be an area of the first conductive line CL1 or an area of the third conductive line CL3. The first connection line CNL1 may be electrically connected to the second terminal DE of the first transistor T1 through the first contact hole CH1.

The second and fourth conductive lines CL2 and CL4 may be integral with the second connection line CNL2 and electrically connected to each other. In case that the second and fourth conductive lines CL2 and CL4 are integral with the second connection line CNL2, the second connection line CNL2 may be an area of the second conductive line CL2 or an area of the fourth conductive line CL4. The second connection line CNL2 may be electrically connected to the driving voltage line DVL through the second contact hole CH2.

In a plan view, the first to fourth conductive lines CL1 to CL4 may be successively provided and/or formed in the first direction DR1 in the emission area EMA of the pixel PXL. Furthermore, each of the first to fourth conductive lines CL1 to CL4 may extend in the second direction DR2 in the emission area EMA of the pixel PXL.

Referring to FIGS. 1A to 4B, 5, 7B, 9, 10, 15C, and 16A to 16D, an insulating material layer INSM is formed on the passivation layer PSV including the first to fourth conductive lines CL1 to CL4. The insulating material layer INSM may be formed of an inorganic insulating layer including an inorganic material, or an organic insulating layer including an organic material.

Thereafter, an electric field is formed between two adjacent conductive lines by applying corresponding alignment signals (or alignment voltages) to the respective first to fourth conductive lines CL1 to CL4 through the first and second connection lines CNL1 and CNL2. Here, a first alignment signal (or a first alignment voltage) is applied to the first and third conductive lines CL1 and CL3 electrically connected with the first connection line CNL1. A second alignment signal (or a second alignment voltage) having a voltage level different from that of the first alignment signal may be applied to the second and fourth conductive lines CL2 and CL4 electrically connected with the second connection line CNL2.

For example, in case that AC power or DC power having a predetermined voltage and a period is repeatedly applied several times to each of the first to fourth conductive lines CL1 to CL4, an electric field may be formed between two adjacent conductive lines of the first to fourth conductive lines CL1 to CL4, the electric field corresponding to a difference between respective potentials of the two adjacent conductive lines.

While electric fields are formed between the first to fourth conductive lines CL1 to CL4 formed in the emission area EMA of the pixel PXL, a mixed solution including light emitting elements LD is supplied to the emission area EMA by an inkjet printing method or the like. For example, an inkjet nozzle is disposed on the insulating material layer INSM, and a solvent mixed with light emitting elements LD may be supplied into the emission area EMA of the pixel PXL by the inkjet nozzle. Here, the solvent may be any of acetone, water, alcohol, and toluene, but the disclosure is not limited thereto. For example, the solvent may have the form of ink or paste. A method of supplying the light emitting elements LD to the emission area EMA of the pixel PXL is not limited to that of the foregoing embodiment. The method of supplying the light emitting elements LD may be changed in various ways.

After the light emitting elements LD have been supplied to the emission area EMA of the pixel PXL, the solvent may be removed.

In case that the light emitting elements LD are supplied to the emission area EMA of the pixel PXL, self-alignment of the light emitting elements LD may be induced by the electric fields formed between the first to fourth conductive lines CL1 to CIA. Hence, the light emitting elements LD may be aligned between the first conductive line CL1 and the second conductive line CL2, between the second conductive line CL2 and the third conductive line CL3, and between the third conductive line CL3 and the fourth conductive line CL4. Each of the light emitting elements LD may be aligned on the insulating material layer INSM in the emission area EMA of the pixel PXL.

The light emitting elements LD may be electrically connected in the forward direction between two conductive lines adjacent to each other in the first direction DR1. For example, the first end EP1 of each of the light emitting elements LD may be electrically connected to the first conductive line CL1 or the third conductive line CL3, and the second end EP2 thereof may be electrically connected to the second conductive line CL2 or the fourth conductive line CL4. In an embodiment, the light emitting elements LD may include at least one reverse light emitting element LDr electrically connected in a direction opposite to the forward direction depending on a wavelength, etc. of an alignment signal applied to each of two adjacent conductive lines.

At the step of aligning the light emitting elements LD, a ratio of the number of light emitting elements LD arranged in the forward direction in the emission area EMA of the pixel PXL and the number of light emitting elements LD electrically connected in the direction opposite thereto, e.g., the number of reverse light emitting elements LDr, may be adjusted or the light emitting elements LD aligned in the forward direction may be intensively disposed at a specific position in the emission area EMA, e.g., by controlling the direction and magnitude of the electric field formed between the two adjacent conductive lines by adjusting the alignment signal to be applied to the two adjacent conductive lines.

Referring to FIGS. 1A to 4B, 5, 7B, 9, 10, 15D, and 16A to 16E, after the light emitting elements LD are aligned in the emission area EMA of the pixel PXL, the second insulating layer INS2 may be formed on each of the light emitting elements LD. The second insulating layer INS2 may cover (or overlap) at least a portion of an upper surface of each of the light emitting elements LD such that the opposite ends EP1 and EP2 of each of the light emitting elements LD may be exposed to the outside.

The first insulating layer INS1 may be formed, by a process of forming the second insulating layer INS2 or an etching process to be performed before or after the process, by etching the insulating material layer INSM such that a portion of each of the first to fourth conductive lines CL1 to CL4 is exposed.

During a process of forming the first insulating layer INS1, the first connection line CNL1 is separated between one pixel (or first pixel) PXL and a pixel PXL adjacent thereto by a laser cutting method or an etching method using a mask, so that the one pixel PXL may be independently (or individually) driven from the adjacent pixel PXL. In an embodiment, in case that the process of separating the first connection line CNL1 is performed, the second connection line CNL2 may be disconnected (or electrically disconnected) between the one pixel PXL and the adjacent pixel PXL, but the disclosure is not limited thereto. In an embodiment, the second connection line CNL2 may be electrically connected in common to the one pixel PXL and the adjacent pixel PXL rather than being disconnected during the process of separating the first connection line CNL1.

During the process of separating the first connection line CNL1, each of the first to fourth conductive lines CL1 to CL4 may be partially removed or disconnected, and thus provided in the form of an electrode including two sub-electrodes spaced from each other in the second direction DR2 (e.g., in the column direction). For example, the first conductive line CL1 may be partially removed or disconnected during the process of separating the first connection line CNL1, and thus become the first electrode EL1 including the 1-1-th and 1-2-th sub-electrodes EL1_1 and EL1_2 disposed on an identical column and spaced from each other. The second conductive line CL2 may be partially removed or disconnected during the process of separating the first connection line CNL1, and thus become the second electrode EL2 including the 2-1-th and 2-2-th sub-electrodes EL2_1 and EL2_2 disposed on an identical column and spaced from each other. The third conductive line CL3 may be partially removed or disconnected during the process of separating the first connection line CNL1, and thus become the third electrode EL3 including the 3-1-th and 3-2-th sub-electrodes EL3_1 and EL3_2 disposed on an identical column and spaced from each other. The fourth conductive line CL4 may be partially removed or disconnected during the process of separating the first connection line CNL1, and thus become the fourth electrode EL4 including the 4-1-th and 4-2-th sub-electrodes EL4_1 and EL4_2 disposed on an identical column and spaced from each other.

The emission area EMA of each pixel PXL may be divided (or sectioned) into a first area A1 (EMA1) and a second area A2 (EMA2) depending on positions of two sub-electrodes included in each of the first to fourth electrodes EL1 to EL4. The 1-1-th to 4-1-th sub-electrodes EL1_1 to EL4_1 may be disposed in the first area A1 (EMA1) of the emission area EMA. The 1-2-th to 4-2-th sub-electrodes EL1_2 to EL4_2 may be disposed in the second area A2 (EMA2) of the emission area EMA.

In a plan view, the light emitting elements LD may be disposed on the first insulating layer INS1 between two sub-electrodes adjacent to each other in the first direction DR1. The light emitting elements LD may include first light emitting elements LD1 disposed between the 1-1-th and 2-1-th sub-electrodes EL1_1 and EL2_1, second light emitting elements LD2 disposed between the 3-1-th and 4-1-th sub-electrodes EL3_1 and EL4_1, third light emitting elements LD3 disposed between the 1-2-th and 2-2-th sub-electrodes EL1_2 and EL2_2, and fourth light emitting elements LD4 disposed between 3-2-th and 4-2-th sub-electrodes EL3_2 and EL4_2. Furthermore, the light emitting elements LD may include fifth light emitting elements LD5 disposed between the 2-1-th and 3-1-th sub-electrodes EL2_1 and EL3_1, and sixth light emitting elements LD6 electrically connected between the 2-2-th and 3-2-th sub-electrodes EL2_2 and EL3_2.

Referring to FIGS. 1A to 4B, 5, 7B, 9, 10, 15E, and 16A to 16F, the first and third conductive patterns CP1 and CP3 are formed on the first to fourth electrodes EL1 to EL4.

The first conductive pattern CP1 may be disposed directly on the 2-1-th and 3-1-th sub-electrodes EL2_1 and EL3_1 in the first area A1 (EMA1) of each pixel PXL and electrically and/or physically connected with the 2-1-th and 3-1-th sub-electrodes EL2_1 and EL3_1. The first conductive pattern CP1 may be disposed directly on the fifth light emitting elements LD5 in the first area A1 (EMA1).

The third conductive pattern CP3 may be disposed directly on the 2-2-th and 3-2-th sub-electrodes EL2_2 and EL3_2 in the second area A2 (EMA2) of each pixel PXL and electrically and/or physically connected with the 2-2-th and 3-2-th sub-electrodes EL2_2 and EL3_2. The third conductive pattern CP3 may be disposed directly on the sixth light emitting elements LD6 in the second area A2 (EMA2).

Referring to FIGS. 1A to 4B, 5, 7B, 9, 10, 15F, 16A to 16G, after an insulating material layer (not shown) is applied to an upper portion of the first insulating layer INS1 on which the first and third conductive patterns CP1 and CP3 are formed, the third insulating layer INS3 is formed by etching the insulating material layer through an etching process.

The third insulating layer INS3 may cover each of the first and third conductive patterns CP1 and CP3 and protect the first and third conductive patterns CP1 and CP3 from the outside, and may expose the 1-1-th and 4-2-th sub-electrodes EL1_1 and EL4_2 and the 4-1-th and 1-2-th sub-electrodes EL4_1 and EL1_2 to the outside.

Thereafter, the second conductive pattern CP2 is formed on the 4-1-th and 1-2-th sub-electrodes EL4_1 and EL1_2 that are exposed to the outside. Simultaneously, the contact electrode CNE is formed on each of the 1-1-th and 4-2-th sub-electrodes EL1_1 and EL4_2 that are exposed to the outside.

The second conductive pattern CP2 may be provided in a shape which extends in the second direction DR2 in the first area A1 (EMA1) of each pixel PXL, is bent in a diagonal direction, e.g., an inclined direction with respect to the first direction DR1 or the second direction DR2, in a boundary area that is an area between the first area A1 (EMA1) and the second area A2 (EMA2), and extends in the second direction DR2 in the second area A2 (EMA2).

The contact electrode CNE may be disposed directly on the 1-1-th sub-electrode EL1_1 and the first end EP1 of each of the first light emitting elements LD1 in the first area A1 (EMA1) of each pixel PXL, and electrically and/or physically connected to each of the 1-1-th sub-electrode EL1_1 and the first end EP1 of each first light emitting element LD1.

Furthermore, the contact electrode CNE may be disposed directly on the 4-2-th sub-electrode EL4_2 and the second end EP2 of each of the fourth light emitting elements LD4 in the second area A2 (EMA2) of each pixel PXL, and electrically and/or physically connected to each of the 4-2-th sub-electrode EL4_2 and the second end EP2 of each of the fourth light emitting elements LD4.

As described above, the second conductive pattern CP2 may be provided over the first area A1 (EMA1) and the second area A2 (EMA2) of each pixel PXL and may be disposed directly on the 4-1-th sub-electrode EL4_1 in the first area A1 (EMA1) and be disposed directly on the 1-2-th sub-electrode EL1_2 in the second area A2 (EMA2).

The second conductive pattern CP2 may be electrically and/or physically connected to the 4-1-th sub-electrode EL4_1 of the first area A1 (EMA1), and may be electrically and/or physically connected to the 1-2-th sub-electrode EL1_2 of the second area A2 (EMA2). Hence, the 4-1-th sub-electrode EL4_1 and the 1-2-th sub-electrode EL1_2 may be electrically connected to each other by the second conductive pattern CP2.

In an embodiment, the 1-1-th and 2-1-th sub-electrodes EL1_1 and EL2_1 and the first light emitting elements LD1 electrically connected in the forward direction therebetween may form the first serial stage SET1. The 3-1-th and 4-1-th sub-electrodes EL3_1 and EL4_1 and the second light emitting elements LD2 electrically connected in the forward direction therebetween may form the second serial stage SET2. The 1-2-th and 2-2-th sub-electrodes EL1_2 and EL2_2 and the third light emitting elements LD3 electrically connected in the forward direction therebetween may form the third serial stage SET3. The 3-2-th and 4-2-th sub-electrodes EL3_2 and EL4_2 and the fourth light emitting elements LD4 electrically connected in the forward direction therebetween may form the fourth serial stage SET4.

The first serial stage SET1 and the second serial stage SET2 may be electrically connected to each other by the first conductive pattern CP1. The second serial stage SET2 and the third serial stage SET3 may be electrically connected to each other by the second conductive pattern CP2. The third serial stage SET3 and the fourth serial stage SET4 may be electrically connected to each other by the third conductive pattern CP3.

Referring to 1A to 4B, 5, 7B, 9, 10, and 16A to 16H, the fourth insulating layer INS4 is formed on the second conductive pattern CP2 and the third insulating layer INS3.

The fourth insulating layer INS4 may include an inorganic insulating layer made of an inorganic material, or an organic insulating layer made of an organic material. Although the fourth insulating layer INS4 may have a single-layer structure as shown in the drawing, the disclosure is not limited thereto. For example, the fourth insulating layer INS4 may have a multi-layer structure.

The overcoat layer OC is formed on the fourth insulating layer INS4.

Figure 17:
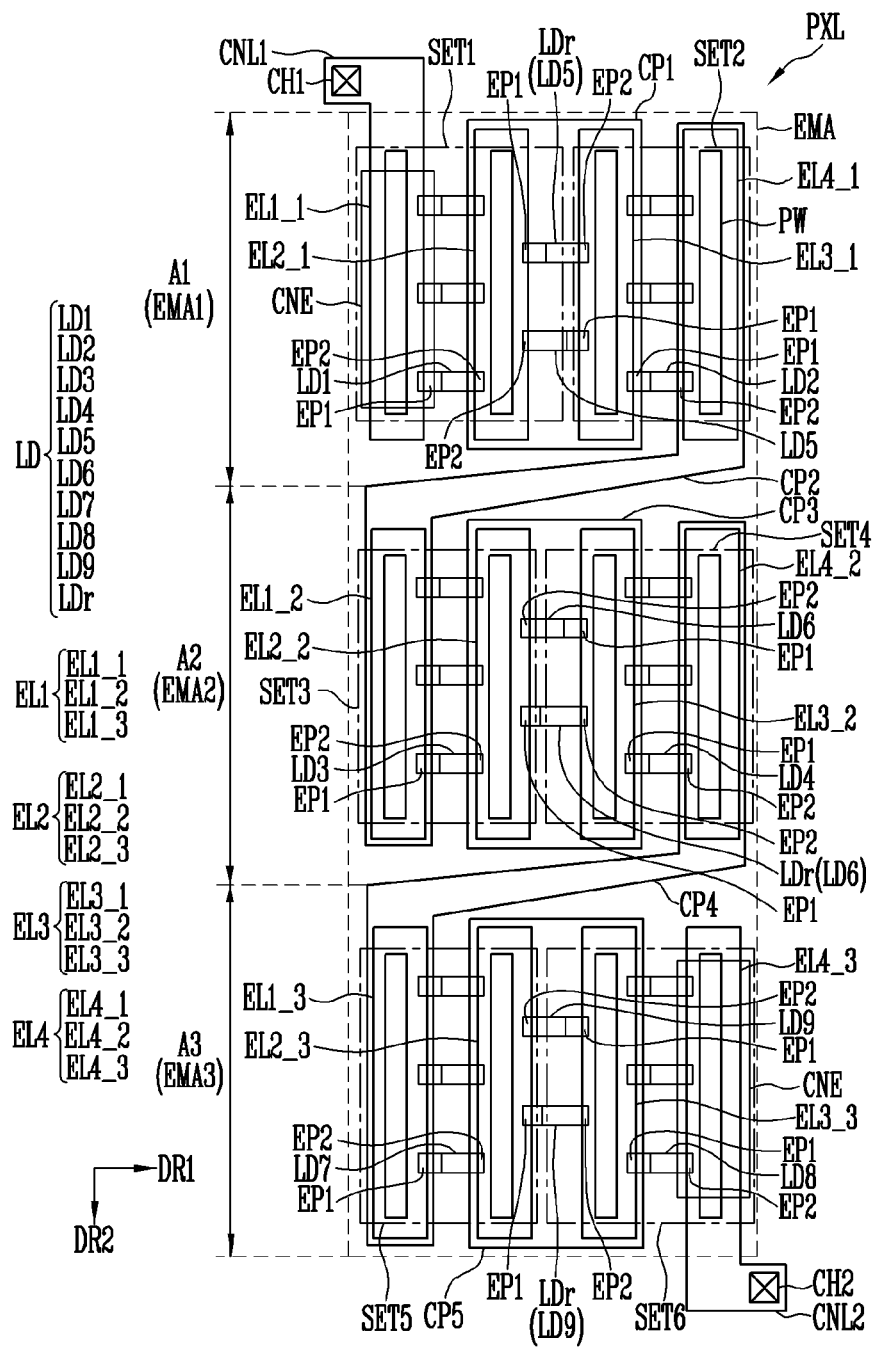
FIGS. 17 and 18 are schematic plan views each illustrating an embodiment of the pixel of FIG. 9.
Figure 18:
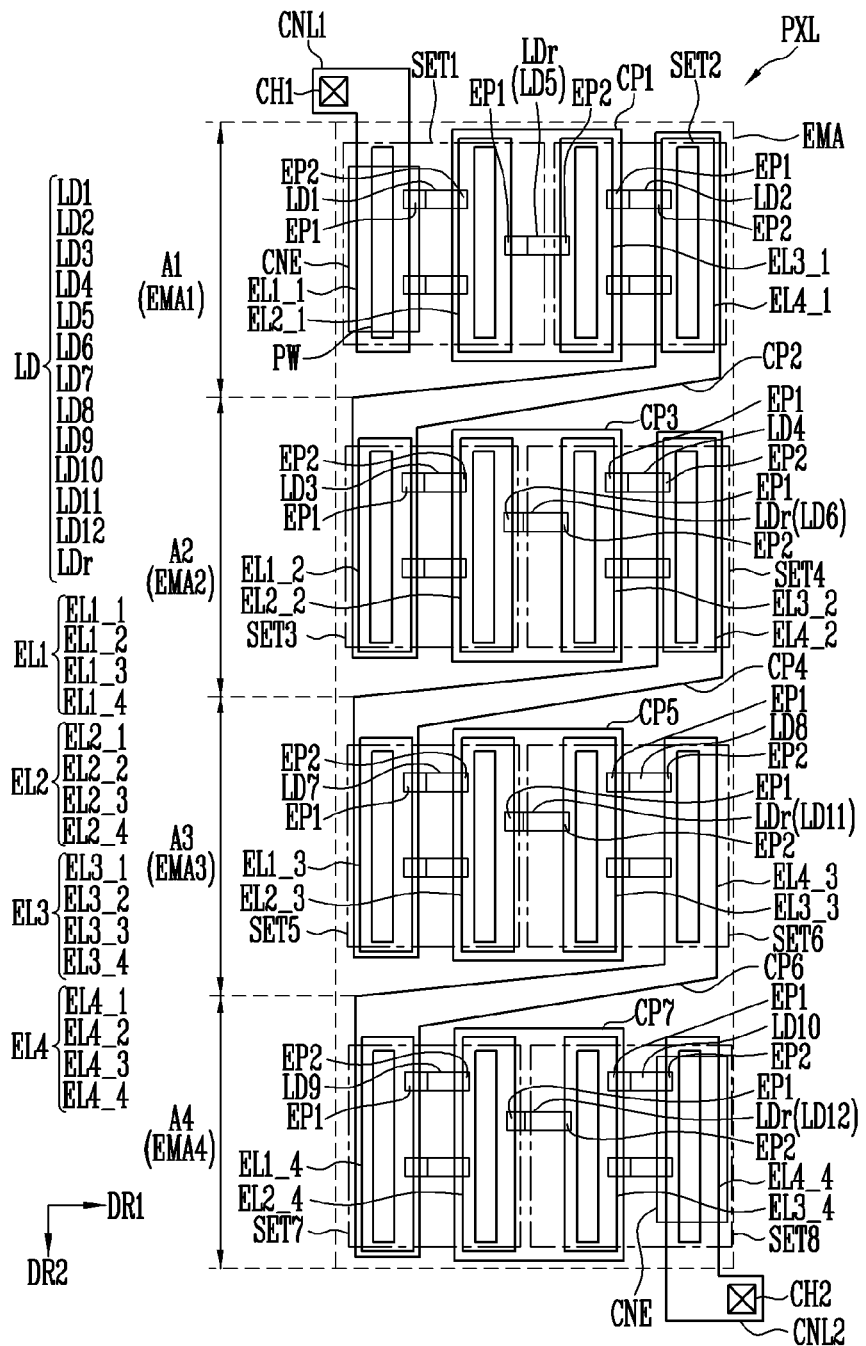

FIGS. 17 and 18 are schematic plan views each illustrating an embodiment of the pixel of FIG. 9.

The pixel illustrated in FIG. 17, may be different from the pixel of FIG. 9 at least in a structure in which the emission area of each pixel is divided into first to third areas. The pixel illustrated in FIG. 18 may be different from the pixel of FIG. 9, at least in a structure in which the emission area of each pixel is divided into first to fourth areas.

Therefore, to avoid repetitive descriptions, the description of each pixel of FIGS. 17 and 18 will be focused on differences from that of the foregoing embodiments. Components which are not separately explained in the following description comply with those of the foregoing embodiments. The same reference numeral will be used to designate the same component, and a similar reference numeral will be used to designate a similar component.

First, referring to FIGS. 1A to 4B, 5, 7B, and 17, the pixel PXL may include an emission area EMA and a peripheral area.

In the emission area EMA of the pixel PXL, there may be disposed at least one first bank PW, first to fourth electrodes EL1 to EL4, light emitting elements LD provided between the first to fourth electrodes EL1 to EL4, first to fifth conductive patterns CP1 to CP5, and at least one contact electrode CNE.

Each of the first to fourth electrodes EL1 to EL4 may include three sub-electrodes disposed on an identical column and spaced from each other. For example, the first electrode EL1 may include 1-1-th, 1-2-th, and 1-3-th sub-electrodes EL1_1, EL1_2, and EL1_3. The second electrode EL2 may include 2-1-th, 2-2-th, and 2-3-th sub-electrodes EL2_1, EL2_2, and EL2_3. The third electrode EL3 may include 3-1-th, 3-2-th, and 3-3-th sub-electrodes EL3_1, EL3_2, and EL3_3. The fourth electrode EL4 may include 4-1-th, 4-2-th, and 4-3-th sub-electrodes EL4_1, EL4_2, and EL4_3.

The emission area EMA of the pixel PXL may be divided into a first area A1 (EMA1) in which the 1-1-th to 4-1-th sub-electrodes EL1_1, EL2_1, EL3_1, and EL4_1 disposed on an identical row are arranged, a second area A2 (EMA2) in which the 1-2-th to 4-2-th sub-electrodes EL1_2, EL2_2, EL3_2, and EL4_2 disposed on an identical row are arranged, and a third area A3 (EMA3) in which the 1-3-th to 4-3-th sub-electrodes EL1_3, EL2_3, EL3_3, and EL4_3 disposed on an identical row are arranged.

In the first area A1 (EMA1), the 1-1-th and 2-1-th sub-electrodes EL1_1 and EL2_1, along with the first light emitting elements LD1 electrically connected in parallel therebetween, may form a first serial stage SET1. The 3-1-th and 4-1-th sub-electrodes EL3_1 and EL4_1, along with the second light emitting elements LD2 electrically connected in parallel therebetween, may form a second serial stage SET2. The 2-1-th sub-electrode EL2_1 of the first serial stage SET1 and the 3-1-th sub-electrode EL3_1 of the second serial stage SET2 each may be electrically connected to the first conductive pattern CP1. Therefore, the first serial stage SET1 and the second serial stage SET2 may be electrically connected to each other by the 2-1-th sub-electrode EL2_1, the 3-1-th sub-electrode EL3_1, and the first conductive pattern CP1.

In an embodiment, the fifth light emitting elements LD5 may be electrically connected between the 2-1-th and 3-1-th sub-electrodes EL2_1 and EL3_1. The fifth light emitting elements LD5 may include at least one reverse light emitting element LDr (LD5). In an embodiment, the first conductive pattern CP1 may be disposed directly on the fifth light emitting elements LD5 and electrically connected with the fifth light emitting elements LD5. Hence, the fifth light emitting elements LD5, along with the first conductive pattern CP1, may function as connectors for coupling (or connecting) the first serial stage SET1 and the second serial stage SET2.

In the second area A2 (EMA2), the 1-2-th and 2-2-th sub-electrodes EL1_2 and EL2_2, along with the third light emitting elements LD3 electrically connected in parallel therebetween, may form a third serial stage SET3. The 3-2-th and 4-2-th sub-electrodes EL3_2 and EL4_2, along with the fourth light emitting elements LD4 electrically connected in parallel therebetween, may form a fourth serial stage SET4. The 2-2-th sub-electrode EL2_2 of the third serial stage SET3 and the 3-2-th sub-electrode EL3_2 of the fourth serial stage SET4 each may be electrically connected to the third conductive pattern CP3. Therefore, the third serial stage SET3 and the fourth serial stage SET4 may be electrically connected to each other by the 2-2-th sub-electrode EL2_2, the 3-2-th sub-electrode EL3_2, and the third conductive pattern CP3.

In an embodiment, the sixth light emitting elements LD6 may be electrically connected between the 2-2-th and 3-2-th sub-electrodes EL2_2 and EL3_2. The sixth light emitting elements LD6 may include at least one reverse light emitting element LDr (LD6). In an embodiment, the third conductive pattern CP3 may be disposed directly on the sixth light emitting elements LD6 and electrically connected with the sixth light emitting elements LD6. Hence, the sixth light emitting elements LD6, along with the third conductive pattern CP3, may function as connectors for electrically coupling (or connecting) the third serial stage SET3 and the fourth serial stage SET4.

The 4-1-th sub-electrode EL4_1 of the second serial stage SET2 and the 1-2-th sub-electrode EL1_2 of the third serial stage SET3 each may be electrically connected to the second conductive pattern CP2 between the first area A1 (EMA1) and the second area A2 (EMA2). Therefore, the second serial stage SET2 and the third serial stage SET3 may be electrically connected to each other by the 4-1-th sub-electrode EL4_1, the 1-2-th sub-electrode EL1_2, and the second conductive pattern CP2.

In the third area A3 (EMA3), the 1-3-th and 2-3-th sub-electrodes EL1_3 and EL2_3, along with seventh light emitting elements LD7 electrically connected in parallel therebetween, may form a fifth serial stage SET5. The 3-3-th and 4-3-th sub-electrodes EL3_3 and EL4_3, along with eighth light emitting elements LD8 electrically connected in parallel therebetween, may form a sixth serial stage SET6. The 2-3-th sub-electrode EL2_3 of the fifth serial stage SET5 and the 3-3-th sub-electrode EL3_3 of the sixth serial stage SET6 each may be electrically connected to the fifth conductive pattern CP5. Therefore, the fifth serial stage SET5 and the sixth serial stage SET6 may be electrically connected to each other by the 2-3-th sub-electrode EL2_3, the 3-3-th sub-electrode EL3_3, and the fifth conductive pattern CP5.

In an embodiment, ninth light emitting elements LD9 may be electrically connected between the 2-3-th and 3-3-th sub-electrodes EL2_3 and EL3_3. The ninth light emitting elements LD9 may include at least one reverse light emitting element LDr (LD9). In an embodiment, the fifth conductive pattern CP5 may be disposed directly on the ninth light emitting elements LD9 and electrically connected with the ninth light emitting elements LD9. Hence, the ninth light emitting elements LD9, along with the fifth conductive pattern CP5, may function as connectors for electrically coupling (or connecting) the fifth serial stage SET5 and the sixth serial stage SET6.

Each of the 4-2-th sub-electrode EL4_2 of the fourth serial stage SET4 and the 1-3-th sub-electrode EL1_3 of the fifth serial stage SET5 may be electrically connected to the fourth conductive pattern CP4 between the second area A2 (EMA2) and the third area A3 (EMA3). Therefore, the fourth serial stage SET4 and the fifth serial stage SET5 may be electrically connected to each other by the 4-2-th sub-electrode EL4_2, the 1-3-th sub-electrode EL1_3, and the fourth conductive pattern CP4.

In an embodiment, each of the second and fourth conductive patterns CP2 and CP4 may be provided between and over two areas adjacent to each other in the second direction DR2. For example, the second conductive pattern CP2 may extend in the second direction DR2 in the first area A1 (EMA1) of each pixel PXL, is bent in a diagonal direction, e.g., an inclined direction with respect to the first direction DR1 or the second direction DR2, in a boundary area that is an area between the first area A1 (EMA1) and the second area A2 (EMA2), and extends in the second direction DR2 in the second area A2 (EMA2). The fourth conductive pattern CP4 may extend in the second direction DR2 in the second area A2 (EMA2) of each pixel PXL, is bent in a diagonal direction, e.g., an inclined direction with respect to the first direction DR1 or the second direction DR2, in a boundary area that is an area between the second area A2 (EMA2) and the third area A3 (EMA3), and extends in the second direction DR2 in the third area A3 (EMA3).

In an embodiment, the first to sixth serial stages SET1 to SET6 are disposed in the emission area EMA of each pixel PXL. The first to sixth serial stages SET1 to SET6 may form an emission part EMU of the corresponding pixel PXL. In case that the emission part EMU of each pixel PXL includes six serial stages SET1 to SET6, the probability of an open failure of the pixel PXL which results from a short-circuit defect of the first end EP1 and the second end EP2 of at least one light emitting element LD electrically connected in the forward direction may be further reduced.

In an embodiment, the emission part EMU of each pixel PXL may include first to eighth serial stages SET1 to SET8, as illustrated in FIG. 18.

Next, referring to FIG. 18, in the emission area EMA of the pixel PXL, there may be disposed at least one first bank PW, first to fourth electrodes EL1 to EL4, light emitting elements LD provided between the first to fourth electrodes EL1 to EL4, first to seventh conductive patterns CP1 to CP7, and at least one contact electrode CNE.

Each of the first to fourth electrodes EL1 to EL4 may include four sub-electrodes disposed on an identical column and spaced from each other. For example, the first electrode EL1 may include 1-1-th, 1-2-th, 1-3-th, and 1-4-th sub-electrodes EL1_1, EL1_2, EL1_3, and EL1_4. The second electrode EL2 may include 2-1-th, 2-2-th, 2-3-th, and 2-4-th sub-electrodes EL2_1, EL2_2, EL2_3, and EL2_4. The third electrode EL3 may include 3-1-th, 3-2-th, 3-3-th, and 3-4-th sub-electrodes EL3_1, EL3_2, EL3_3, and EL3_4. The fourth electrode EL4 may include 4-1-th, 4-2-th, 4-3-th, and 4-4-th sub-electrodes EL4_1, EL4_2, EL4_3, EL4_4.

The emission area EMA of the pixel PXL may be divided into a first area A1 (EMA1) in which the 1-1-th to 4-1-th sub-electrodes EL1_1, EL2_1, EL3_1, and EL4_1 disposed on an identical row are arranged, a second area A2 (EMA2) in which the 1-2-th to 4-2-th sub-electrodes EL1_2, EL2_2, EL3_2, and EL4_2 disposed on an identical row are arranged, a third area A3 (EMA3) in which the 1-3-th to 4-3-th sub-electrodes EL1_3, EL2_3, EL3_3, and EL4_3 disposed on an identical row are arranged, and a fourth area A4 (EMA4) in which the 1-4-th to 4-4-th sub-electrodes EL1_4, EL2_4, EL3_4, and EL4_4 disposed on an identical row are arranged.

In the first area A1 (EMA1), the 1-1-th and 2-1-th sub-electrodes EL1_1 and EL2_1, along with the first light emitting elements LD1 electrically connected in parallel therebetween, may form a first serial stage SET1. The 3-1-th and 4-1-th sub-electrodes EL3_1 and EL4_1, along with the second light emitting elements LD2 electrically connected in parallel therebetween, may form a second serial stage SET2. The 2-1-th sub-electrode EL2_1 of the first serial stage SET1 and the 3-1-th sub-electrode EL3_1 of the second serial stage SET2 each may be electrically connected to the first conductive pattern CP1. Therefore, the first serial stage SET1 and the second serial stage SET2 may be electrically connected to each other by the 2-1-th sub-electrode EL2_1, the 3-1-th sub-electrode EL3_1, and the first conductive pattern CP1.

In an embodiment, the fifth light emitting elements LD5 may be electrically connected between the 2-1-th and 3-1-th sub-electrodes EL2_1 and EL3_1. The fifth light emitting elements LD5 may include at least one reverse light emitting element LDr (LD5). In an embodiment, the first conductive pattern CP1 may be disposed directly on the fifth light emitting elements LD5 and electrically connected with the fifth light emitting elements LD5. Hence, the fifth light emitting elements LD5, along with the first conductive pattern CP1, may function as connectors for electrically coupling (or connecting) the first serial stage SET1 and the second serial stage SET2.

In the second area A2 (EMA2), the 1-2-th and 2-2-th sub-electrodes EL1_2 and EL2_2, along with the third light emitting elements LD3 electrically connected in parallel therebetween, may form a third serial stage SET3. The 3-2-th and 4-2-th sub-electrodes EL3_2 and EL4_2, along with the fourth light emitting elements LD4 electrically connected in parallel therebetween, may form a fourth serial stage SET4. The 2-2-th sub-electrode EL2_2 of the third serial stage SET3 and the 3-2-th sub-electrode EL3_2 of the fourth serial stage SET4 each may be electrically connected to the third conductive pattern CP3. Therefore, the third serial stage SET3 and the fourth serial stage SET4 may be electrically connected to each other by the 2-2-th sub-electrode EL2_2, the 3-2-th sub-electrode EL3_2, and the third conductive pattern CP3.

In an embodiment, the sixth light emitting elements LD6 may be electrically connected between the 2-2-th and 3-2-th sub-electrodes EL2_2 and EL3_2. The sixth light emitting elements LD6 may include at least one reverse light emitting element LDr (LD6). In an embodiment, the third conductive pattern CP3 may be disposed directly on the sixth light emitting elements LD6 and electrically connected with the sixth light emitting elements LD6. Hence, the sixth light emitting elements LD6, along with the third conductive pattern CP3, may function as connectors for electrically coupling (or connecting) the third serial stage SET3 and the fourth serial stage SET4.

The 4-1-th sub-electrode EL4_1 of the second serial stage SET2 and the 1-2-th sub-electrode EL1_2 of the third serial stage SET3 each may be electrically connected to the second conductive pattern CP2 between the first area A1 (EMA1) and the second area A2 (EMA2). Therefore, the second serial stage SET2 and the third serial stage SET3 may be electrically connected to each other by the 4-1-th sub-electrode EL4_1, the 1-2-th sub-electrode EL1_2, and the second conductive pattern CP2.

In the third area A3 (EMA3), the 1-3-th and 2-3-th sub-electrodes EL1_3 and EL2_3, along with seventh light emitting elements LD7 electrically connected in parallel therebetween, may form a fifth serial stage SET5. The 3-3-th and 4-3-th sub-electrodes EL3_3 and EL4_3, along with eighth light emitting elements LD8 electrically connected in parallel therebetween, may form a sixth serial stage SET6. The 2-3-th sub-electrode EL2_3 of the fifth serial stage SET5 and the 3-3-th sub-electrode EL3_3 of the sixth serial stage SET6 each may be electrically connected to the fifth conductive pattern CP5. Therefore, the fifth serial stage SET5 and the sixth serial stage SET6 may be electrically connected to each other by the 2-3-th sub-electrode EL2_3, the 3-3-th sub-electrode EL3_3, and the fifth conductive pattern CP5.

In an embodiment, eleventh light emitting elements LD11 may be electrically connected between the 2-3-th and 3-3-th sub-electrodes EL2_3 and EL3_3. The eleventh light emitting elements LD11 may include at least one reverse light emitting element LDr (LD11). In an embodiment, the fifth conductive pattern CP5 may be disposed directly on the eleventh light emitting elements LD11 and electrically connected with the eleventh light emitting elements LD11. Hence, the eleventh light emitting elements LD11, along with the fifth conductive pattern CP5, may function as connectors for electrically coupling (or connecting) the fifth serial stage SET5 and the sixth serial stage SET6.

The 4-2-th sub-electrode EL4_2 of the fourth serial stage SET4 and the 1-3-th sub-electrode EL1_3 of the fifth serial stage SET5 each may be electrically connected to the fourth conductive pattern CP4 between the second area A2 (EMA2) and the third area A3 (EMA3). Therefore, the fourth serial stage SET4 and the fifth serial stage SET5 may be electrically connected to each other by the 4-2-th sub-electrode EL4_2, the 1-3-th sub-electrode EL1_3, and the fourth conductive pattern CP4.

In the fourth area A4 (EMA4), the 1-4-th and 2-4-th sub-electrodes EL1_4 and EL2_4, along with the ninth light emitting elements LD9 electrically connected in parallel therebetween, may form a seventh serial stage SET7. The 3-4-th and 4-4-th sub-electrodes EL3_4 and EL4_4, along with tenth light emitting elements LD10 electrically connected in parallel therebetween, may form an eighth serial stage SET8. The 2-4-th sub-electrode EL2_4 of the seventh serial stage SET7 and the 3-4-th sub-electrode EL3_4 of the eighth serial stage SET8 each may be electrically connected to the seventh conductive pattern CP7. Therefore, the seventh serial stage SET7 and the eighth serial stage SET8 may be electrically connected to each other by the 2-4-th sub-electrode EL2_4, the 3-4-th sub-electrode EL3_4, and the seventh conductive pattern CP7.

In an embodiment, twelfth light emitting elements LD12 may be electrically connected between the 2-4-th and 3-4-th sub-electrodes EL2_4 and EL3_4. The twelfth light emitting elements LD12 may include at least one reverse light emitting element LDr (LD12). In an embodiment, the seventh conductive pattern CP7 may be disposed directly on the twelfth light emitting elements LD12 and electrically connected with the twelfth light emitting elements LD12. Hence, the twelfth light emitting elements LD12, along with the seventh conductive pattern CP7, may function as connectors for electrically coupling (or connecting) the seventh serial stage SET7 and the eighth serial stage SET8.

The 4-3-th sub-electrode EL4_3 of the sixth serial stage SET6 and the 1-4-th sub-electrode EL1_4 of the seventh serial stage SET7 each may be electrically connected to the sixth conductive pattern CP6 between the third area A3 (EMA3) and the fourth area A4 (EMA4). Therefore, the sixth serial stage SET6 and the seventh serial stage SET7 may be electrically connected to each other by the 4-3-th sub-electrode EL4_3, the 1-4-th sub-electrode EL1_4, and the sixth conductive pattern CP6.

In an embodiment, the sixth conductive pattern CP6 may be provided over two areas, e.g., the third area A3 (EMA3) and the fourth area A4 (EMA4), adjacent to each other in the second direction DR2. For example, the sixth conductive pattern CP6 may be provided in a shape which extends in the second direction DR2 in the third area A3 (EMA3) of each pixel PXL, is bent in a diagonal direction, e.g., an inclined direction with respect to the first direction DR1 or the second direction DR2, in a boundary area that is an area between the third area A3 (EMA3) and the fourth area A4 (EMA4), and extends in the second direction DR2 in the fourth area A4 (EMA4).

In an embodiment, the first to eighth serial stages SET1 to SET8 are disposed in the emission area EMA of each pixel PXL. The first to eighth serial stages SET1 to SET8 may form an emission part EMU of the corresponding pixel PXL. In case that the emission part EMU of each pixel PXL includes eight serial stages SET1 to SET8, the probability of an open failure of the pixel PXL which results from a short-circuit defect of the first end EP1 and the second end EP2 of at least one light emitting element LD electrically connected in the forward direction may be further reduced.

Although in the foregoing embodiments there has been described that the emission part EMU of each pixel PXL includes six serial stages SET1 to SET6 or includes eight serial stages SET1 to SET8, the disclosure is not limited thereto. In an embodiment, the emission part EMU of each pixel PXL may include eight or more serial stages.

While various embodiments have been described above, those skilled in the art will appreciate that various modifications, additions and substitutions are possible, without departing from the scope of the disclosure.

Therefore, the embodiments disclosed in this specification are only for illustrative purposes rather than limiting the technical scope of the present disclosure. The scope of the claimed invention must be defined by the accompanying claims.

What is claimed is:

1. A pixel comprising:
    a first area and a second area sectioned from each other in a first direction;
    a 1-1-th electrode, a 2-1-th electrode, a 3-1-th electrode, and a 4-1-th electrode successively arranged in the first area in a second direction intersecting the first direction;
    a 1-2-th electrode, a 2-2-th electrode, a 3-2-th electrode, and a 4-2-th electrode successively arranged in the second area in the second direction;
    a plurality of light emitting elements disposed between two adjacent electrodes of the 1-1th to the 4-1-th electrodes of the first area;
    a plurality of light emitting elements disposed between two adjacent electrodes of the 1-2-th to the 4-2-th electrodes of the second area;
    a first conductive pattern disposed in the first area, and electrically contacting the 2-1-th and the 3-1-th electrodes;
    a second conductive pattern disposed over the first area and the second area, and electrically connecting the 4-1-th electrode of the first area with the 1-2-th electrode of the second area; and
    a third conductive pattern disposed in the second area and electrically connecting the 2-2-th and the 3-2-th electrodes.

2. The pixel according to claim 1, wherein each of the 1-1-th to the 4-1-th electrodes of the first area is disposed to correspond to a column identical to a column of one electrode of the 1-2-th to the 4-2-th electrodes of the second area.

3. The pixel according to claim 2, wherein
    the 1-1-th electrode of the first area and the 1-2-th electrode of the second area are disposed on an identical column to correspond to each other,
    the 2-1-th electrode of the first area and the 2-2-th electrode of the second area are disposed on an identical column to correspond to each other,
    the 3-1-th electrode of the first area and the 3-2-th electrode of the second area are disposed on an identical column to correspond to each other, and
    the 4-1-th electrode of the first area and the 4-2-th electrode of the second area are disposed on an identical column to correspond to each other.

4. The pixel according to claim 3, wherein, in a plan view, each of the 1-1-th to the 4-1-th electrodes of the first area is spaced from one electrode of the 1-2-th to the 4-2-th electrodes of the second area.

5. The pixel according to claim 2, wherein the first conductive pattern is disposed directly on the 2-1-th and the 3-1-th electrodes of the first area and is electrically connected with the 2-1-th and the 3-1-th electrodes.

6. The pixel according to claim 5, wherein the third conductive pattern is disposed directly on the 2-2-th and the 3-2-th electrodes of the second area and is electrically connected with the 2-2-th and the 3-2-th electrodes.

7. The pixel according to claim 6, wherein the second conductive pattern is disposed directly on the 4-1-th electrode of the first area and the 1-2-th electrode of the second area and electrically connects the 4-1-th electrode of the first area with the 1-2-th electrode of the second area.

8. The pixel according to claim 2, wherein the first to the third conductive patterns are disposed on an identical layer.

9. The pixel according to claim 2, wherein the second conductive pattern and the first and the third conductive patterns are disposed on different layers.

10. The pixel according to claim 9, wherein the second conductive pattern is disposed on the first and the third conductive patterns with an insulating layer disposed the second conductive pattern and the first and the third conductive patterns.

11. The pixel according to claim 2, wherein
the plurality of light emitting elements of the first area comprise:
first light emitting elements disposed between the 1-1-th and the 2-1-th electrodes of the first area; and
second light emitting elements disposed between the 3-1-th and the 4-1-th electrodes of the first area, and
the plurality of light emitting elements of the second area comprise:
third light emitting elements disposed between the 1-2-th and the 2-2-th electrodes of the second area; and
fourth light emitting elements disposed between the 3-2-th and the 4-2-th electrodes of the second area.

12. The pixel according to claim 11, further comprising a contact electrode disposed on each of the 1-1-th electrode of the first area and the 4-2-th electrode of the second area.

13. The pixel according to claim 12, wherein the contact electrode and at least one conductive pattern of the first to the third conductive patterns are disposed on an identical layer.

14. The pixel according to claim 11, wherein
the first light emitting elements are electrically connected in parallel between the 1-1-th and the 2-1-th electrodes of the first area and form a first stage,
the second light emitting elements are electrically connected in parallel between the 3-1-th and the 4-1-th electrodes of the first area and form a second stage,
the third light emitting elements are electrically connected in parallel between the 1-2-th and the 2-2-th electrodes of the second area and form a third stage,
the fourth light emitting elements are electrically connected in parallel between the 3-2-th and the 4-2-th electrodes of the second area and form a fourth stage,
the first stage and the second stage are electrically connected through the first conductive pattern,
the second stage and the third stage are electrically connected through the second conductive pattern, and
the third stage and the fourth stage are electrically connected through the third conductive pattern.

15. The pixel according to claim 14, further comprising:
a third area disposed under the second area in the first direction,
wherein the third area comprises:
a 1-3-th electrode, a 2-3-th electrode, a 3-3-th electrode, and a 4-3-th electrode disposed to correspond to respective columns identical to the 1-1-th to the 4-1-th electrodes of the first area and the 1-2-th to the 4-2-th electrodes of the second area;
a plurality of light emitting elements disposed between two adjacent electrodes of the 1-3-th to the 4-3-th electrodes; and
a fourth conductive pattern disposed on the 2-3-th and the 3-3-th electrodes and electrically connected with the 2-3-th and the 3-3-th electrodes.

16. The pixel according to claim 15, further comprising a fifth conductive pattern disposed over the second area and the third area, and disposed on the 4-2-th electrode of the second area and the 1-3-th electrode of the third area and electrically connecting the 4-2-th electrode of the second area with the 1-3-th electrode of the third area.

17. The pixel according to claim 16, further comprising a fourth area disposed under the third area in the first direction,
wherein the fourth area comprises:
a 1-4-th electrode, a 2-4-th electrode, a 3-4-th electrode, and a 4-4-th electrode disposed to correspond to respective columns identical to the 1-1-th to the 4-1-th electrodes of the first area, the 1-2-th to the 4-2-th electrodes of the second area, the 1-3-th to the 4-3-th electrodes of the third area, and the 1-4-th to the 4-4-th electrodes of the fourth area;
a plurality of light emitting elements disposed between two adjacent electrodes of the 1-4-th to the 4-4-th electrodes; and
a sixth conductive pattern disposed on the 2-4-th and the 3-4-th electrodes and electrically connected with the 2-4-th and the 3-4-th electrodes.

18. The pixel according to claim 17, further comprising a seventh conductive pattern disposed over the third area and the fourth area, and disposed on the 4-3-th electrode of the third area and the 1-4-th electrode of the fourth area and electrically connecting the 4-3-th electrode of the 1-4-th area with the 1-4-th electrode of the fourth area.

19. A display device comprising:
a substrate including a display area and a non-display area; and
at least one pixel disposed in the display area,
wherein the at least one pixel comprises:
a first area and a second area sectioned from each other in a first direction;
a 1-1-th electrode, a 2-1-th electrode, a 3-1-th electrode, and a 4-1-th electrode successively arranged in the first area in a second direction intersecting the first direction;
a 1-2-th electrode, a 2-2-th electrode, a 3-2-th electrode, and a 4-2-th electrode
successively arranged in the second area in the second direction;
a plurality of light emitting elements disposed between two adjacent electrodes of the 1-1-th to the 4-1-th electrodes of the first area;
a plurality of light emitting elements disposed between two adjacent electrodes of the 1-2-th to the 4-2-th electrodes of the second area;
a first conductive pattern disposed in the first area and electrically connecting the 2-1-th and the 3-1-th electrodes;
a second conductive pattern disposed over the first area and the second area, and electrically connecting the 4-1-th electrode of the first area with the 1-2-th electrode of the second area; and
a third conductive pattern disposed in the second area and electrically connecting the 2-2-th and the 3-2-th electrodes.

20. A method of fabricating a display device, comprising:
providing at least one pixel including an emission area having a first area and a second area sectioned from each other in a first direction, wherein
providing the at least one pixel comprises forming a display element layer in the emission area, the forming of the display element layer comprises:
- forming a first conductive line, a second conductive line, a third conductive line, and a fourth conductive line spaced from each other;
- aligning a plurality of light emitting elements in the emission area by respectively applying corresponding alignment signals to the first to the fourth conductive lines;
- removing a portion of each or the first to the fourth conductive lines so that a 1-1-th electrode, a 2-1-th electrode, a 3-1-th electrode, and a 4-1-th electrode successively arranged in a second direction are formed in the first area, and a 1-2-th electrode, a 2-2-th electrode, as 3-2-th electrode, and a 4-2-th electrode successively arranged in the second direction are formed in the second area;
- forming a first conductive pattern on the 2-1-th and the 3-1-th electrodes of the first area, and forming a second conductive pattern on the 2-2-th and the 3-2-th electrodes of the second area; and
- electrically connecting the 4-1-th electrode of the first area with the 1-2-th electrode of the second area, and forming a third conductive pattern disposed over the first area and the second area, and
- each of the 1-1-th to the 4-1-th electrodes of the first area corresponds to a column identical to one electrode of the 1-2-th to the 4-2-th electrodes of the second area.

\* \* \* \* \*